US011082649B2

(12) United States Patent
Takizawa et al.

(10) Patent No.: US 11,082,649 B2
(45) Date of Patent: Aug. 3, 2021

(54) SOLID-STATE IMAGING DEVICE WITH PIXELS HAVING AN IN-PIXEL CAPACITANCE

(71) Applicant: SONY SEMICONDUCTOR SOLUTIONS CORPORATION, Kanagawa (JP)

(72) Inventors: Masaaki Takizawa, Kanagawa (JP); Yorito Sakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/616,618

(22) PCT Filed: May 18, 2018

(86) PCT No.: PCT/JP2018/019231
§ 371 (c)(1),
(2) Date: Nov. 25, 2019

(87) PCT Pub. No.: WO2018/221261
PCT Pub. Date: Dec. 6, 2018

(65) Prior Publication Data
US 2020/0186732 A1 Jun. 11, 2020

(30) Foreign Application Priority Data

Jun. 2, 2017 (JP) .............................. JP2017-110382
Sep. 20, 2017 (JP) .............................. JP2017-179824

(51) Int. Cl.
*H04N 5/359* (2011.01)
*H04N 5/369* (2011.01)
*H04N 5/3745* (2011.01)

(52) U.S. Cl.
CPC ........... *H04N 5/3591* (2013.01); *H04N 5/379* (2018.08); *H04N 5/3745* (2013.01)

(58) Field of Classification Search
CPC .... H04N 5/3591; H04N 5/379; H04N 5/3745; H04N 5/3559; H04N 5/37452; H01L 27/146
See application file for complete search history.

(56) References Cited

U.S. PATENT DOCUMENTS 9,991,298 B1 * 6/2018 Mo ....................... H04N 5/353
2011/0241079 A1 10/2011 Oike et al.
(Continued)

FOREIGN PATENT DOCUMENTS

| JP | 2015-220255 | 12/2005 |
| JP | 2011-216672 | 10/2011 |
| JP | 2013-030511 | 2/2013 |

OTHER PUBLICATIONS

International Search Report prepared by the Japan Patent Office dated Jul. 19, 2018, for International Application No. PCT/JP2018/019231.

*Primary Examiner* — Gevell V Selby
(74) *Attorney, Agent, or Firm* — Sheridan Ross P.C.

(57) ABSTRACT

The present disclosure relates to a solid-state imaging device and an electronic device capable of effectively preventing blooming. Provided is a solid-state imaging device including: a pixel array portion in which a plurality of pixels is two-dimensionally arranged, in which the pixels each include an in-pixel capacitance and a counter electrode of the in-pixel capacitance, the in-pixel capacitance being provided on a side opposite to a light incident surface of a photoelectric conversion element provided in a semiconductor substrate, the counter electrode being provided in the semiconductor substrate. The present disclosure can be applied to, for example, a back-illuminated CMOS image sensor.

20 Claims, 37 Drawing Sheets

(56) References Cited

U.S. PATENT DOCUMENTS

| | | |
|---|---|---|
| 2014/0166860 A1 | 6/2014 | Kohishi |
| 2015/0137188 A1 | 5/2015 | Oike et al. |
| 2016/0037117 A1* | 2/2016 | Ono .................... H04N 5/2173 |
| | | 348/308 |
| 2016/0301885 A1* | 10/2016 | Masuda ................ H04N 5/374 |
| 2018/0227529 A1* | 8/2018 | Mo ...................... H04N 5/3575 |
| 2018/0241954 A1* | 8/2018 | Miyake ................. H04N 5/359 |
| 2018/0302579 A1* | 10/2018 | Manabe ................ H04N 5/378 |

* cited by examiner

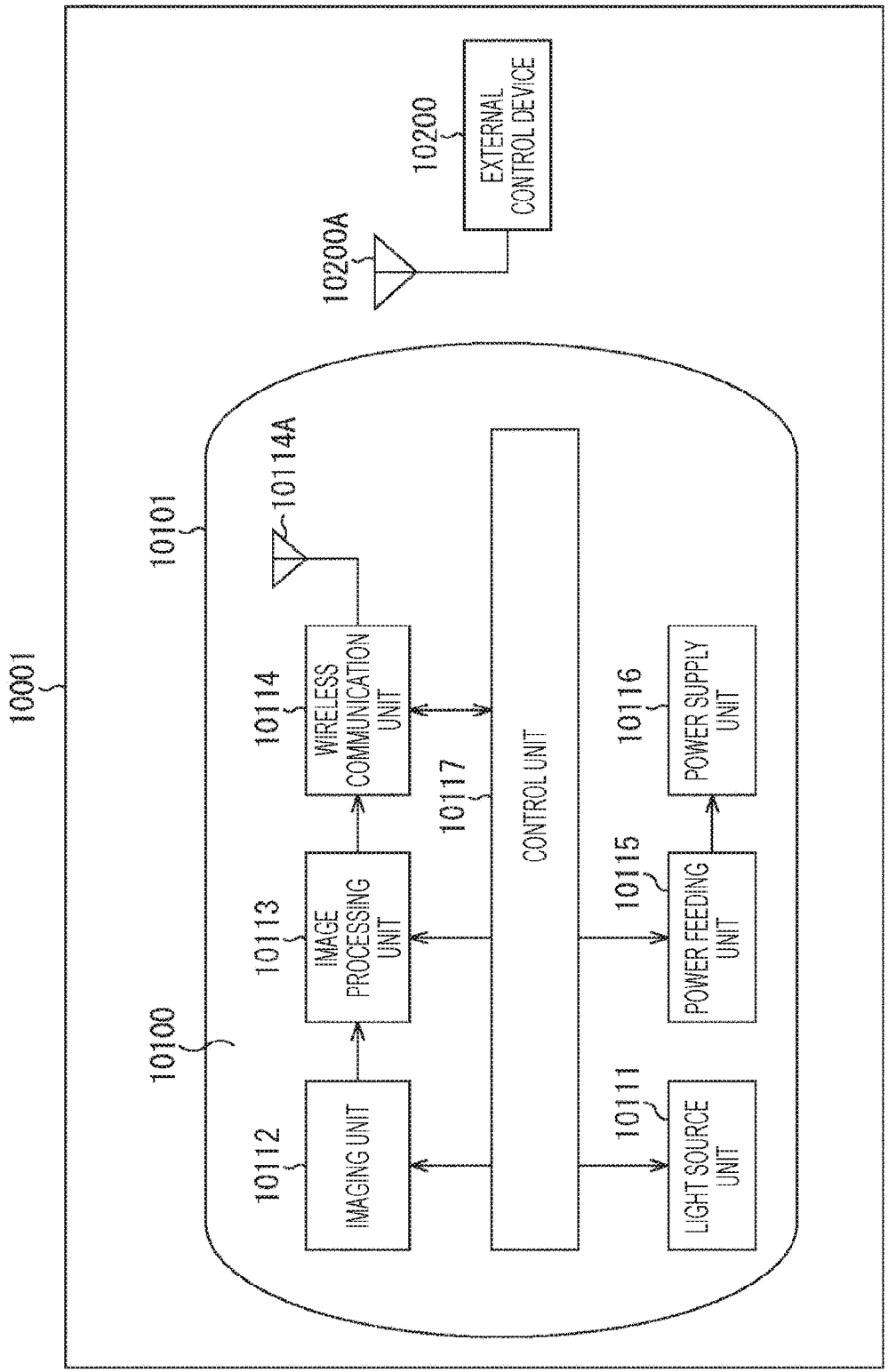

SOLID-STATE IMAGING DEVICE WITH PIXELS HAVING AN IN-PIXEL CAPACITANCE

CROSS REFERENCE TO RELATED APPLICATIONS

This application is a national stage application under 35 U.S.C. 371 and claims the benefit of PCT Application No. PCT/JP2018/019231 having an international filing date of 18 May 2018, which designated the United States, which PCT application claimed the benefit of Japanese Patent Application Nos. 2017-110382 filed 2 Jun. 2017 and 2017-179824 filed 20 Sep. 2017, the entire disclosures of each of which are incorporated herein by reference.

TECHNICAL FIELD

The present disclosure relates to a solid-state imaging device and an electronic device, and more particularly to a solid-state imaging device and an electronic device capable of effectively preventing blooming.

BACKGROUND ART

There is known a blooming phenomenon in which when a charge photoelectrically converted by a photodiode reaches or exceeds a certain level in a solid-state imaging device such as a complementary metal oxide semiconductor (CMOS) image sensor, the charge overflows from a saturated pixel into an adjacent pixel.

For example, a technique disclosed in Patent Document 1 has been proposed as a technique for preventing such blooming. Patent Document 1 discloses that a charge discharging portion is provided such that a control pulse to be applied to a gate electrode thereof is controlled to prevent an overflow of charge due to saturation of a photodiode.

CITATION LIST

Patent Document

Patent Document 1: Japanese Patent Application Laid-Open No. 2011-216672

SUMMARY OF THE INVENTION

Problems to be Solved by the Invention

Incidentally, there is generally a demand for a technique for effectively preventing blooming in a solid-state imaging device.

The present disclosure has been made in view of such a situation, and is intended to enable effective prevention of blooming.

Solutions to Problems

A solid-state imaging device according to one aspect of the present disclosure includes: a pixel array portion in which a plurality of pixels is two-dimensionally arranged, in which the pixels each include an in-pixel capacitance and a counter electrode of the in-pixel capacitance, the in-pixel capacitance being provided on a side opposite to a light incident surface of a photoelectric conversion element provided in a semiconductor substrate, the counter electrode being provided in the semiconductor substrate.

An electronic device according to one aspect of the present disclosure has a solid-state imaging device mounted thereon, in which the solid-state imaging device includes a pixel array portion in which a plurality of pixels is two-dimensionally arranged, and the pixels each include an in-pixel capacitance and a counter electrode of the in-pixel capacitance, the in-pixel capacitance being provided on a side opposite to a light incident surface of a photoelectric conversion element provided in a semiconductor substrate, the counter electrode being provided in the semiconductor substrate.

In the solid-state imaging device according to one aspect of the present disclosure and the electronic device having the solid-state imaging device mounted thereon, there is provided a pixel array portion in which a plurality of pixels is two-dimensionally arranged, and the pixels each include an in-pixel capacitance and a counter electrode of the in-pixel capacitance, the in-pixel capacitance being provided on a side opposite to a light incident surface of a photoelectric conversion element provided in a semiconductor substrate, the counter electrode being provided in the semiconductor substrate.

A solid-state imaging device according to one aspect of the present disclosure includes: a pixel array portion in which a plurality of pixels is two-dimensionally arranged, in which the pixels each include a capacitance including a first conductive layer and a second conductive layer that are stacked, the capacitance being provided on a side opposite to a light incident surface of a photoelectric conversion element provided in a semiconductor substrate.

In the solid-state imaging device according to one aspect of the present disclosure, there is provided a pixel array portion in which a plurality of pixels is two-dimensionally arranged, and the pixels each include a capacitance including a first conductive layer and a second conductive layer that are stacked, the capacitance being provided on a side opposite to a light incident surface of a photoelectric conversion element provided in a semiconductor substrate.

Effects of the Invention

According to one aspect of the present disclosure, blooming can be effectively prevented.

Note that effects to be achieved are not necessarily limited to those described here, and may be any of effects described in the present disclosure.

BRIEF DESCRIPTION OF DRAWINGS

FIG. 37 is a block diagram showing an example of the schematic configuration of an in-vivo information acquisition system.

MODE FOR CARRYING OUT THE INVENTION

Figure 1:
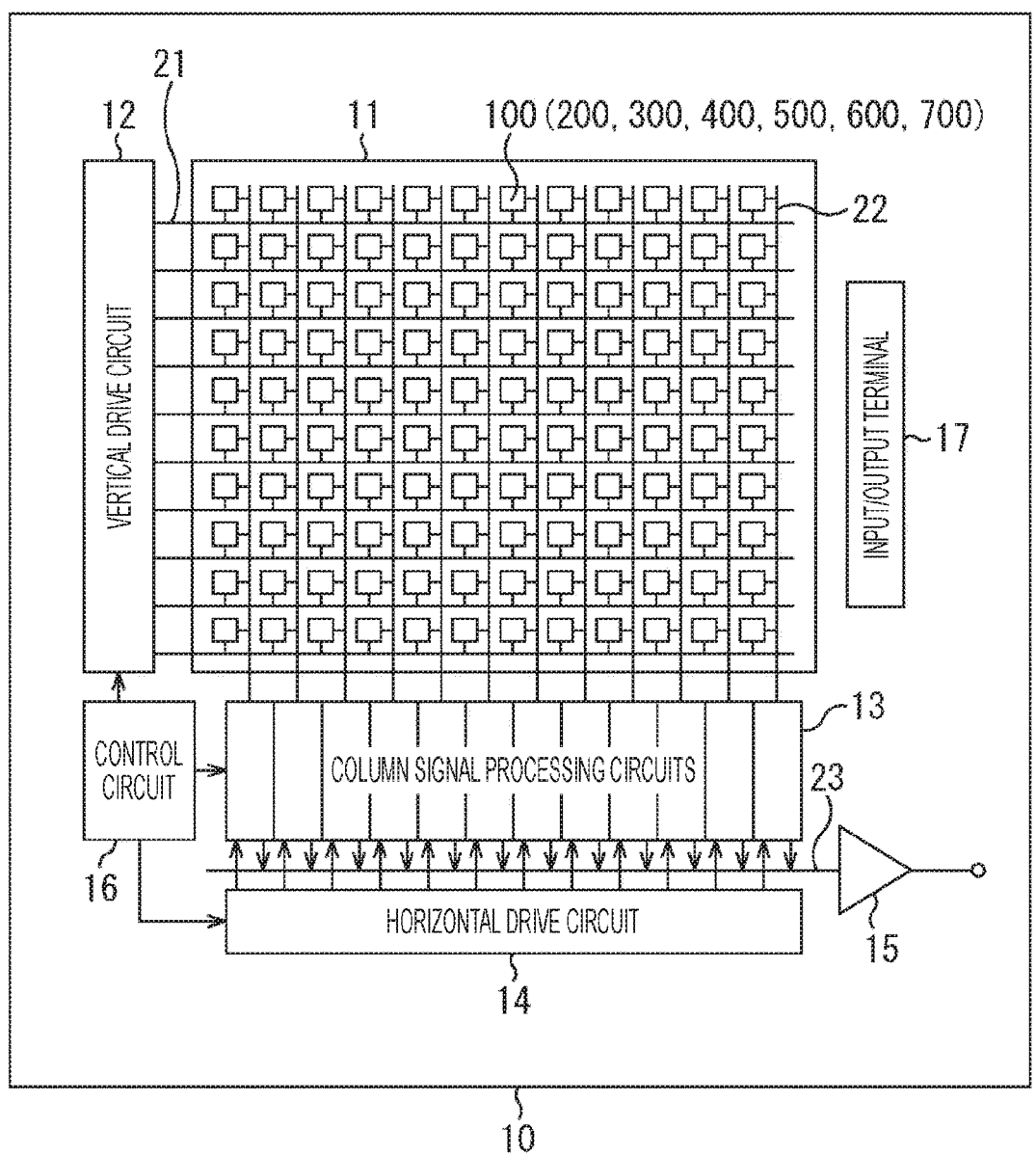
FIG. 1 is a block diagram showing a configuration example of an embodiment of a solid-state imaging device to which the technology according to the present disclosure has been applied.

Embodiments of the technology (present technology) according to the present disclosure will be described below with reference to the drawings. Note that descriptions will be provided in the following order.

1. Outline of Present Technology
2. Configuration of Solid-State imaging Device
3. Embodiments of Present Technology
(1) First Embodiment: Basic Configuration
(2) Second Embodiment: Configuration with Variable FCVDD
(3) Third Embodiment: Configuration with Overflow Path Directly Provided between PD and Counter Electrode of FC
(4) Fourth Embodiment: Configuration of 2PD Pixel
(5) Fifth Embodiment: Configuration with MEM
(6) Sixth Embodiment: Configuration with Conductive Layers Stacked on PD
(7) Seventh Embodiment: Configuration of 2PD Pixel with Conductive Layers Stacked on PD
4. Variations
5. Configuration of Electronic Device
6. Examples of Use of Solid-State imaging Device
7. Configuration Examples of Stack-Type Solid-State Imaging Device to Which Technology According to Present Disclosure Can Be Applied.
8. Example of Application to Mobile Object
9. Example of Application to In-Vivo Information Acquisition System <1. Outline of Present Technology>

In recent years, an increasing number of automobiles are equipped with cameras. For example, an image captured by an onboard camera can be shown to a driver or other occupants by use of a monitor screen provided inside the vehicle, or can be recorded on a driving recorder.

Furthermore, it is possible to detect white lines (lanes) of a road, traffic signals, road signs, oncoming vehicles, pedestrians around the own vehicle, and the like by applying image processing such as image recognition to images captured by an onboard camera. Accordingly, driving support and sight support can be performed on the basis of the detection results.

Incidentally, a blinking subject such as a light emitting diode (LED) light source cannot be imaged in an image sensor for an onboard camera, depending on the timing of blinks. This problem is called LED flicker, and has been attracting much attention. An image sensor with a low dynamic range requires exposure time to be adjusted for each subject. This is the reason why LED flicker is caused.

Here, in order to cope with subjects of various illuminances, exposure time just needs to be increased for a subject with a low illuminance, and be reduced for a subject with a high illuminance. As a result, it is possible to cope with various subjects even in a low dynamic range.

Meanwhile, regardless of exposure time, a readout is performed at a constant speed. Therefore, in a case where exposure time is set in units shorter than readout time, light incident on a photodiode (PD) in periods other than the exposure time is photoelectrically converted into a charge, but is discarded without being subjected to charge-voltage conversion to be read.

Even if an LED light source blinks during, so to speak, an ineffective period as described above, the LED light source cannot be imaged. This is a phenomenon called LED flicker.

In order to cope with LED flicker, it is necessary to expand a dynamic range. Various techniques have been proposed as techniques for expanding dynamic ranges. Furthermore, each manufacturer has already commercialized products to which the techniques for expanding dynamic ranges have been applied on the basis of the time-division system or the space-division system.

For example, disclosed is a technique for expanding a dynamic range by performing read operation a plurality of times during an exposure period while controlling a voltage to be applied to a transfer gate for transferring charges accumulated in a photodiode, on the basis of a so-called water gate transfer method as the time-division system (see, for example, Patent Document 2).

Furthermore, techniques for expanding dynamic ranges by applying the space-division system are disclosed in, for example, Patent Documents 3 and 4.

Moreover, disclosed is a technique for expanding a dynamic range by providing a memory unit in a pixel to directly increase the amount of charge to be handled by use of a technique called Lateral Overflow Integration Capacitor (LOFIC) (see, for example, Patent Document 5).

Patent Document 2: Japanese Patent Application Laid-Open No. 2008-99158
Patent Document 3: Japanese Patent Application Laid-Open No. 5-64083
Patent Document 4: Japanese Patent Application. Laid-Open No. 2006-253876
Patent Document 5: Japanese Patent Application Laid-Open No. 2005-328493

Incidentally, it is possible to expand a dynamic range to a value equal to or larger than 120 dB, which is equivalent to the dynamic range of human eyes, by increasing the number of divisions in the time-division system. However, it is not possible to cope with LED flicker accordingly. Moreover, an artifact of a moving subject cannot be avoided.

Furthermore, a type based on space division and a type in which a memory unit is provided in a pixel to directly increase the amount of charge to be handled cannot avoid reduction in resolution. In addition, a countermeasure against blooming is necessary so as to cope with a subject with a higher illuminance.

As described above, in order to cope with LED flicker, it is necessary to expand a dynamic range. Thus, there is a demand for a technique for effectively preventing blooming in expanding a dynamic range.

Therefore, the technology (present technology) according to the present disclosure enables effective prevention of blooming in a solid-state imaging device such as a CMOS image sensor. In particular, the present technology enables an onboard camera to expand a dynamic range to cope with LED flicker and an artifact of a moving subject by effectively preventing blooming.

<2. Configuration of Solid-State Imaging Device>
(Configuration Example of Solid-State Imaging Device)
FIG. 1 is a block diagram showing a configuration example of an embodiment of a solid-state imaging device to which the technology according to the present disclosure has been applied.

A CMOS image sensor 10 shown in FIG. 1 is an example of a solid-state imaging device using a CMOS. The CMOS image sensor 10 lets in incident light (image light) from a subject via an optical lens system (not shown). Then, the CMOS image sensor 10 converts the quantity of incident light imaged on an imaging surface into electric signals in units of pixels, and outputs the electric signals as pixel signals.

Referring to FIG. 1, the CMOS image sensor 10 includes a pixel array portion 11, a vertical drive circuit 12, column signal processing circuits 13, a horizontal drive circuit 14, an output circuit 15, a control circuit 16, and an input/output terminal 17.

A plurality of pixels 100 is two-dimensionally arranged (in a matrix) in the pixel array portion 11. The pixel 100 includes a photodiode (PD), as a photoelectric conversion element, and a plurality of pixel transistors. For example, the pixel transistors include a transfer transistor, a reset transistor, an amplifier transistor, and a selection transistor.

Note that in addition to the pixel 100, a pixel 200, a pixel 300, a pixel 400, a pixel 500, a pixel 600, or a pixel 700 may be arranged in the pixel array portion 11. Details thereof will be described later.

The vertical drive circuit 12 includes, for example, a shift register. The vertical drive circuit 12 selects a predetermined pixel drive line 21, and supplies the selected pixel drive line 21 with a drive signal (pulse) for driving the pixels 100, so that the pixels 100 are driven in units of rows. In other words, the vertical drive circuit 12 selectively and sequentially scans each pixel 100 of the pixel array portion 11 in the vertical direction in units of rows, and supplies pixel signals to the column signal processing circuits 13 through vertical signal lines 22. The pixel signals are based on charges (signal charges) generated according to the quantities of light received in the respective photodiodes of the pixels 100.

The column signal processing circuit 13 is disposed for each column of the pixels 100. The column signal processing circuits 13 perform, for the respective pixel columns, signal processing such as noise removal on the signals output from the pixels 100 in a single row. For example, the column signal processing circuits 13 perform signal processing such as correlated double sampling (CDS) or delta data sampling (DDS) for removing fixed pattern noise specific to pixels, in addition to analog-to-digital (AD) conversion.

The horizontal drive circuit 14 includes, for example, a shift register. The horizontal drive circuit 14 sequentially outputs horizontal scanning pulses to select each of the column signal processing circuits 13 in order, and causes the pixel signal to be output from each of the column signal processing circuits 13 to a horizontal signal line 23.

The output circuit 15 performs signal processing on the signals sequentially supplied from the respective column signal processing circuits 13 through the horizontal signal lines 23, and outputs the processed signals. Note that there are cases where, for example, the output circuit 15 performs only buffering, or performs black level adjustment, column variation correction, various types of digital signal processing, and the like.

The control circuit 16 controls operation of each part of the CMOS image sensor 10.

Furthermore, the control circuit 16 generates a clock signal and a control signal on the basis of a vertical synchronization signal, a horizontal synchronization signal, and a master clock signal. The clock signal serves as the basis of operation of the vertical drive circuit 12, the column signal processing circuits 13, the horizontal drive circuit 14, and the like. The control circuit 16 outputs the generated clock signal and control signal to the vertical drive circuit 12, the column signal processing circuits 13, the horizontal drive circuit 14, and the like.

The input/output terminal 17 exchanges signals with the outside.

The column signal processing circuit 13 that performs the CDS or DDS process and the AD conversion process is disposed for each pixel column in the CMOS image sensor 10 shown in FIG. 1, configured as described above. Thus, the CMOS image sensor 10 is of a type called a column AD type. Furthermore, the CMOS image sensor 10 shown in FIG. 1 may be, for example, a back-illuminated CMOS image sensor.

<3. Embodiments of Present Technology>

(1) First Embodiment

First, a pixel 100 according to a first embodiment will be described with reference to FIGS. 2 to 6.

(Circuit Diagram Showing Pixel Configuration)

Figure 2:
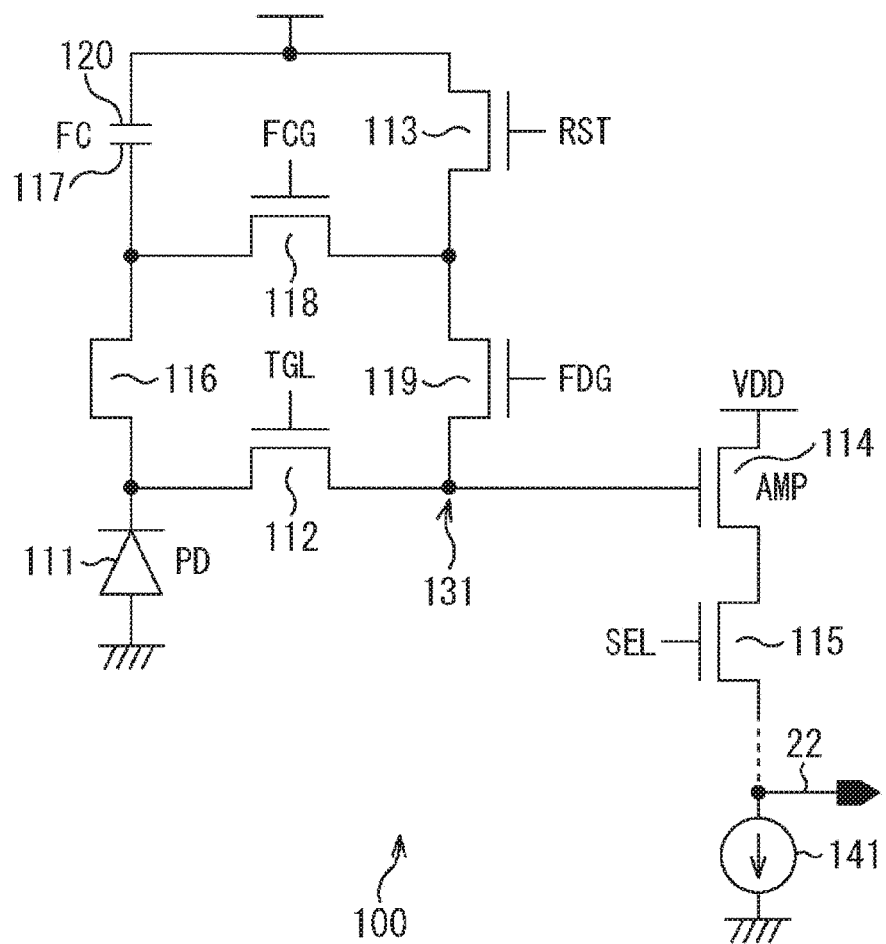
FIG. 2 is a circuit diagram showing an example of the configuration of a pixel according to a first embodiment.

FIG. 2 is a circuit diagram showing an example of the configuration of the pixel 100 according to the first embodiment.

Referring to FIG. 2, the pixel 100 includes a junction transistor 116, an in-pixel capacitance (FC) 117, an FC connection transistor 118, a conversion efficiency switching transistor 119, and a floating diffusion region (FD) 131, in addition to a photodiode (PD) 111, a transfer transistor 112, a reset transistor 113, an amplifier transistor 114, and a selection transistor 115.

The photodiode 111 is, for example, a photoelectric conversion element configured as a PN-junction photodiode (PD). The photodiode 111 generates and accumulates a charge (signal charge) according to the quantity of received light. The anode of the photodiode 111 is grounded. The cathode of the photodiode 111 is connected to the transfer transistor 112 and the junction transistor 116.

The transfer transistor 112 is connected to the floating diffusion region (FD) 131 and a node between the photodiode 111 and the junction transistor 116 while being located between the floating diffusion region (FD) 131 and the node. A drive signal TGL is applied to the gate of the transfer transistor 112. When the drive signal TGL turns from the Low (L) level to the High (H) level, the transfer gate of the transfer transistor 112 is brought into conduction (on state). As a result, the charge accumulated in the photodiode 111 is transferred to the floating diffusion region (FD) 131 via the transfer transistor 112.

Note that the drain of the transfer transistor 112 is connected to the source of the conversion efficiency switching transistor 119 and the gate of the amplifier transistor 114, and the connection point (node) forms the floating diffusion region (FD) 131. The floating diffusion region 131 is a charge-voltage conversion unit, which converts the charge transferred thereto into voltage.

The reset transistor 113 is connected to a node between the FC connection transistor 118 and the conversion efficiency switching transistor 119, and is also connected to a power source that supplies a source voltage to a counter electrode 120 of the in-pixel capacitance (FC) 117 while being located between the node and the power source. A drive signal RST is applied to the gate of the reset transistor 113. When the drive signal RST turns to the H level, the reset transistor 113 is brought into conduction, and the potential of the floating diffusion region (FD) 131 is reset via the conversion efficiency switching transistor 119.

The amplifier transistor 114 has a gate connected to the floating diffusion region (FD) 131, and a drain connected to a power source VDD. Thus, the amplifier transistor 114 serves as an input unit of a readout circuit, which is a so-called source follower circuit, for reading a voltage signal held in the floating diffusion region (FD) 131. In other words, the source of the amplifier transistor 114 is connected to the vertical signal line 22 (FIG. 1) via the selection transistor 115. As a result, the amplifier transistor 114 and a constant current source 141 connected to one end of the vertical signal line 22 form the source follower circuit.

The selection transistor 115 is connected to (the source of) the amplifier transistor 114 and the vertical signal line 22 while being located therebetween. A drive signal SEL is applied to the gate of the selection transistor 115. When the drive signal SEL turns to the H level, the selection transistor 115 is brought into conduction, and the pixel 100 comes into a selected state. As a result, a signal amplified by the amplifier transistor 114 is output to the vertical signal line 22 (FIG. 1) via the selection transistor 115.

The junction transistor 116 is connected to the node between the photodiode 111 and the transfer transistor 112, and is also connected to a node between the in-pixel capacitance (FC) 117 and the FC connection transistor 118 while being located between the two nodes. The junction transistor 116 transfers part of the charge accumulated in the photodiode 111 to the in-pixel capacitance (FC) 117.

In other words, the junction transistor 116 serves a function to transfer a charge having overflowed from the photodiode 111 to the in-pixel capacitance (FC) 117. Thus, the junction transistor 116 corresponds to an overflow path (for example, an overflow path 155 shown in FIG. 3) to be described later.

The in-pixel capacitance (FC) 117 accumulates the charge transferred (having overflowed) from the photodiode 111 via the junction transistor 116. Note that here, the in-pixel capacitance (FC) 117 is also referred to as a floating capacitor (FC) because of its function.

The FC connection transistor 118 is connected to the node between the junction transistor 116 and the in-pixel capacitance (FC) 117, and is also connected to the node between the reset transistor 113 and the conversion efficiency switching transistor 119 while being located between the two nodes. A drive signal FCG is applied to the gate of the FC connection transistor 118. When the drive signal FCG turns to the H level, the transfer gate of the FC connection transistor 118 is brought into conduction. As a result, there are coupled capacitance potentials of the floating diffusion region (FD) 131 and the in-pixel capacitance (FC) 117, that is, the FD (charge-voltage conversion capacitance) and the FC (in-pixel capacitance).

The conversion efficiency switching transistor 119 is connected to the floating diffusion region (ED) 131 and the node between the reset transistor 113 and the FC connection transistor 118 while being located between the floating diffusion region (FD) 131 and the node. A drive signal FDG is applied to the gate of the conversion efficiency switching transistor 119. When the drive signal FDG turns to the H level, the transfer gate of the conversion efficiency switching transistor 119 is brought into conduction. As a result, there are coupled capacitance potentials of the floating diffusion region (ED) 131 and the node at the connection point of the reset transistor 113, the EC connection transistor 118, and the conversion efficiency switching transistor 119, that is, capacitance potentials of the FD (charge-voltage conversion capacitance) and the node at the connection point.

Note that the EC connection transistor 118 and the conversion efficiency switching transistor 119 function as transfer gates. Thus, the EC connection transistor 118 and the conversion efficiency switching transistor 119 can be regarded as transfer transistors.

Furthermore, the counter electrode 120 of the in-pixel capacitance (FC) 117 is connected to the power source that supplies a source voltage. Thus, a high voltage corresponding to the power source or an equivalent thereof is applied to the counter electrode 120. However, the voltage to be applied to the counter electrode 120 is fixed at a constant voltage.

Note that the gate of the transfer transistor 112, the gate of the reset transistor 113, the gate of the selection transistor 15, the gate of the FC connection transistor 118, and the gate of the conversion efficiency switching transistor 119 are connected to the vertical drive circuit 12 (FIG. 1) through the pixel drive lines 21 (a TGL drive line, an RST drive line, a SEL drive line, an FCG drive line, and an FDG drive line, respectively), and are supplied with pulses as drive signals (the drive signal TGL, the drive signal RST, the drive signal SEL, the drive signal FCG, and the drive signal FDG, respectively).

The pixel 100 is configured as described above.

(Cross-Sectional View of Pixel Structure)

Figure 3:
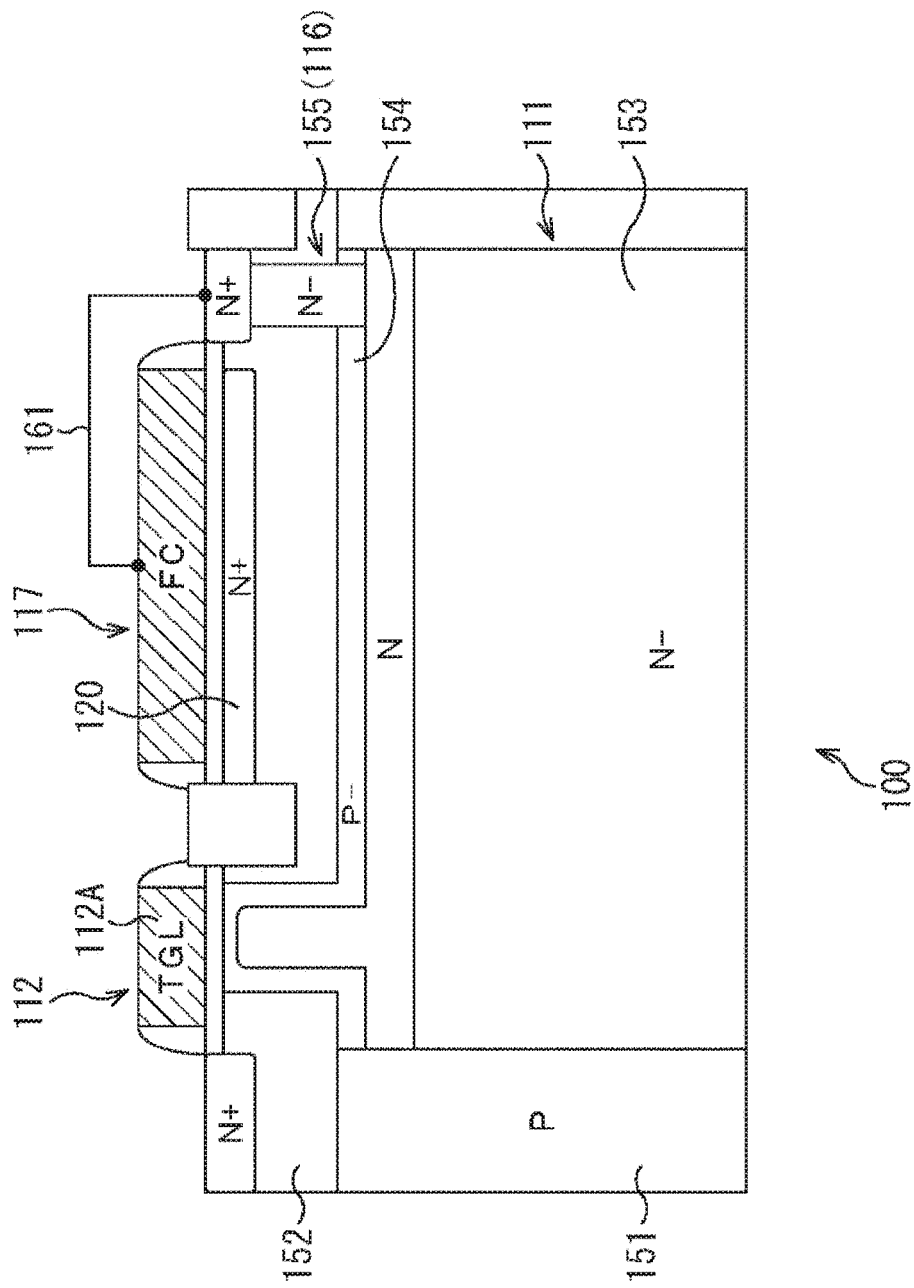
FIG. 3 is a cross-sectional view of a first example of the structure of the pixel according to the first embodiment.
Figure 4:
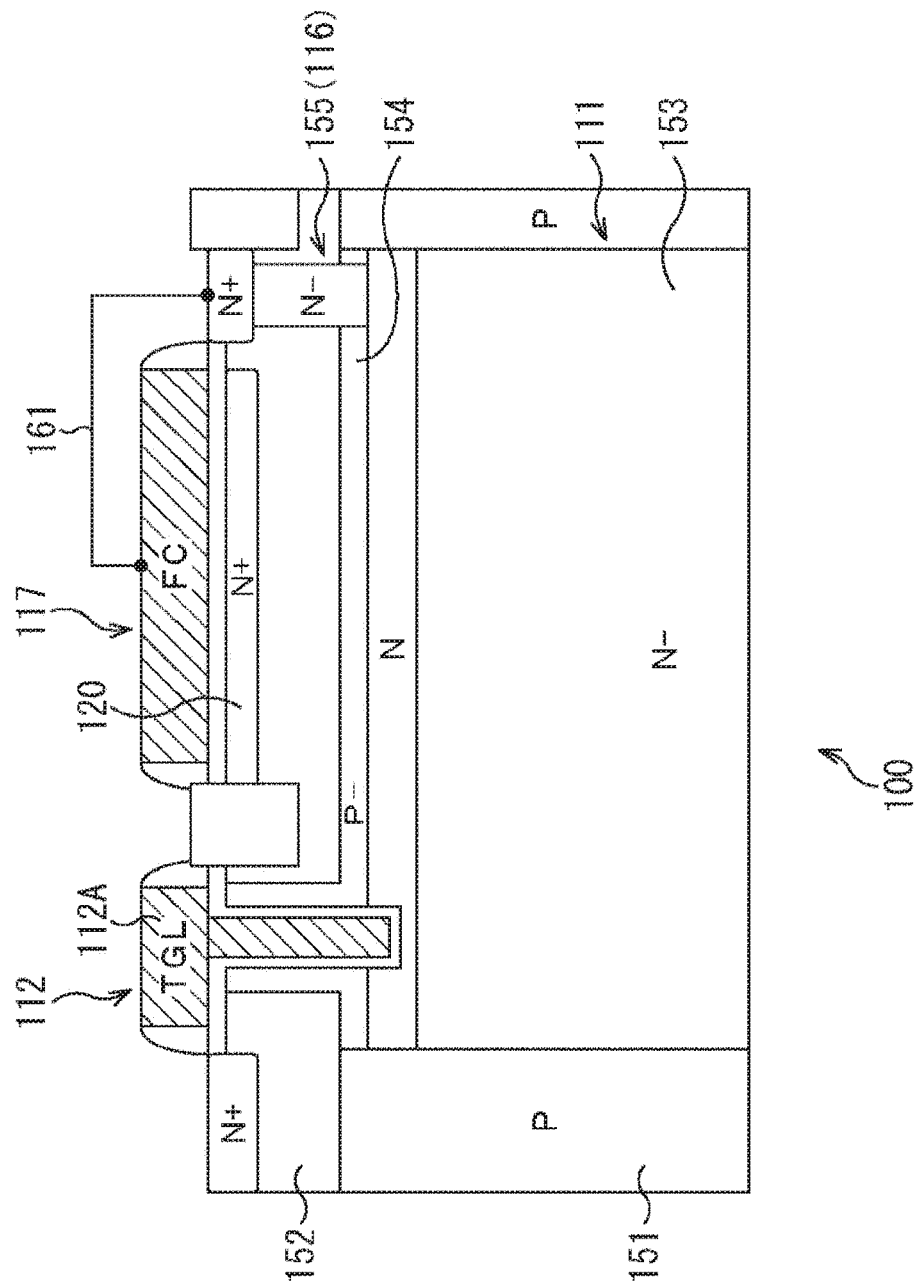
FIG. 4 is a cross-sectional view of a second example of the structure of the pixel according to the first embodiment.

Next, the structure of the pixel 100 according to the first embodiment will be described with reference to FIGS. 3 and 4. FIG. 3 is a cross-sectional view of a first example of the structure of the pixel 100 according to the first embodiment. Furthermore, FIG. 4 is a cross-sectional view of a second example of the structure of the pixel 100 according to the first embodiment.

Note that in the pixel 100, a surface on the light incident side is referred to as "light incident surface," and a surface on the side opposite to the light incident surface is referred to as "element surface" in the following description. Furthermore, the depth direction of a silicon substrate (silicon layer) is also referred to as "vertical direction."

The pixel 100 includes the photodiode 111 as a photoelectric conversion element in a silicon substrate. The photodiode 111 is formed by, for example, the embedding of an N-type layer 153 in association with a P-type well layer 151 in the silicon substrate and a P-type layer 152 on the element surface side. The photodiode 111 photoelectrically converts light incident from the light incident surface side, and accumulates a charge resulting from the photoelectric conversion.

The pixel 100 includes the transfer transistor 112 through the counter electrode 120 and the like described above in addition to the photodiode 111. However, a gate electrode 112A corresponding to the transfer transistor 112, the in-pixel capacitance (FC) 117, and the counter electrode 120 are particularly shown here.

As a result of applying the drive signal TGL to the gate electrode 112A, the transfer gate is brought into conduction, and the charge accumulated in the photodiode 111 is transferred to the floating diffusion region (FD) 131.

Note that FIG. 3 shows a structure in which it is possible to transfer the charge accumulated in the photodiode 111 by controlling the potential state of a region formed below the gate electrode 112A on the basis of the drive signal TGL. However, as shown in FIG. 4, the transfer transistor 112 may be configured as a vertical transistor. As described above, the charge accumulated in the photodiode 111 can be directly read by use of the transfer transistor 112 as a vertical transistor.

Returning to description of FIG. 3, the in-pixel capacitance (FC) 117 is provided on the element surface side with respect to the photodiode 111 provided in the silicon substrate. Furthermore, the counter electrode 120 of the in-pixel capacitance (FC) 117 is provided as an N-type region (N+) in the silicon substrate. A high voltage corresponding to the power source or an equivalent thereof is applied to the counter electrode 120.

The in-pixel capacitance (FC) 117 is connected to the overflow path 155 via a contact 161. The contact 161 includes metal or the like, and electrically connects the in-pixel capacitance (FC) 117 to the overflow path 155.

The overflow path 155 is provided as a vertical N-type region between the photodiode 111 and the in-pixel capacitance (FC) 117 such that the overflow path 155 is adjacent to the counter electrode 120 provided in the silicon substrate. The overflow path 155 transfers part of the charge accumulated in the photodiode 111 to the in-pixel capacitance (FC) 117 via the contact 161.

Note that as described above, the overflow path 155 corresponds to the junction transistor 116 shown in FIG. 2.

As described above, when the in-pixel capacitance (FC) 117 is provided in the pixel 100 according to the first embodiment, the in-pixel capacitance (FC) 117 is provided on the element surface side. At the same time, the counter electrode 120 of the in-pixel capacitance (FC) 117 is provided in the silicon substrate.

Furthermore, in the pixel 100 according to the first embodiment, the overflow path 155 is vertically provided between the photodiode 111 and the in-pixel capacitance (FC) 117 such that the overflow path 155 is adjacent to the counter electrode 120 provided in the silicon substrate. In addition, a high voltage corresponding to the power source or an equivalent thereof is applied to the counter electrode 120 of the in-pixel capacitance (FC) 117. As a result, the charge having overflowed from the photodiode 111 and the in-pixel capacitance (FC) 117 is absorbed (discharged) by the counter electrode 120.

Therefore, it is possible to effectively prevent blooming of charge to other pixels (photodiodes). Furthermore, particularly in a case where the CMOS image sensor 10 (FIG. 1) is mounted on an onboard camera, it is possible to expand the dynamic range by effectively preventing blooming. As a result, it is possible to cope with LED flicker and an artifact of a moving subject.

In addition, in the pixel 100 according to the first embodiment, the charge having overflowed from the photodiode 111 and the in-pixel capacitance (FC) 117 is absorbed (discharged) by the counter electrode 120 of the in-pixel capacitance (FC) 117. Thus, it is not necessary to provide an additional element such as a charge discharging portion. The pixel 100 according to the first embodiment has an advantage in this respect.

(Example of Driving Pixel)

Next, an example of driving the pixel 100 according to the first embodiment will be described with reference to a timing chart of FIG. 5.

Figure 5:
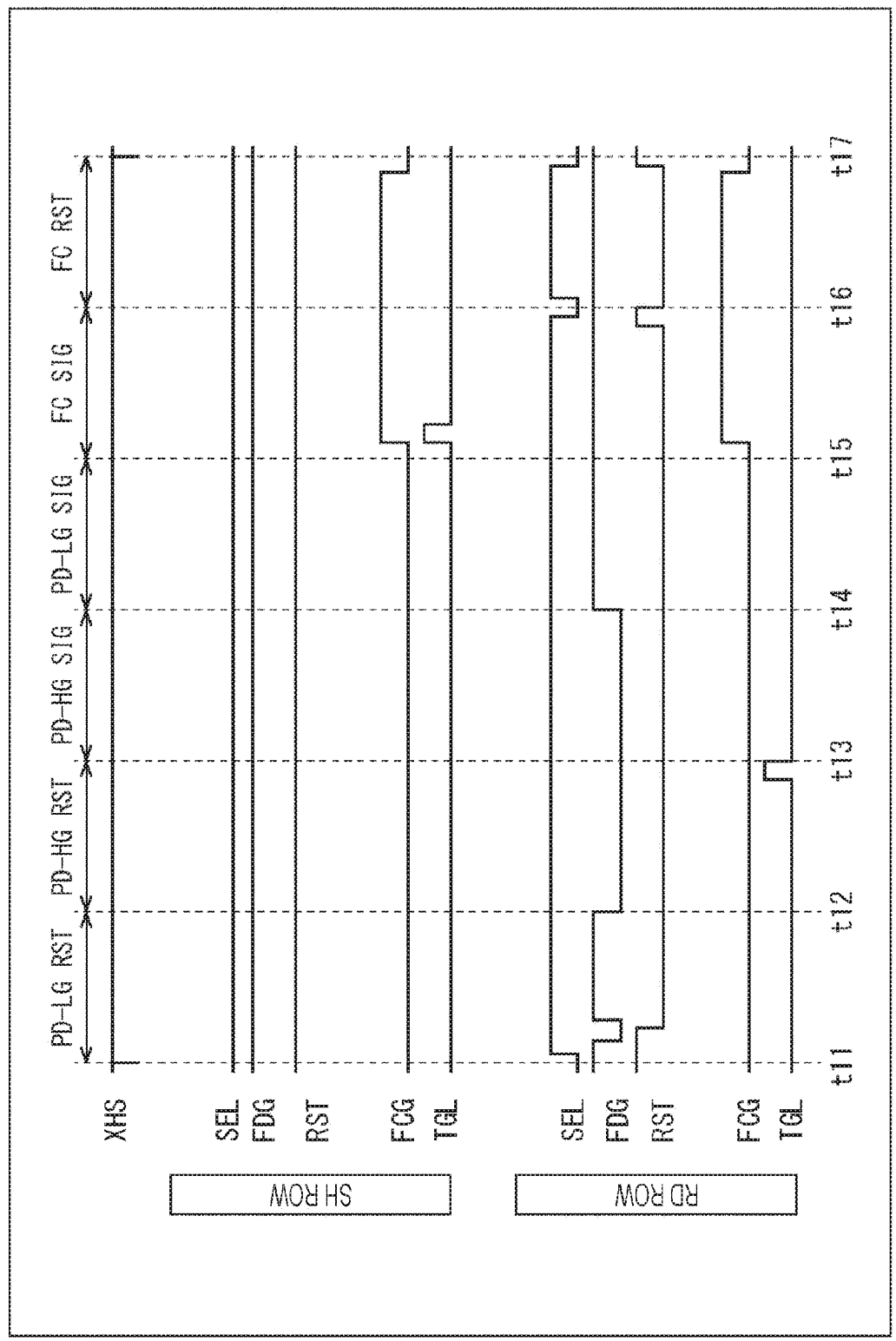
FIG. 5 is a timing chart describing an example of driving the pixel according to the first embodiment.

FIG. 5 shows a timing chart of the drive signal SEL for the selection transistor 115, the drive signal FDG for the conversion efficiency switching transistor 119, the drive signal RST for the reset transistor 113, the drive signal FCG for the FC connection transistor 118, and the drive signal TGL for the transfer transistor 112, in a shutter period (SH row) and a readout period (RD row).

Furthermore, in FIG. 5, a reset level at low conversion efficiency is denoted by "PD-LG RST," and a reset level at high conversion efficiency is denoted by "PD-HG RST." In addition, a signal level at low conversion efficiency is denoted by "PD-LG SIG," and a signal level at high conversion efficiency is denoted by "PD-HG SIG."

Moreover, a reset level at the time of coupling the capacitance potentials of the FD and the FC is denoted by "FC RST," and a signal level at the time of coupling the capacitance potentials of the FD and the FC is denoted by "FC SIG." Note that the same relationships apply to timing charts of other embodiments to be described later.

The driving of the pixel 100 in the readout period will be mainly described below.

First, in a period from time t11 to time t12, the drive signal RST and the drive signal FDG are set to the H level, and the reset transistor 113 and the conversion efficiency switching transistor 119 are thus brought into conduction. As a result, a charge accumulated in the floating diffusion region (FD) 131 is reset.

Subsequently, the drive signal FDG and the drive signal RST are sequentially set to the L level in this order, so that the conversion efficiency switching transistor 119 and the reset transistor 113 are sequentially brought out of conduction (off state). Then, the drive signal FDG is again set to the H level. As a result, the conversion efficiency switching transistor 119 is brought into conduction.

Accordingly, the period from time t11 to time t12 becomes a PD-LG RST period, and a noise level (182) at low conversion efficiency is read.

Next, in a period from time t12 to time t13, the drive signal FDG is at the L level, and the conversion efficiency switching transistor 119 is in a non-conductive state. Accordingly, the period from time t12 to time t13 becomes a PD-HG RST period, and a noise level (N1) at high conversion efficiency is read.

Furthermore, immediately before time t13, the drive signal TGL is set to the H level, and the transfer transistor 112 is thus brought into conduction. As a result, a charge accumulated in the photodiode 111 is transferred to the floating diffusion region (FD) 131. Subsequently, the drive signal TGL is set to the L level, and the transfer transistor 112 is thus brought out of conduction. At this time, the drive signal FDG is at the L level, and the conversion efficiency switching transistor 119 is in a non-conductive state.

Accordingly, a period from time t13 to time t14 becomes a PD-HG SIG period, and a signal level (S1) at high conversion efficiency is read.

Next, in a period from time t14 to time t15, the drive signal FDG is at the H level, and the conversion efficiency switching transistor 119 is in a conductive state. Accordingly, the period from time t14 to time t15 becomes a PD-LG SIG period, and a signal level (S2) at low conversion efficiency is read.

Next, in a period from time t15 to time t16, the drive signal FCG is set to the H level, and the FC connection transistor 118 is thus brought into conduction. As a result, there are coupled capacitance potentials of the floating diffusion region (FD) 131 and the in-pixel capacitance (FC) 117, that is, the FD (charge-voltage conversion capacitance) and the FC (in-pixel capacitance).

Accordingly, the period from time t15 to time t16 becomes an FC SIG period, and a signal level (S3) is read.

Furthermore, immediately before time t16, the drive signal RST is set to the H level, and the reset transistor 113 is thus brought into conduction to reset charges accumulated in the floating diffusion region (FD) 131 and the in-pixel capacitance (FC) 117. Subsequently, the drive signal RST is set to the L level, and the reset transistor 113 is thus brought out of conduction.

Accordingly, a period from time t16 to time t17 becomes an FC RST period, and a noise level (N3) is read.

Thus, the noise levels and the signal levels are read in the following order: the noise level (N2) at low conversion efficiency is read in the PD-LG RST period, the noise level (N1) at high conversion efficiency is read in the PD-HG RST period, the signal level (S1) at high conversion efficiency is read in the PD-HG SIG period, the signal level (S2) at low conversion efficiency is read in the PD-LG SIG period, the signal level (S3) is read in the FC SIG period, and the noise level (N3) is read in the FC RST period.

Then, an offset component is removed, and a true signal component is obtained as a result of taking a difference (S1−N1) between the high conversion efficiency signal level (S1) and the high conversion efficiency noise level (N1). Here, the noise level (N1) is read earlier than the signal level (S1). Therefore, correlated double sampling (CDS) is performed, so that a signal is generated. As a result, a first image (S1−N1) is obtained.

Furthermore, a true signal component is obtained as a result of taking a difference (S2−N2) between the low conversion efficiency signal level (S2) and the low conversion efficiency noise level (N2). Here, the noise level (N2) as also read earlier than the signal level (S2). Therefore, correlated double sampling (CDS) is performed, so that a signal is generated. As a result, a second image (S2−N2) is obtained.

However, the low conversion efficiency noise level (N2) and the low conversion efficiency signal level (S2) are not sequentially read. Therefore, it is necessary to temporarily hold the low conversion efficiency noise level (N2) read first in a line memory or the like.

Moreover, a true signal component is obtained as a result of taking a difference (S3−N3) between the signal level (S3) and the noise level (N3). Here, however, the signal level (S3) is read earlier than the noise level (N3). Therefore, delta data sampling (DDS) is performed, so that a signal is generated. As a result, a third image (S3−N3) is obtained.

As a result, three images of the first image (S1−N1), the second image (S2−N2), and the third image (S3−N3) are obtained. Therefore, it is possible to generate an image with a high dynamic range and no artifact of a moving subject by combining the three images by means of an image processing circuit (for example, a DSP circuit 1002 shown in FIG. 28 or the like) provided at a subsequent stage.

Note that the drive signal SEL for the selection transistor 115 is at the H level in the readout period except time t16 between the FC SIG period and the FC RST period, at which the drive signal SEL is set to the L level.

The driving of the pixel 100 in the readout period has been described above. Meanwhile, in the shutter period, the levels of the drive signals are set as follows: the drive signals SEL, FDG, and RST are at constant levels, the drive signal FCG is at the H level only in the FC SIG period and the FC RST period, and the drive signal TGL is temporarily set to the H level only in the FC SIG period.

Furthermore, "XHS" represents a horizontal synchronization signal in FIG. 5. Thus, FIG. 5 shows that the horizontal synchronization signal XHS is input at time t11 and time t17.

(Variation)

Figure 6:
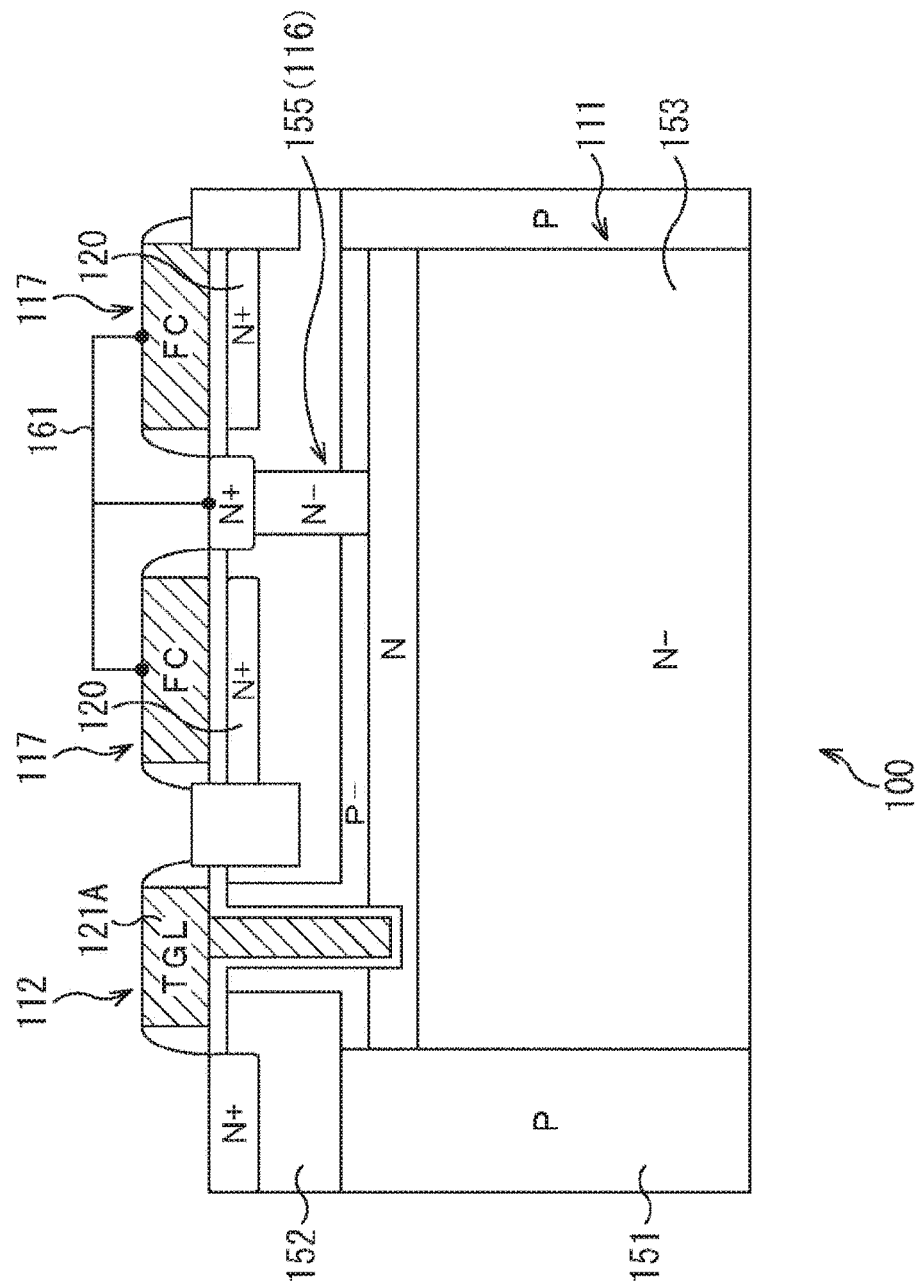
FIG. 6 is a cross-sectional view of a third example of the structure of the pixel according to the first embodiment.

FIG. 6 is a cross-sectional view of a third example of the structure of the pixel 100 according to the first embodiment.

In a pixel 100 shown in FIG. 6, an in-pixel capacitance (FC) 117 is provided on the element surface side with respect to a photodiode 111 provided in a silicon substrate, and a counter electrode 120 is provided in the silicon substrate. The pixel 100 shown in FIG. 6 is identical to the pixel 100 shown in FIG. 4 in this respect.

Furthermore, in the pixel 100 shown in FIG. 6, an overflow path 155 is vertically provided in the silicon substrate. The pixel 100 shown in FIG. 6 is identical to the pixel 100 shown in FIG. 4 also in this respect. However, the counter electrode 120 of the in-pixel capacitance (FC) 117 is provided in such a way as to surround the overflow path 155 in the pixel 100 shown in FIG. 6. The pixel 100 shown in FIG. 6 is different from the pixel 100 shown in FIG. 4 in this respect.

The overflow path 155 is connected, via a contact. 161, to the in-pixel capacitance (FC) 117 opposed to the counter electrode 120 surrounding the overflow path 155. The overflow path 155 transfers part of a charge accumulated in the photodiode ill to the in-pixel capacitance (FC) 117 via the contact 161.

Furthermore, a charge having overflowed from the photodiode 111 and the in-pixel capacitance (FC) 117 is absorbed (discharged) by the counter electrode 120 of the in-pixel capacitance (FC) 117 also in the pixel 100 shown in FIG. 6. Therefore, at is possible to effectively prevent blooming of charge to other pixels (photodiodes).

The first embodiment has been described above.

(2) Second Embodiment

Next, a pixel 200 according to a second embodiment will be described with reference to FIGS. 7 and 8.
(Circuit Diagram Showing Pixel Configuration)
FIG. 7 is a circuit diagram showing an example of the configuration of the pixel 200 according to the second embodiment.

Figure 7:
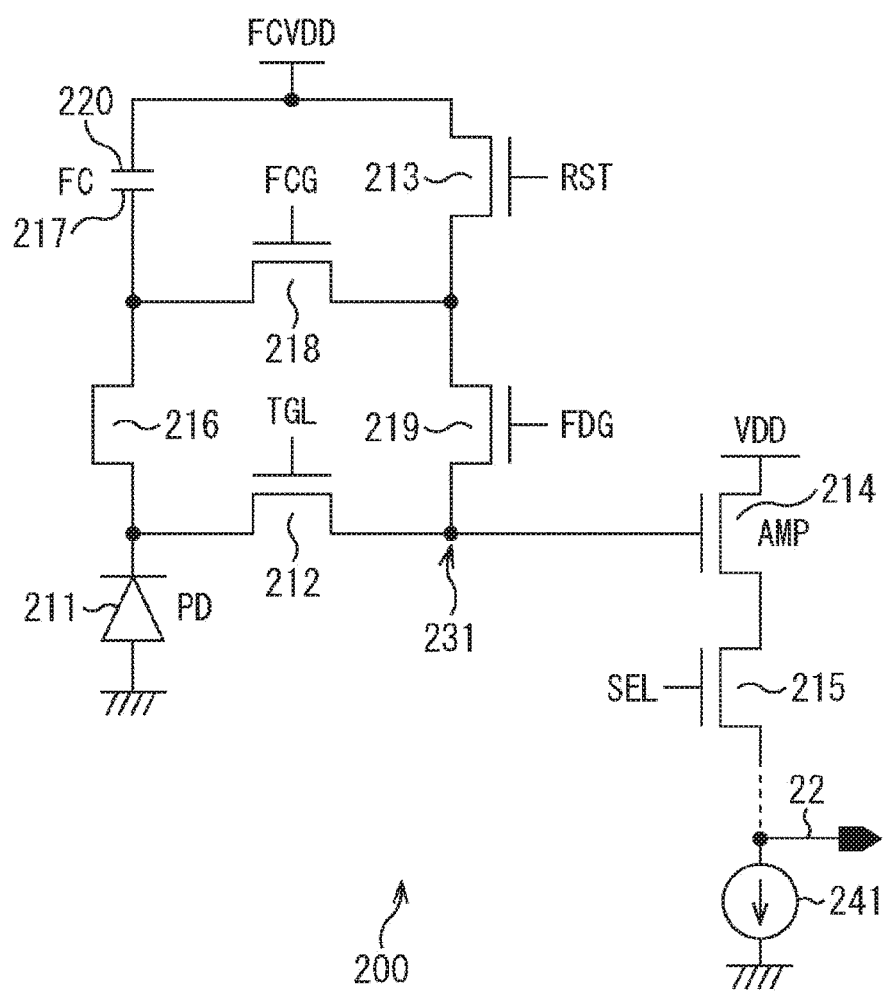
FIG. 7 is a circuit diagram showing an example of the configuration of a pixel according to a second embodiment.

Referring to FIG. 7, the pixel 200 includes a junction transistor 216, an in-pixel capacitance (FC) 217, an FC connection transistor 218, a conversion efficiency switching transistor 219, and a floating diffusion region (FD) 231, in addition to a photodiode (PD) 211, a transfer transistor 212, a reset transistor 213, an amplifier transistor 214, and a selection transistor 215.

The configuration of the pixel 200 shown in FIG. 7 is basically similar to that of the pixel 100 shown in FIG. 2. However, a variable voltage (FCVDD) is applied to a counter electrode 220 of the in-pixel capacitance (FC) 217 in the pixel 200. The pixel 200 is different from the pixel 100 shown in FIG. 2 in this respect. In other words, in the pixel 100 according to the first embodiment, the voltage to be applied to the counter electrode 120 of the in-pixel capacitance (FC) 117 is fixed at a constant voltage. Meanwhile, in the pixel 200 according to the second embodiment, the voltage to be applied to the counter electrode 220 of the in-pixel capacitance (FC) 217 is variable.
(Example of Driving Pixel)
FIG. 8 shows a timing chart of an example of driving the pixel 200 according to the second embodiment.

Figure 8:
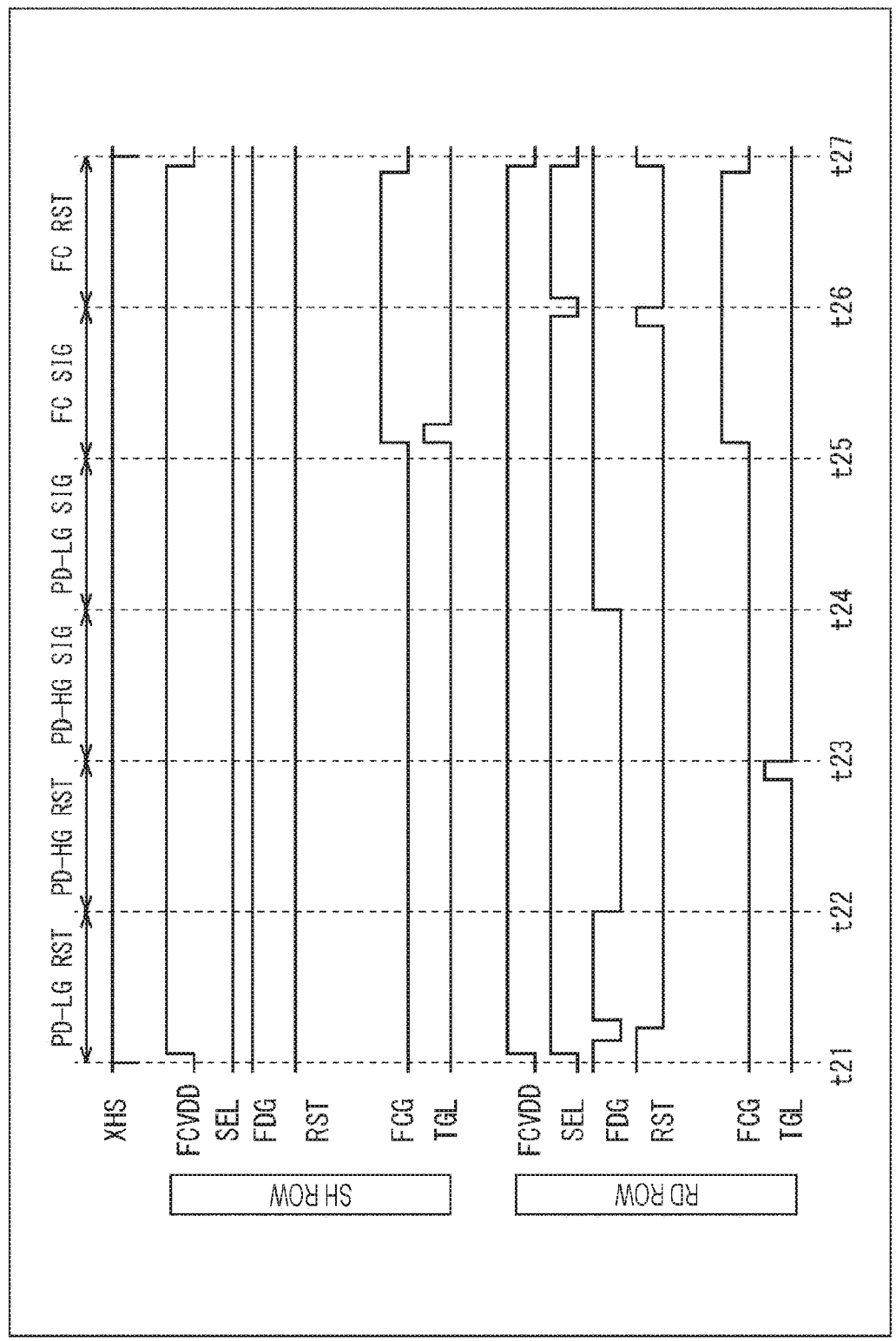
FIG. 8 is a timing chart describing an example of driving the pixel according to the second embodiment.

In the timing chart of the driving of the pixel 200 shown in FIG. 8, a timing chart of the voltage FCVDD to be applied to the counter electrode 220 has been added for a shutter period (SH row) and a readout period (RD row). The timing chart of the driving of the pixel 200 is different from the timing of the driving of the pixel 100 shown in FIG. 5 in this respect.

Here, the voltage FCVDD to be applied to the counter electrode 220 is caused to switch between a voltage for the shutter period and the readout period and a voltage for an accumulation period (a period between the shutter period and the readout period). For example, the voltage FCVDD is set to the H level in the shutter period and the readout period, so that the in-pixel capacitance (FC) 217 is set to the on state. Meanwhile, the voltage FCVDD is set to the L level in the accumulation period, so that the in-pixel capacitance (FC) 217 can be set to the off state.

As described above, it is possible to reduce the electric field of a charge accumulation node of the in-pixel capacitance (FC) 217 in the accumulation period by switching the voltage FCVDD in the accumulation period. Therefore, it is possible to prevent generation of dark current and white spots in the accumulation period.

Furthermore, as a result of driving the pixel 200 in accordance with the timing chart shown in FIG. 8, noise levels and signal levels are read in the following order: a noise level (N2) at low conversion efficiency is read in a PD-LG RST period, a noise level (N1) at high conversion efficiency is read in a PD-HG RST period, a signal level (S1) at high conversion efficiency is read in a PD-HG SIG period, a signal level (S2) at low conversion efficiency is read in a PD-LG SIG period, a signal level (S3) is read in an FC SIG period, and a noise level (N3) is read in an FC RST period.

In addition, signals are generated as a result of performing correlated double sampling (CDS) or delta data sampling (DDS) on the signal levels (S) and noise levels (N) thus obtained. Accordingly, each of a first image (S1−N1), a second image (S2−N2), and a third image (S3−N3) is obtained. Then, it is possible to generate an image with a high dynamic range and no artifact of a moving subject by combining the three images by means of an image processing circuit (not shown) provided at a subsequent stage.

The second embodiment has been described above.

(3) Third Embodiment

Next, a pixel 300 according to a third embodiment will be described with reference to FIGS. 9 to 13.
(Circuit Diagram Showing Pixel Configuration)
FIG. 9 is a circuit diagram showing an example of the configuration of the pixel 300 according to the third embodiment.

Figure 9:
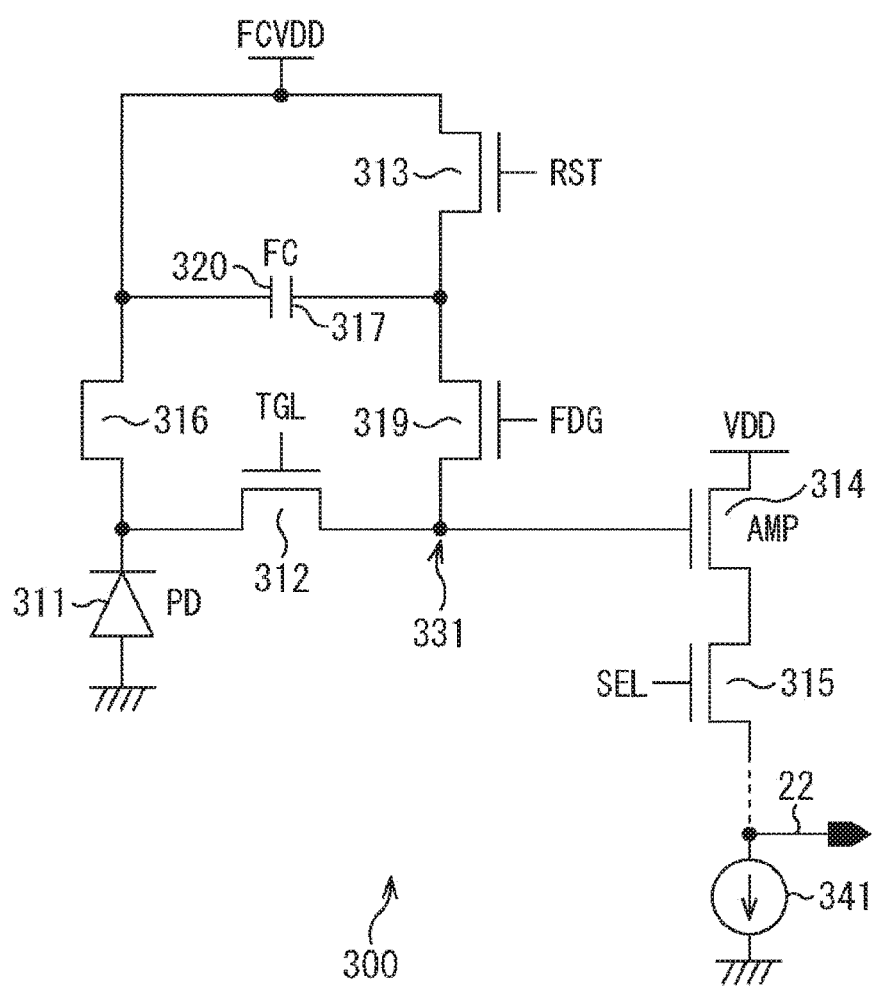
FIG. 9 is a circuit diagram showing an example of the configuration of a pixel according to a third embodiment.

Referring to FIG. 9, the pixel 300 includes a junction transistor 316, an in-pixel capacitance (FC) 317, a conversion efficiency switching transistor 319, and a floating diffusion region (FD) 331, in addition to a photodiode (PD) 311, a transfer transistor 312, a reset transistor 313, an amplifier transistor 314, and a selection transistor 315.

No FC connection transistor is provided in the pixel 300 shown in FIG. 9. In addition, the in-pixel capacitance (FC) 317 is connected to a node between the junction transistor 316 and a power source that supplies a source voltage to a counter electrode 320, and is also connected to a node between the reset transistor 313 and the conversion efficiency switching transistor 319 while being located between the two nodes. The pixel 300 is different from the pixel 100 shown in FIG. 2 in these respects.

Furthermore, the junction transistor 316 corresponding to an overflow path is connected to a node between the photodiode 311 and the transfer transistor 312, and is also connected to the node between the in-pixel capacitance (FC) 317 and the power source that supplies a source voltage to the counter electrode 320 while being located between the two nodes. The pixel 300 is different from the pixel 100 shown in FIG. 2 also in this respect.

In other words, in the pixel 100 according to the first embodiment, the overflow path 155 (junction transistor 116) is vertically provided between the photodiode 111 and the in-pixel capacitance (FC) 117 such that the overflow path 155 (junction transistor 116) is adjacent to the counter electrode 120 provided in the silicon substrate. Meanwhile, in the pixel 300 according to the third embodiment, an overflow path (junction transistor 316) is directly provided in the vertical direction between the photodiode 311 and the counter electrode 320.

Note that the pixel 300 may be configured such that a charge having overflowed from the photodiode 311 is accumulated in the in-pixel capacitance (FC) 317 via the transfer transistor 312 and the conversion efficiency switching transistor 319 as a result of bringing the transfer gates of the transfer transistor 312 and the conversion efficiency switching transistor 319 into a semi-conductive state (so to speak, a half-open state). In other words, the in-pixel capacitance (FC) 317 is used as an accumulation node in this case.

(Cross-Sectional View of Pixel Structure)

Figure 10:
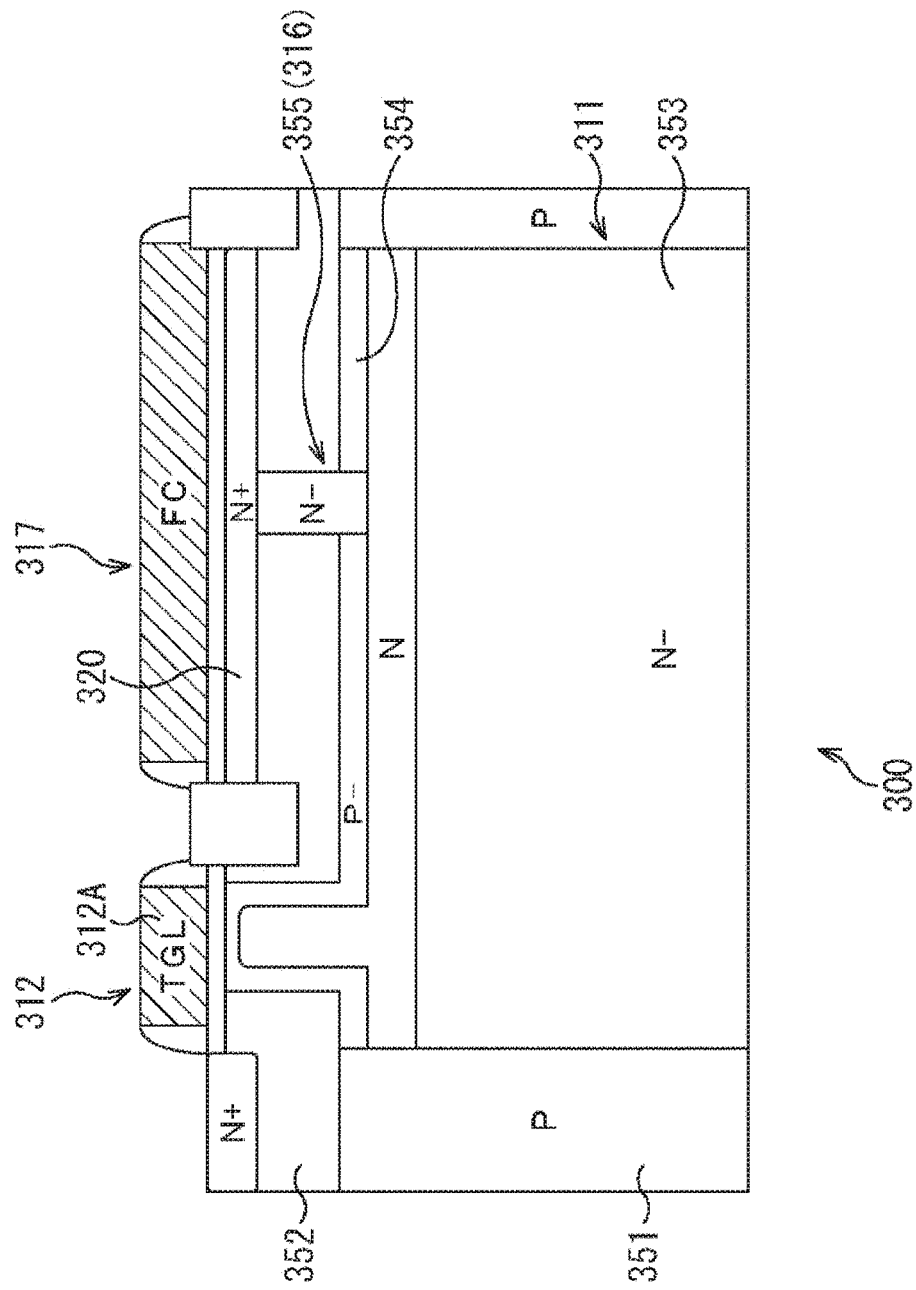
FIG. 10 is a cross-sectional view of a first example of the structure of the pixel according to the third embodiment.
Figure 11:
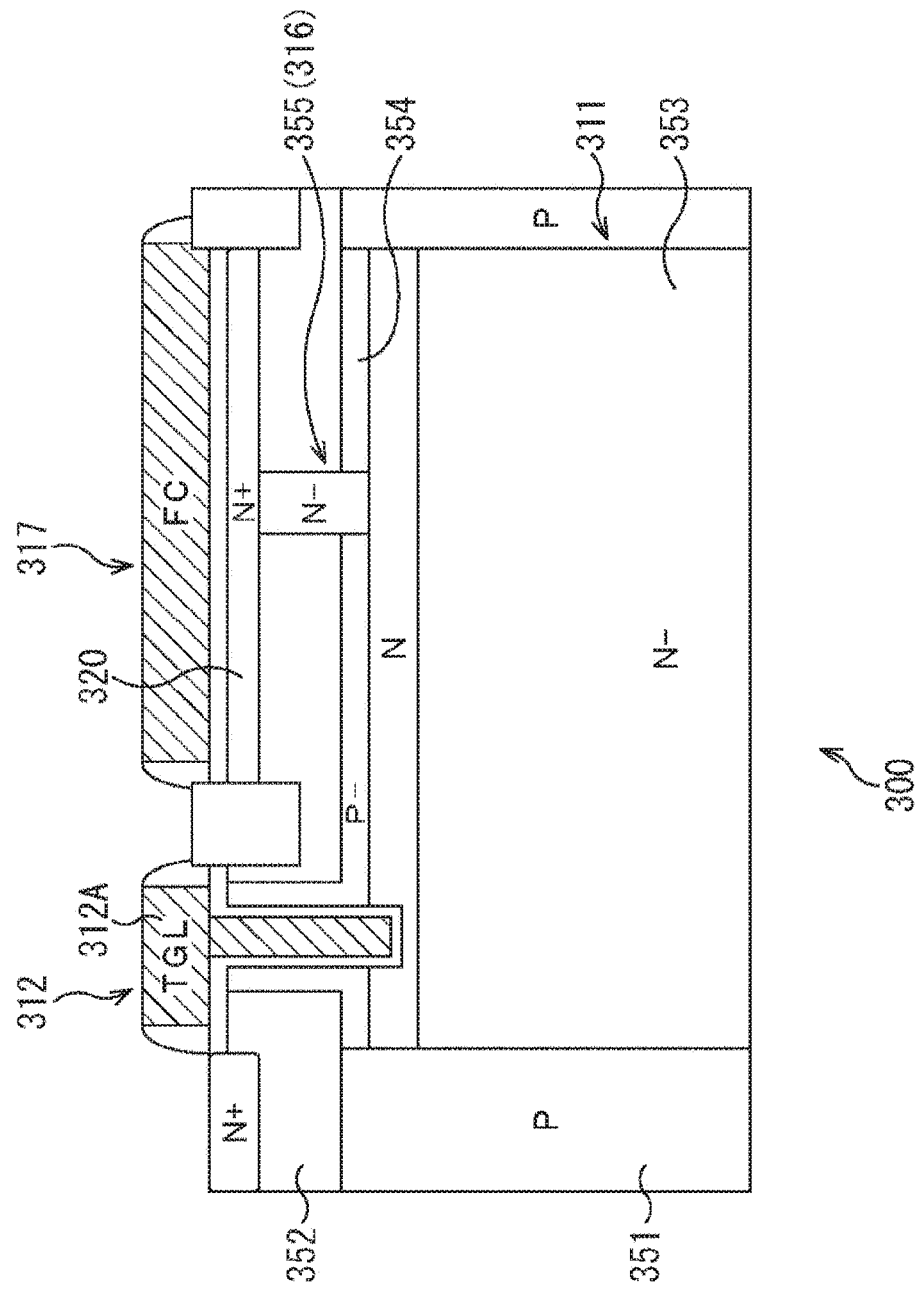
FIG. 11 is a cross-sectional view of a second example of the structure of the pixel according to the third embodiment.

Next, the structure of the pixel 300 according to the third embodiment will be described with reference to FIGS. 10 and 11. FIG. 10 is a cross-sectional view of a first example of the structure of the pixel 300 according to the third embodiment. Furthermore, FIG. 11 is a cross-sectional view of a second example of the structure of the pixel 300 according to the third embodiment.

The pixel 300 includes the photodiode 311 as a photoelectric conversion element in a silicon substrate. The photodiode 311 is formed by, for example, the embedding of an N-type layer 353 in association with a P-type well layer 351 in the silicon substrate and a P-type layer 352 on the element surface side.

The pixel 300 includes the transfer transistor 312 through the counter electrode 320 and the like described above in addition to the photodiode 311. However, a gate electrode 312A corresponding to the transfer transistor 312, the in-pixel capacitance (FC) 317, and the counter electrode 320 are particularly shown here.

As a result of applying a drive signal TGL to the gate electrode 312A, the transfer gate is brought into conduction, and a charge accumulated in the photodiode 311 is transferred to the floating diffusion region (FD) 331.

Note that FIG. 10 shows a structure in which it is possible to transfer the charge accumulated in the photodiode 311 by controlling the potential state of a region formed below the gate electrode 312A on the basis of the drive signal TGL. However, as shown in FIG. 11, the transfer transistor 312 may be configured as a vertical transistor.

Returning to description of FIG. 10, the in-pixel capacitance (FC) 317 is provided on the element surface side with respect to the photodiode 311 provided in the silicon substrate. Furthermore, the counter electrode 320 of the in-pixel capacitance (FC) 317 is provided as an N-type region (N+) the silicon substrate. The counter electrode 320 is connected to the power source, and is supplied with any given source voltage.

An overflow path 355 is provided as a vertical N-type region (N−) between the photodiode 311 and the counter electrode 320. The overflow path 355 transfers (discharges) part of the charge accumulated in the photodiode 311 to the counter electrode 320.

As described above, when the in-pixel capacitance (FC) 317 is provided in the pixel 300 according to the third embodiment, the in-pixel capacitance (FC) 317 is provided on the element surface side. At the same time, the counter electrode 320 of the in-pixel capacitance (FC) 317 is provided in the silicon substrate.

Furthermore, in the pixel 300 according to the third embodiment, the overflow path 355 is directly provided in the vertical direction between the photodiode 311 and the counter electrode 320 provided in the silicon substrate. In addition, a high voltage corresponding to the power source or an equivalent thereof is applied to the counter electrode 320 of the in-pixel capacitance (FC) 317. As a result, the charge having overflowed from the photodiode 311 is absorbed (discharged) by the counter electrode 320.

Therefore, it is possible to effectively prevent blooming of charge to other pixels (photodiodes). Furthermore, particularly in a case where the CMOS image sensor 10 (FIG. 1) is mounted on an onboard camera, it is possible to expand the dynamic range by effectively preventing blooming. As a result, it is possible to cope with LED flicker and an artifact of a moving subject.

(First Example of Driving Pixel)

Figure 12:
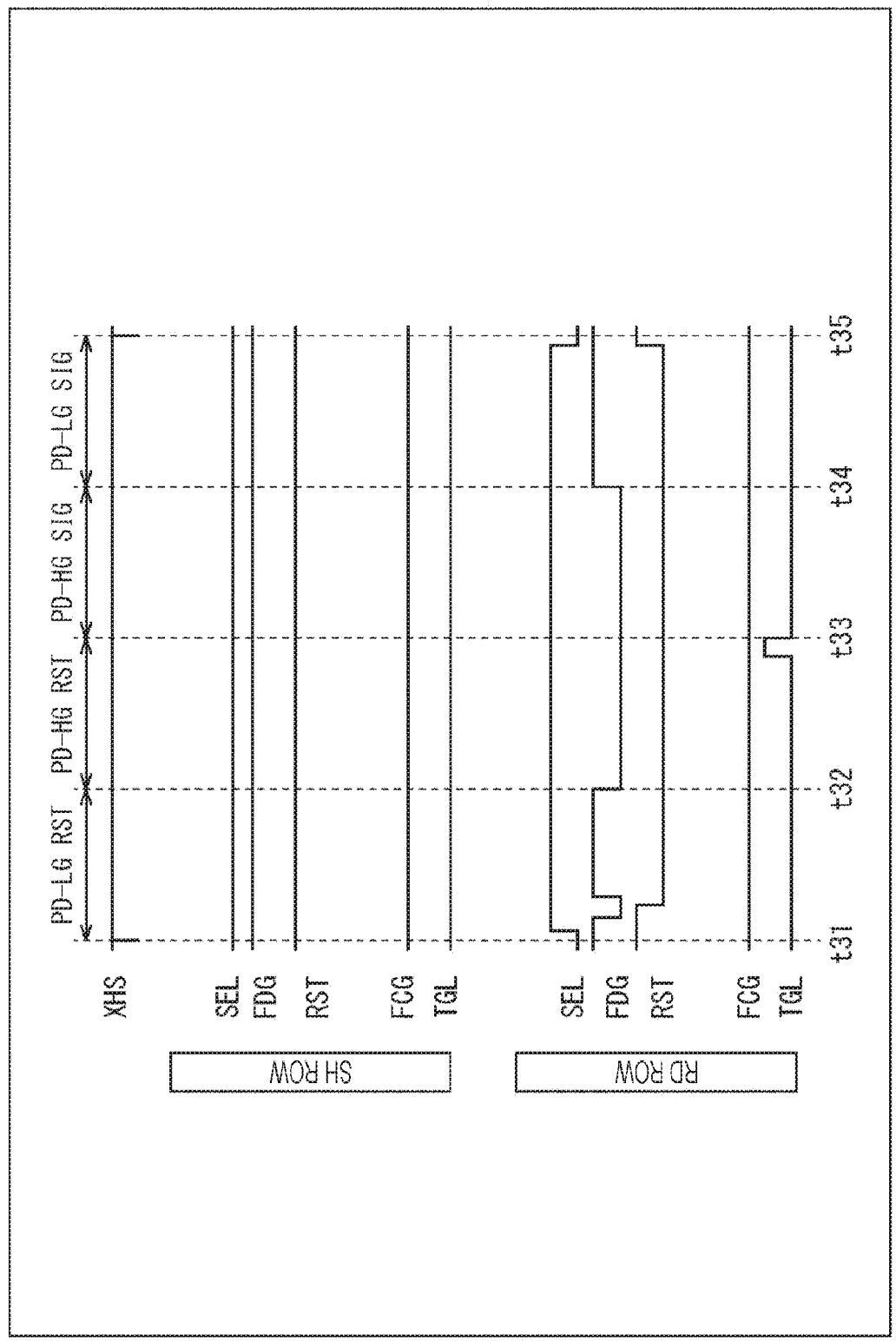
FIG. 12 is a timing chart describing a first example of driving the pixel according to the third embodiment.

Next, the driving of the pixel 300 according to the third embodiment will be described with reference to FIGS. 12 and 13. FIG. 12 is a timing chart showing a first example of driving the pixel 300 according to the third embodiment.

The driving of the pixel 300 in a readout period will be mainly described below.

First, in a period from time t31 to time t32, a drive signal RST and a drive signal FDG are set to the H level, and the reset transistor 313 and the conversion efficiency switching transistor 319 are thus brought into conduction. As a result, a charge accumulated in the floating diffusion region (FD) 331 is reset. Subsequently, the drive signal FDG and the drive signal RST are sequentially set to the L level in this order, so that the conversion efficiency switching transistor 319 and the reset transistor 313 are sequentially brought out of conduction. Then, the drive signal FDG is again set to the H level. As a result, the conversion efficiency switching transistor 319 is brought into conduction.

Accordingly, the period from time t31 to time t32 becomes a PD-LG RST period, and a noise level (N2) at low conversion efficiency is read.

Next, in a period from time t32 to time t33, the drive signal FDG is at the L level, and the conversion efficiency switching transistor 319 is in a non-conductive state. Accordingly, the period from time t32 to time t33 becomes a PD-HG RST period, and a noise level (N1) at high conversion efficiency is read.

Furthermore, immediately before time t33, the drive signal TGL is set to the H level, and the transfer transistor 312 is thus brought into conduction. As a result, the charge accumulated in the photodiode 311 is transferred to the floating diffusion region (FD) 331. Subsequently, the drive signal TGL is set to the L level, and the transfer transistor 312 is thus brought out of conduction. At this time, the drive signal FDG is at the L level, and the conversion efficiency switching transistor 319 is in a non-conductive state.

Accordingly, a period from time t33 to time t34 becomes a PD-HG SIG period, and a signal level (S1) at high conversion efficiency is read.

Next, in a period from time t34 to time t35, the drive signal FDG is at the H level, and the conversion efficiency switching transistor 319 is in a conductive state. Accordingly, the period from time t34 to time t35 becomes a PD-LG SIG period, and a signal level (S2) at low conversion efficiency is read.

Thus, the noise levels and the signal levels are read in the following order: the noise level (N2) at low conversion efficiency is read in the PD-LG RST period, the noise level (N1) at high conversion efficiency is read in the PD-HG RST period, the signal level (S1) at high conversion efficiency is read in the PD-HG SIG period, and the signal level (S2) at low conversion efficiency is read in the PD-LG SIG period.

Then, an offset component is removed, and a true signal component is obtained as a result of taking a difference (S1−N1) between the high conversion efficiency signal level (S1) and the high conversion efficiency noise level (N1).

Here, the noise level (N1) is read earlier than the signal level (S1). Therefore, correlated double sampling (CDS) is performed, so that a signal is generated. As a result, a first image (S1−N1) is obtained.

Furthermore, a true signal component is obtained as a result of taking a difference (S2−N2) between the low conversion efficiency signal level (S2) and the low conversion efficiency noise level (N2). Here, the noise level (N2) is also read earlier than the signal level (S2). Therefore, correlated double sampling (CDS) is performed, so that a signal is generated. As a result, a second image (S2−N2) is obtained.

However, the low conversion efficiency noise level (N2) and the low conversion efficiency signal level (S2) are not sequentially read. Therefore, it necessary to temporarily hold the low conversion efficiency noise level (N2) read first in a line memory or the like, as described above.

As a result, two images of the first image (S1−N1) and the second image (S2−N2) are obtained. Therefore, it is possible to generate an image with a high dynamic range and no artifact of a moving subject, by combining the two images by means of an image processing circuit (for example, the DSP circuit 1002 shown in FIG. 28 or the like) provided at a subsequent stage.

Note that an example of sequentially reading the high conversion efficiency signal level (S1) and noise level (N1) and the low conversion efficiency signal level (S2) and noise level (N2) has been shown as the first example of driving the pixel 300 in FIG. 12. Meanwhile, it is also possible to adopt a configuration in which the drive signal FDG to be applied to the gate of the conversion efficiency switching transistor 319 is controlled to cause the conversion efficiency switching transistor 319 to switch between conduction and non-conduction, so that only the high conversion efficiency signal level (S1) and noise level (N1) or only the low conversion efficiency signal level (S2) and noise level (N2) are read.

(Second Example of Driving Pixel)

An example of switching and reading the conversion efficiency of the charge accumulated in the photodiode 311 has been shown as the first example of driving the pixel 300 in FIG. 12. Meanwhile, it is also possible to use the in-pixel capacitance (FC) 317 as an accumulation node. In this case, the in-pixel capacitance (FC) 317 and the floating diffusion region (FD) 331 can accumulate charges exceeding the saturation charge amount of the photodiode 311. Described below is the driving of the pixel 300 having such a configuration.

Figure 13:
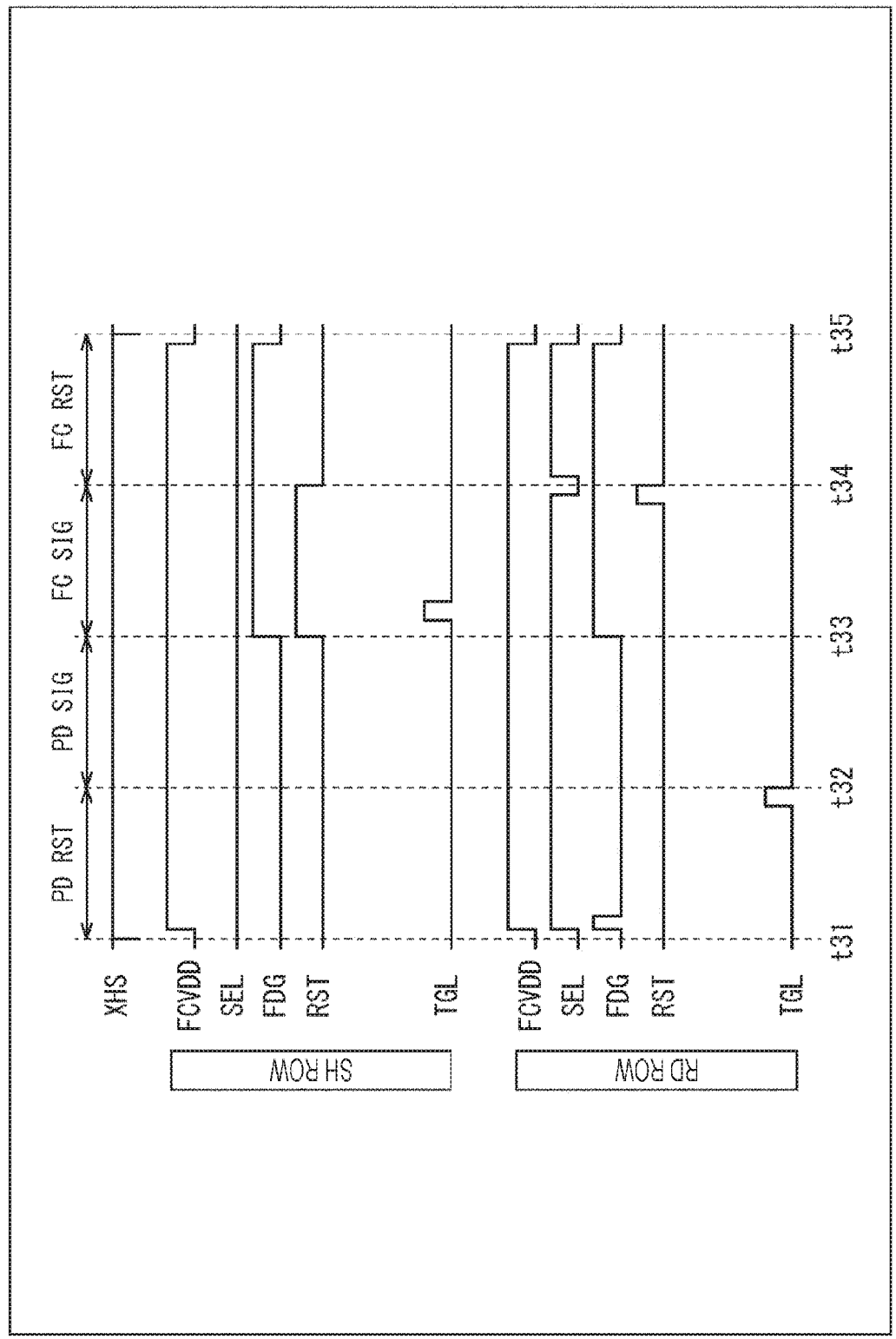
FIG. 13 is a timing chart describing a second example of driving the pixel according to the third embodiment.

FIG. 13 is a timing chart showing a second example of driving the pixel 300 according to the third embodiment.

First, in the period from time t31 to time t32, the drive signal FDG is turned from the L level to the H level, and thus, the conversion efficiency switching transistor 319 is temporarily brought into conduction. Then, the drive signal FDG is again set to the L level to bring the conversion efficiency switching transistor. 319 out of conduction.

Accordingly, the period from time t31 to time t32 becomes a PD RST period, and the noise level (N2) is read.

Furthermore, immediately before time t32, the drive signal TGL is set to the H level, and the transfer transistor 312 is thus brought into conduction. As a result, the charge accumulated in the photodiode 311 is transferred to the floating diffusion region (FD) 331. Subsequently, the drive signal TGL is set to the L level, and the transfer transistor 312 is thus brought out of conduction. At this time, the drive signal FDG is at the L level, and the conversion efficiency switching transistor 319 is in a non-conductive state.

Accordingly, the period from time t32 to time t33 becomes a PD SIG period, and the signal level (S2) is read.

Next, in the period from time t33 to time t34, the drive signal FDG is at the H level, and the conversion efficiency switching transistor 319 is in a conductive state. As a result, there are coupled capacitance potentials of the floating diffusion region (FD) 331 and the in-pixel capacitance (FC) 317, that is, the FD (charge-voltage conversion capacitance) and the FC (in-pixel capacitance).

Accordingly, the period from time t33 to time t34 becomes an FC SIG period, and a signal level (S3) is read.

Furthermore, immediately before time t34, the drive signal RST is set to the H level, and the reset transistor 313 is thus brought into conduction to reset the charge accumulated in the floating diffusion region (FD) 331. Subsequently, the drive signal RST is set to the L level, and the reset transistor 313 is thus brought out of conduction.

Accordingly, the period from time t34 to time t35 becomes an FC RST period, and a noise level (N3) is read.

Thus, the noise levels and the signal levels are read in the following order: the noise level (N2) is read in the PD RST period, the signal level (S2) is read in the PD SIG period, the signal level (S3) is read in the FC SIG period, and the noise level (N3) is read in the FC RST period.

Then, an offset component is removed, and a true signal component is obtained as a result of taking the difference (S2−N2) between the signal level (S2) and the noise level (N2). Here, the noise level (N2) is read earlier than the signal level (S2). Therefore, correlated double sampling (CDS) is performed, so that a signal is generated. As a result, a first image (S2−N2) is obtained.

Furthermore, a true signal component is obtained as a result of taking a difference (S3−N3) between the signal level (S3) and the noise level (N3). Here, however, the signal level (S3) is read earlier than the noise level (N3). Therefore, delta data sampling (DDS) is performed, so that a signal is generated. As a result, a second image (S3−N3) is obtained.

Thus, two images of the first image (S2−N2) and the second image (S3−N3) are obtained. Therefore, it possible to generate an image with a high dynamic range and no artifact of a moving subject by combining the two images by means of an image processing circuit (for example, the DSP circuit 1002 shown in FIG. 28 or the like) provided at a subsequent stage.

Note that in a case where the in-pixel capacitance (FC) 317 is used as an accumulation node as shown in the second example of driving the pixel 300 in FIG. 13, it is also possible to adopt a configuration in which a voltage FCVDD to be applied to the counter electrode 320 of the in-pixel capacitance (FC) 317 is made variable so as to enable the voltage FCVDD to switch between the voltage for the shutter period and the readout period and the voltage for the accumulation period, as with the pixel 200 according to the second embodiment described above. As a result of the above, it is possible to reduce the electric field of the charge accumulation node of the in-pixel capacitance (FC) 317 in the accumulation period. Therefore, it is possible to prevent generation of dark current and white spots in the accumulation period.

The third embodiment has been described above.

(4) Fourth Embodiment

Next, a pixel 400 according to a fourth embodiment will be described with reference to FIGS. 14 to 19.

(Circuit Diagram Showing Pixel Configuration)

Figure 14:
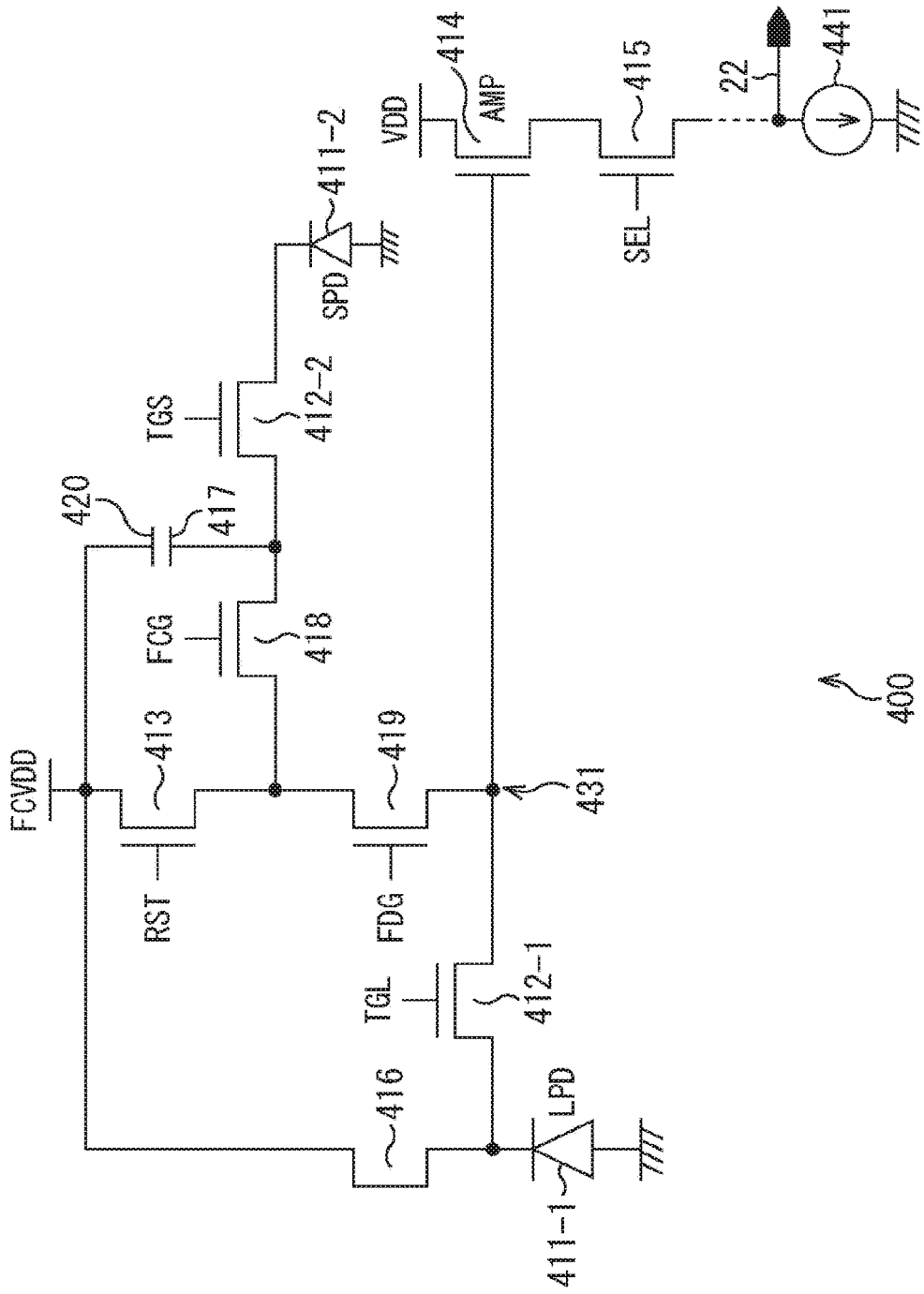
FIG. 14 is a circuit diagram showing an example of the configuration of a pixel according to a fourth embodiment.

FIG. 14 is a circuit diagram showing an example of the configuration of the pixel 400 according to the fourth embodiment.

Referring to FIG. 14, the pixel 400 includes a first photodiode (LPD) 411-1, a second photodiode (SPD) 411-2, a first transfer transistor 412-1, a second transfer transistor 412-2, a reset transistor 413, an amplifier transistor 414, a selection transistor 415, a junction transistor 416, an in-pixel capacitance (FC) 417, an FC connection transistor 418, a conversion efficiency switching transistor 419, and a floating diffusion region (FD) 431.

The first photodiode 411-1 is, for example, a photoelectric conversion element that includes a PN-junction photodiode (PD). The first photodiode 411-1 generates and accumulates a charge according to the quantity of received light.

The second photodiode 411-2 is, for example, a photoelectric conversion element that includes a PN-junction photodiode (PD). The second photodiode 411-2 generates and accumulates a charge according to the quantity of received light.

Here, comparing the first photodiode 411-1 with the second photodiode 411-2, the first photodiode 411-1 generates a larger total amount of charge (signal charge) per unit time and per unit illuminance than the second photodiode 411-2.

Accordingly, the first photodiode 411-1 has a higher sensitivity, and the second photodiode 411-2 has a lower sensitivity. Thus, it can be said that the first photodiode 411-1 is a high-sensitivity photodiode and the second photodiode 411-2 is a low-sensitivity photodiode.

The first transfer transistor 412-1 is connected to the floating diffusion region (FD) 431 and a node between the first photodiode 411-1 and the junction transistor 416 while being located between the floating diffusion region (FD) 431 and the node. A drive signal TGL is applied to the gate of the first transfer transistor 412-1. When the drive signal TGL turns to the H level, the transfer gate of the first transfer transistor 412-1 is brought into conduction. As a result, a charge accumulated in the first photodiode 411-1 is transferred to the floating diffusion region (FD) 431 via the first transfer transistor 412-1.

Note that the drain of the first transfer transistor 412-1 is connected to the source of the conversion efficiency switching transistor 419 and the gate of the amplifier transistor 414. Thus, the connection point (node) forms the floating diffusion region (FD) 431. The floating diffusion region 431 is a charge-voltage conversion unit, which converts the charge transferred thereto into voltage.

The second transfer transistor 412-2 is connected to the second photodiode 411-2 and a node between the in-pixel capacitance (FC) 417 and the FC connection transistor 418 while being located between the second photodiode 411-2 and the node. A drive signal TGS is applied to the gate of the second transfer transistor 412-2. When the drive signal TGS turns to the H level, the transfer gate of the second transfer transistor 412-2 is brought into conduction. As a result, a charge accumulated in the second photodiode 411-2 is transferred to the node between the in-pixel capacitance (FC) 417 and the FC connection transistor 418 via the second transfer transistor 412-2.

The reset transistor 413 is connected to a power source that supplies a source voltage to a counter electrode 420 of the in-pixel capacitance (FC) 417, and is also connected to a node between the FC connection transistor 418 and the conversion efficiency switching transistor 419 while being located between the power source and the node. A drive signal RST is applied to the gate of the reset transistor 413.

When the drive signal RST turns to the H level, the reset transistor 413 is brought into conduction. As a result, the potential of the floating diffusion region (FD) 431 is reset via the conversion efficiency switching transistor 419.

The amplifier transistor 414 has a gate connected to the floating diffusion region (FD) 431 and a drain connected to a power source VDD. Thus, the amplifier transistor 414 serves as an input unit of a readout circuit, that is, a so-called source follower circuit, for reading a voltage signal held in the floating diffusion region (FD) 431. In other words, the source of the amplifier transistor 414 is connected to a vertical signal line 22 (FIG. 1) via the selection transistor 415. As a result, the amplifier transistor 414 and a constant current source 441 connected to one end of the vertical signal line 22 form the source follower circuit.

The selection transistor 415 is connected to (the source of) the amplifier transistor 414 and the vertical signal line 22 while being located therebetween. A drive signal SEL is applied to the gate of the selection transistor 415. When the drive signal SEL turns to the H level, the selection transistor 115 is brought into conduction, and the pixel 400 comes into a selected state. As a result, a signal amplified by the amplifier transistor 414 is output to the vertical signal line 22 (FIG. 1) via the selection transistor 415.

The junction transistor 416 is connected to the node between the first photodiode 411-1 and the first transfer transistor 412-1, and is also connected to the power source that supplies a source voltage to the counter electrode 420 of the in-pixel capacitance (FC) 417 while being located between the node and the power source. The junction transistor 416 transfers (discharges) part of the charge accumulated in the first photodiode 411-1 to the counter electrode 420.

In other words, the junction transistor 416 functions to transfer (discharge) a charge having overflowed from the first photodiode 411-1 to the counter electrode 420 of the in-pixel capacitance (FC) 417. Thus, the junction transistor 416 corresponds to an overflow path (for example, an overflow path 455 shown in FIGS. 16 to 19) to be described later.

The in-pixel capacitance (FC) 417 is connected to the node between the second transfer transistor 412-2 and the FC connection transistor 418, and is also connected to the power source that supplies a source voltage to the counter electrode 420 while being located between the node and the power source. A high voltage corresponding to the power source or an equivalent thereof is applied to the counter electrode 420 of the in-pixel capacitance (FC) 417. The in-pixel capacitance (FC) 417 accumulates a charge transferred Cr having overflowed from the second photodiode 411-2.

The FC connection transistor 418 is connected to the node between the reset transistor 413 and the conversion efficiency switching transistor 419, and is also connected to the node between the second transfer transistor 412-2 and the in-pixel capacitance (FC) 417 while being located between the two nodes. A drive signal FCG is applied to the gate of the FC connection transistor 418. When the drive signal FCG turns to the H level, the transfer gate of the FC connection transistor 418 is brought into conduction. As a result, there are coupled capacitance potentials of the floating diffusion region (FD) 431 and the in-pixel capacitance (FC) 417, that is, the FD (charge-voltage conversion capacitance) and the FC (in-pixel capacitance).

The conversion efficiency switching transistor 419 is connected to the floating diffusion region (FD) 431 and the node between the reset transistor 413 and the FC connection transistor 418 while being located between the floating diffusion region (FD) 431 and the node. A drive signal FDG is applied to the gate of the conversion efficiency switching transistor 419. When the drive signal FDG turns to the H level, the transfer gate of the conversion efficiency switching transistor 419 is brought into conduction. As a result, there are coupled capacitance potentials of the floating diffusion region (FD) 431 and a node at the connection point of the reset transistor 413, the FC connection transistor 418, and the conversion efficiency switching transistor 419, that is, capacitance potentials of the FD (charge-voltage conversion capacitance) and the node at the connection point.

The pixel 400 is configured as described above.

(Example of Driving Pixel)

Next, an example of driving the pixel 400 according to the fourth embodiment will be described with reference to a timing chart shown in FIG. 15.

Figure 15:
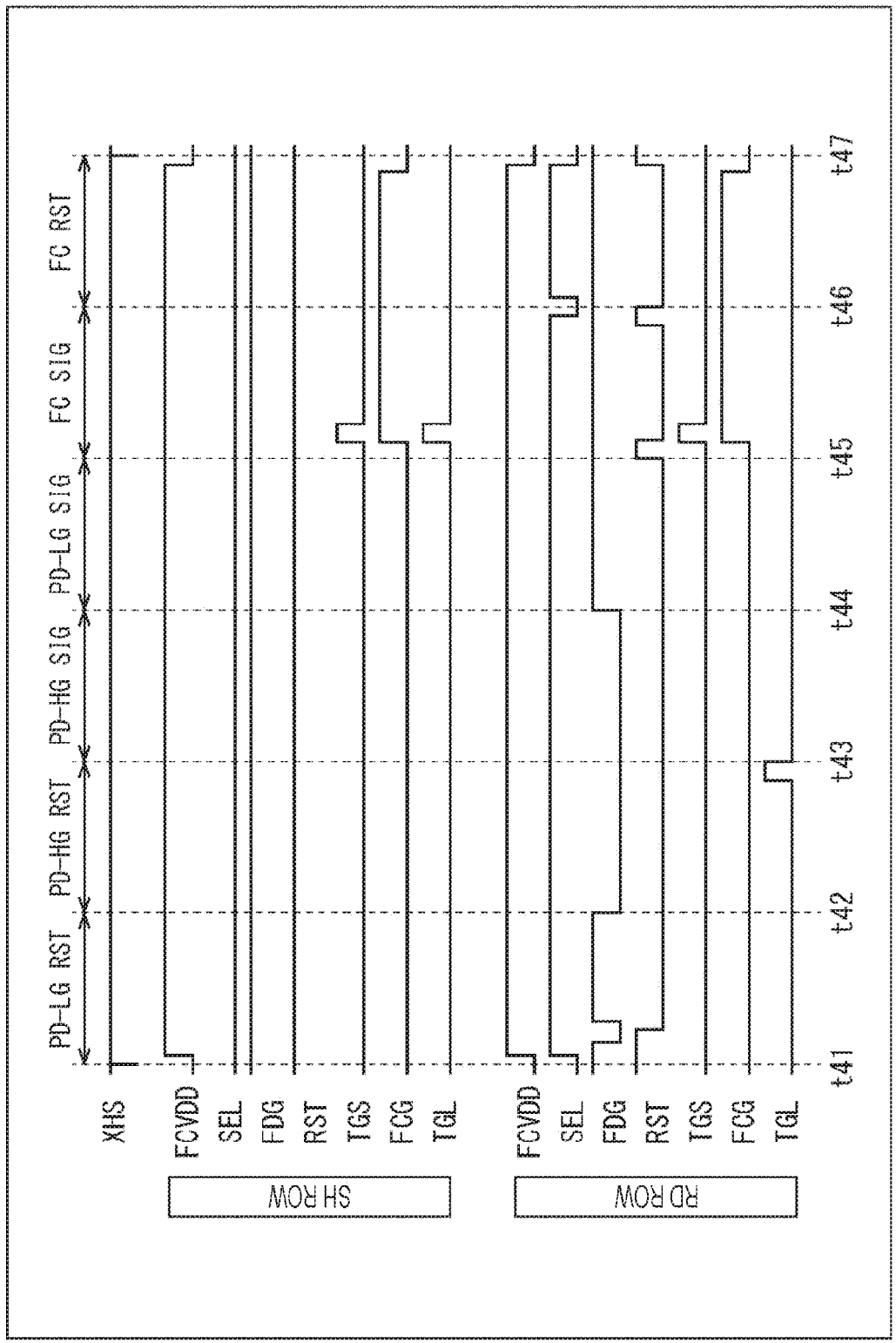
FIG. 15 is a timing chart describing an example of driving the pixel according to the fourth embodiment.

FIG. 15 shows a timing chart of a voltage FCVDD to be applied to the counter electrode 420 of the in-pixel capacitance (FC) 417, the drive signal SEL for the selection transistor 415, the drive signal FDG for the conversion efficiency switching transistor 119, the drive signal RST for the reset transistor 413, the drive signal TGS for the second transfer transistor 412-2, the drive signal FCG for the FC connection transistor 418, and the drive signal TGL for the first transfer transistor 412-1, in a shutter period (SH row) and a readout period (RD row).

The driving of the pixel 400 in a readout period will be mainly described below.

First, in a period from time t41 to time t42, the drive signal RST and the drive signal FDG are set to the H level, and the reset transistor 413 and the conversion efficiency switching transistor 419 are thus brought into conduction. As a result, a charge accumulated in the floating diffusion region (FD) 431 is reset.

Subsequently, the drive signal FDG and the drive signal RST are sequentially set to the L level in this order, so that the conversion efficiency switching transistor 419 and the reset transistor 413 are sequentially brought out of conduction. Then, the drive signal FDG is again set to the H level. As a result, the conversion efficiency switching transistor 419 is brought into conduction.

Accordingly, the period from time t41 to time t42 becomes a PD-LG RST period, and a noise level (N2) at low conversion efficiency is read.

Next, in a period from time t42 to time t43, the drive signal FDG is at the L level, and the conversion efficiency switching transistor 419 is in a non-conductive state. Accordingly, the period from time t42 to time t43 becomes a PD-HG RST period, and a noise level (N1) at high conversion efficiency is read.

Furthermore, immediately before time t43, the drive signal TGL is set to the H level, and the first transfer transistor 412-1 is thus brought into conduction. As a result, the charge accumulated in the first photodiode 411-1 having a high sensitivity is transferred to the floating diffusion region (FD) 431. Subsequently, the drive signal TGL is set to the L level, and the first transfer transistor 412-1 is thus brought out of conduction. At this time, the drive signal FDG is at the L level, and the conversion efficiency switching transistor 419 is in a non-conductive state.

Accordingly, a period from time t43 to time t44 becomes a PD-HG SIG period, and a signal level (S1) at high conversion efficiency is read.

Next, in a period from time t44 to time t45, the drive signal FDG is at the H level, and the conversion efficiency switching transistor 419 is in a conductive state. Accordingly, the period from time t44 to time t45 becomes a PD-LG SIG period, and a signal level (S2) at low conversion efficiency is read.

Here, immediately after time t45, the drive signal RST is set to the H level, and the reset transistor 413 is thus brought into conduction to reset the charge accumulated in the floating diffusion region (FD) 431 (the charge transferred from the first photodiode 411-1 having a high sensitivity).

Subsequently, the drive signal RST is set to the L level, and the reset transistor 413 is thus brought out of conduction. Then, the drive signal FCG is set to the H level, and the FC connection transistor 418 is thus brought into conduction. As a result, there are coupled capacitance potentials of the floating diffusion region (FD) 431 and the in-pixel capacitance (FC) 417, that is, the FD (charge-voltage conversion capacitance) and the FC (in-pixel capacitance).

Furthermore, at the same time, the drive signal TGS is set to the H level, and the second transfer transistor 412-2 is thus brought into conduction. As a result, the charge accumulated in the second photodiode 411-2 having a low sensitivity is transferred to the floating diffusion region (FD) 431. Subsequently, the drive signal TGS is set to the L, level, and the second transfer transistor 412-2 is thus brought out of conduction.

Accordingly, a period from time t45 to time t46 becomes an FC SIG period, and a signal level (S3) is read.

Furthermore, immediately before time t46, the drive signal RST is set to the H level, and the reset transistor 413 is thus brought into conduction to reset the charge accumulated in the floating diffusion region (FD) 431 and the in-pixel capacitance (FC) 417 (the charge transferred from the second photodiode 411-2 having a low sensitivity). Subsequently, the drive signal RST is set to the L level, and the reset transistor 413 is thus brought out of conduction.

Accordingly, a period from time t46 to time t47 becomes an FC RST period, and a noise level (N3) is read.

Thus, the noise levels and the signal levels are read in the following order: the noise level (N2) at low conversion efficiency is read in the PD-LG RST period, the noise level (N1) at high conversion efficiency is read in the PD-HG RST period, the signal level (S1) at high conversion efficiency is read in the PD-HG SIG period, the signal level (S2) at low conversion efficiency is read in the PD-LG SIG period, the signal level (S3) is read in the FC SIG period, and the noise level (N3) is read in the FC RST period.

Then, an offset component is removed, and a true signal component is obtained as a result of taking a difference (S1−N1) between the high conversion efficiency signal level (S1) and the high conversion efficiency noise level (N1). Here, correlated double sampling (CDS) is performed, so that a signal is generated. As a result, a first image (S1−N1) is obtained.

Furthermore, a true signal component is obtained as a result of taking a difference (S2−N2) between the low conversion efficiency signal level (S2) and the low conversion efficiency noise level (N2). Correlated double sampling (CDS) is performed also here, so that a signal is generated. As a result, a second image (S2−N2) is obtained.

However, the low conversion efficiency noise level (N2) and the low conversion efficiency signal level (S2) are not sequentially read. Therefore, it is necessary to temporarily hold the low conversion efficiency noise level (N2) read first in a line memory or the like, as described above.

Moreover, a true signal component is obtained as a result of taking a difference (S3−N3) between the signal level (S3) and the noise level (N3). Here, however, delta data sampling (DDS) is performed, so that a signal is generated. As a result, a third image (S3−N3) is obtained.

As a result, three images of the first image (S1−N1), the second image (S2−N2), and the third image (S3−N3) are obtained. Therefore, it is possible to generate an image with a high dynamic range and no artifact of a moving subject by combining the three images by means of an image processing circuit (for example, a DSP circuit 1002 shown in FIG. 28 or the like) provided at a subsequent stage.

(Cross-Sectional View of Pixel Structure)

Next, the structure of the pixel 400 according to the fourth embodiment will be described with reference to FIGS. 16 to 19.

(First Example of Pixel Structure)

Figure 16:
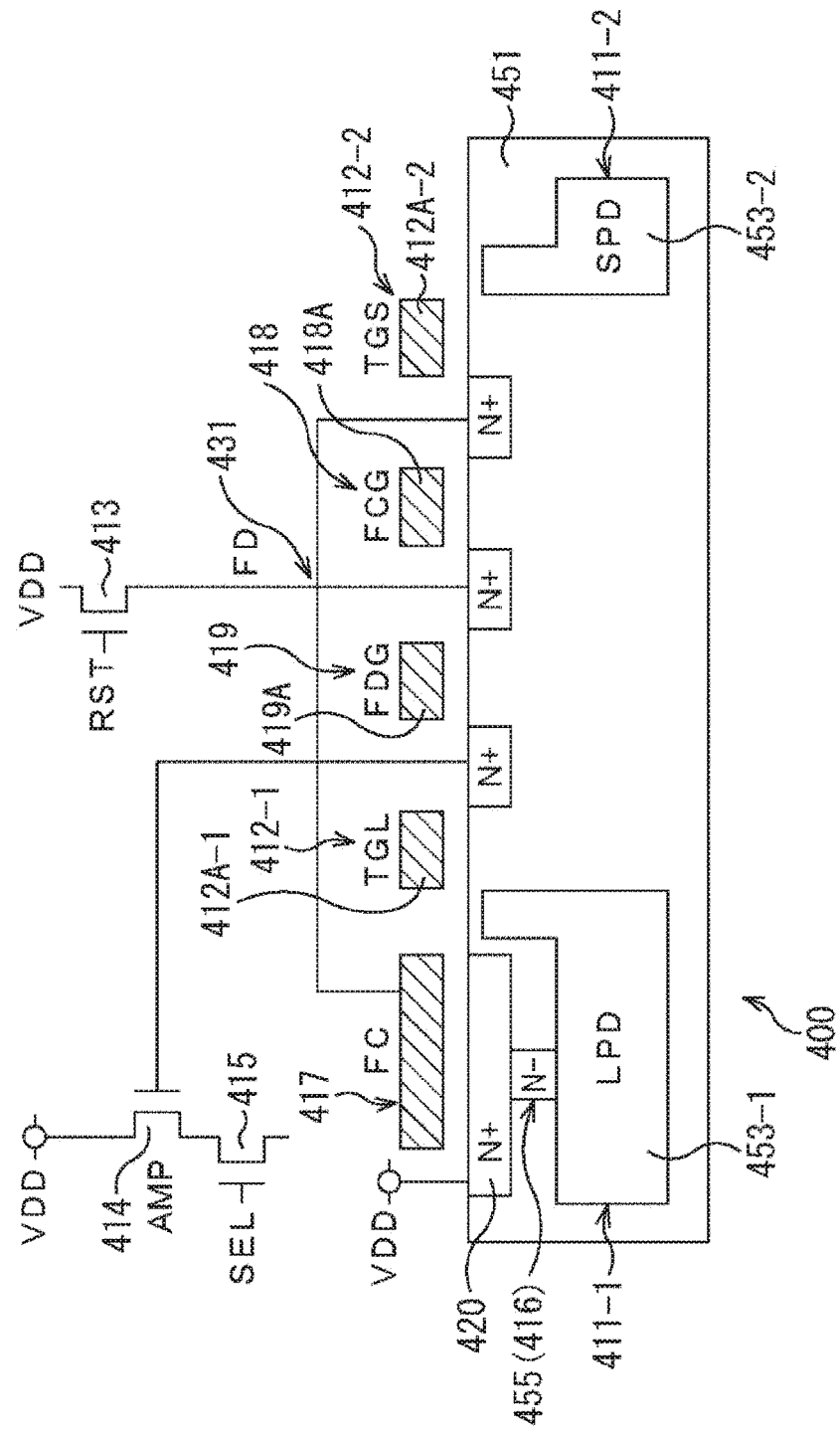
FIG. 16 is a cross-sectional view of a first example of the structure of the pixel according to the fourth embodiment.

FIG. 16 is a cross-sectional view of a first example of the structure of the pixel 400 according to the fourth embodiment.

Referring to FIG. 16, the pixel 400 includes the first photodiode 411-1 having a high sensitivity and the second photodiode 411-2 having a low sensitivity as photoelectric conversion elements in a silicon substrate. The first photodiode 411-1 and the second photodiode 411-2 are formed by, for example, the embedding of N-type layers 453-1 and 453-2 into a P-type well 451 in the silicon substrate.

The drive signal TGL is applied to a gate electrode 412A-1, and photoelectric conversion is performed by the first photodiode 411-1, so that the charge accumulated therein is transferred to the floating diffusion region (FD) 431.

The drive signal TGS is applied to a gate electrode 412A-2, and photoelectric conversion is performed by the second photodiode 411-2, so that the charge accumulated therein is transferred to the node between the in-pixel capacitance (FC) 417 and the FC connection transistor 418.

The drive signal FCG is applied to a gate electrode 418A, and the drive signal FDG is applied to a gate electrode 419A. As a result, there are coupled capacitance potentials of the floating diffusion region (FD) 431 and the in-pixel capacitance (FC) 417, that is, the FD (charge-voltage conversion capacitance) and the FC (in-pixel capacitance).

The in-pixel capacitance (FC) 417 is provided on the element surface side with respect to the first photodiode 411-1 provided in the silicon substrate. Furthermore, the counter electrode 420 of the in-pixel capacitance (FC) 417 is provided as an N-type region. (N+) in the silicon substrate. The counter electrode 420 of the in-pixel capacitance (FC) 417 is connected to the power source VDD, and is supplied with any given source voltage.

The overflow path 455 is provided as a vertical N-type region (N−) between the first photodiode 411-1 and the counter electrode 420. The overflow path 455 transfers (discharges) part of the charge accumulated in the first photodiode 411-1 to the counter electrode 420.

(Second Example of Pixel Structure)

Figure 17:
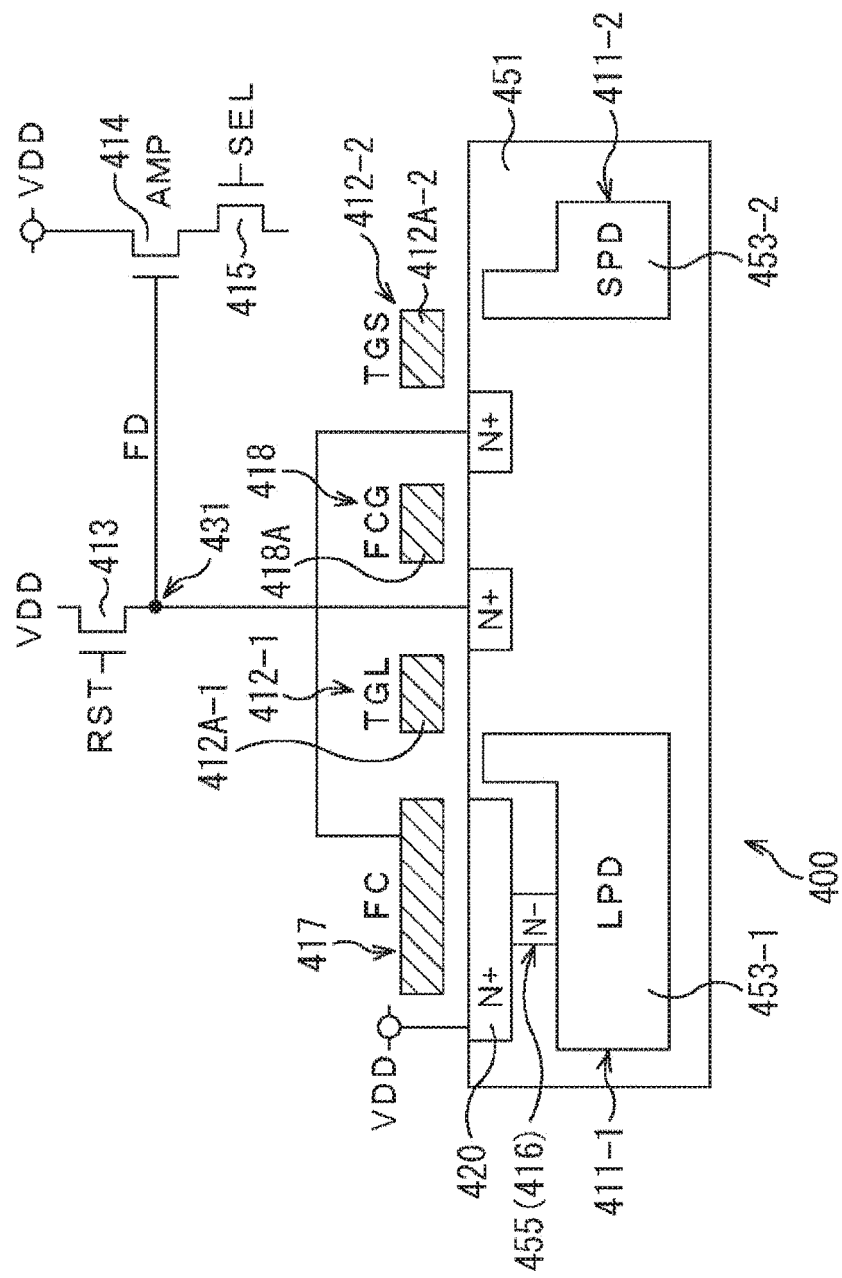
FIG. 17 is a cross-sectional view of a second example of the structure of the pixel according to the fourth embodiment.

FIG. 17 is a cross-sectional view of a second example of the structure of the pixel 400 according to the fourth embodiment.

The gate electrode 419A is not provided in the pixel 400 shown in FIG. 17. The structure of the pixel 400 shown in FIG. 17 is different from the above-described structure of the pixel 400 shown in FIG. 16 in this respect.

Even in a case where the structure of the pixel 400 shown in FIG. 17 is adopted, it is possible to provide the in-pixel capacitance (FC) 417 on the element surface side with respect to the first photodiode 411-1. In addition, it is also possible to vertically provide the overflow path 455 between the first photodiode 411-1 and the counter electrode 420 of the in-pixel capacitance (FC) 417 when the counter electrode 420 is provided in the silicon substrate.

(Third Example of Pixel Structure)

Figure 18:
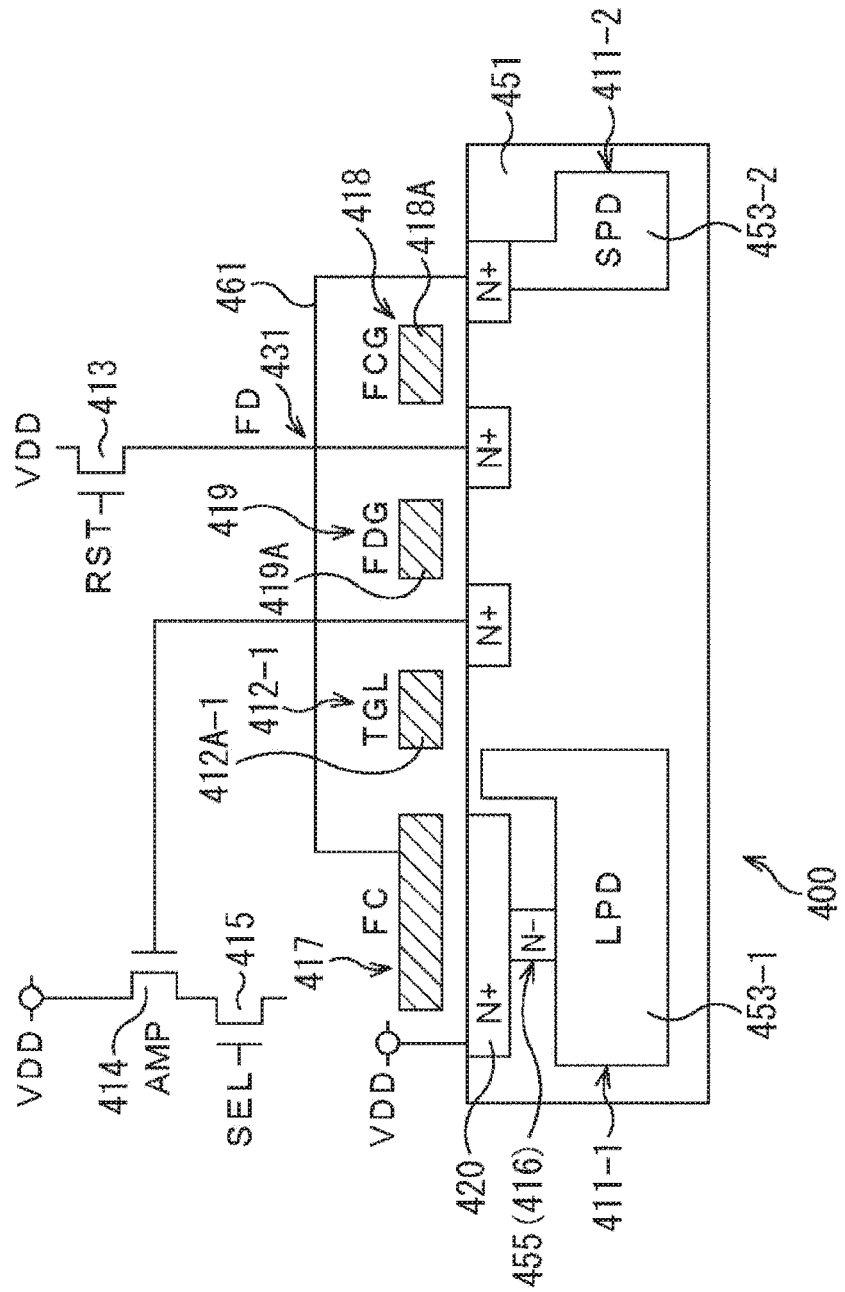
FIG. 18 is a cross-sectional view of a third example of the structure of the pixel according to the fourth embodiment.

FIG. 18 is a cross-sectional view of a third example of the structure of the pixel 400 according to the fourth embodiment.

In the pixel 400 shown in FIG. 18, the charge accumulated in the second photodiode 411-2 is transferred through a contact 461 connected to an N-type region. (N+) embedded into the P-type well 451 in association with the second photodiode 411-2, without using the gate electrode 412A-2. The structure of the pixel 400 shown in FIG. 18 is different from the above-described structure of the pixel 400 shown in FIG. 16 in this respect.

Even in a case where the structure of the pixel 400 shown in FIG. 18 is adopted, it is possible to provide the in-pixel capacitance (FC) 417 on the element surface side with respect to the first photodiode 411-1. In addition, it is also possible to vertically provide the overflow path 455 between the first photodiode 411-1 and the counter electrode 420 of the in-pixel capacitance (FC) 417 when the counter electrode 420 is provided in the silicon substrate.

(Fourth Example of Pixel Structure)

Figure 19:
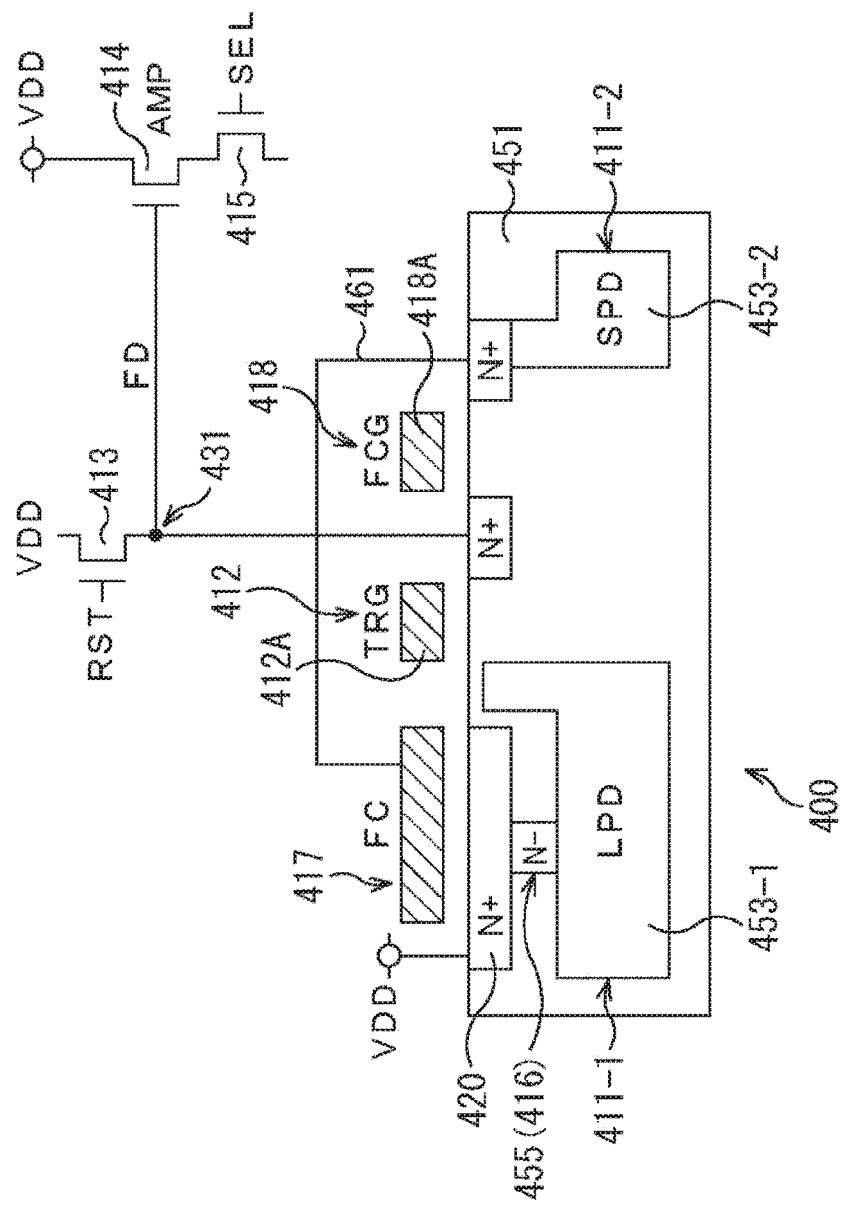
FIG. 19 is a cross-sectional view of a fourth example of the structure of the pixel according to the fourth embodiment.

FIG. 19 is a cross-sectional view of a fourth example of the structure of the pixel 400 according to the fourth embodiment.

The gate electrode 419A is not provided in the pixel 400 shown in FIG. 19. The structure of the pixel 400 shown in FIG. 19 is different from the above-described structure of the pixel 400 shown in FIG. 18 in this respect.

Even in a case where the structure of the pixel 400 shown in FIG. 19 is adopted, it is possible to provide the in-pixel capacitance (FC) 417 on the element surface side with respect to the first photodiode 411-1. In addition, it is also possible to vertically provide the overflow path 455 between the first photodiode 411-1 and the counter electrode 420 of the in-pixel capacitance (FC) 417 when the counter electrode 420 is provided in the silicon substrate.

As described above, when the in-pixel capacitance (FC) 417 is provided in the pixel 400 according to the fourth embodiment, the in-pixel capacitance (FC) 417 is provided on the element surface side. At the same time, the counter electrode 420 of the in-pixel capacitance (FC) 417 is provided in the silicon substrate.

Furthermore, in the pixel 400 according to the fourth embodiment, the overflow path 455 is directly provided in the vertical direction between the first photodiode 411-1 and the counter electrode 420. In addition, a high voltage corresponding to the power source or an equivalent thereof is applied to the counter electrode 420 of the in-pixel capacitance (FC) 417. As a result, the charge having overflowed from the first photodiode 411-1 is absorbed (discharged) by the counter electrode 420.

Therefore, it is possible to effectively prevent blooming of charge to other pixels (photodiodes). Furthermore, particularly in a case where the CMOS image sensor 10 (FIG. 1) is mounted on an onboard camera, it is possible to expand the dynamic range by effectively preventing blooming. As a result, it is possible to cope with LED flicker and an artifact of a moving subject.

The fourth embodiment has been described above.

(5) Fifth Embodiment

Incidentally, in a CMOS image sensor, a read operation for reading a charge (signal charge) accumulated in a photodiode is generally performed for each row in a pixel array portion, and when the read operation for pixels is completed, the pixels start to accumulate charge again.

As a result of performing the read operation for each row in the pixel array portion as described above, it is not possible to cause charge accumulation periods in all the pixels to coincide with each other in the CMOS image sensor. This causes a distortion of a captured image in a case where, for example, a subject is moving. For example, in a case where an image of an object which is straight in the vertical direction is captured while the object is moving in the horizontal direction, it seems as if the object is inclined in the captured image.

In order to avoid causing such a distortion in an image, an all-pixel simultaneous electronic shutter of a CMOS image sensor is under development, which enables the respective exposure periods of the pixels to be identical. Here, the all-pixel simultaneous electronic shutter functions to simultaneously start and end exposure of all pixels effective for imaging, and is also called a global shutter system. There are mechanical and electrical methods for implementing the global shutter system.

For example, a mechanical shutter is used as the mechanical method. The mechanical shutter is openable and closable, and shields the front surface of the CMOS image sensor from light. In other words, the mechanical shutter is opened to simultaneously start exposure of all pixels, and is closed to simultaneously shield all the pixels from light at the end of the exposure period, so that photodiodes of all the pixels generate charges in the same period.

Furthermore, in the electrical method, charge discharging operation for emptying accumulated charges out of the photodiodes is simultaneously performed for all the pixels to start exposure. Then, at the end of the exposure period, the transfer gates are simultaneously driven for all the pixels to transfer all the accumulated charges to floating diffusion regions (FDs), and then, the transfer gates are closed. As a result, the photodiodes of all the pixels generate charges in the same period.

However, it is difficult to remove noise in the electrical method as charges are simultaneously transferred to the floating diffusion regions (FDs) for all the pixels. As a result, image quality may be degraded in some cases. In order to prevent such a degradation of image quality, a pixel structure including a memory unit (MEM) has been proposed.

In the pixel structure including the memory unit, the charge discharging operation for emptying accumulated charges out of the photodiodes is simultaneously performed for all the pixels to start exposure, and at the end of the exposure period, the transfer gates are also simultaneously driven for all the pixels, so that all the accumulated charges are transferred to the memory units and held therein. Then, after resetting the floating diffusion regions (FDs), the charges held in the memory units are transferred to the floating diffusion regions (FDs) to read signal levels.

Thus, it is possible to reduce noise by providing the memory unit that temporarily holds the charge generated in the photodiode, separately from the floating diffusion region (FD). Note that the present applicant has already proposed a pixel structure including a memory unit. (see, for example, Patent Document 6).

Patent Document 6: Japanese Patent Application Laid-Open No. 2009-268083

Here, it is possible to effectively prevent blooming also in a CMOS image sensor that includes a memory unit (MEM) and an in-pixel capacitance (FC) and is capable of operating in the global shutter system, by providing the in-pixel capacitance (FC) on the element surface side and also providing a counter electrode of the in-pixel capacitance (FC) in a silicon substrate, as in the above-described embodiments.

Therefore, the structure of a pixel having such a structure will be described next with reference to FIG. 20.

(Cross-Sectional View of Pixel Configuration)

Figure 20:
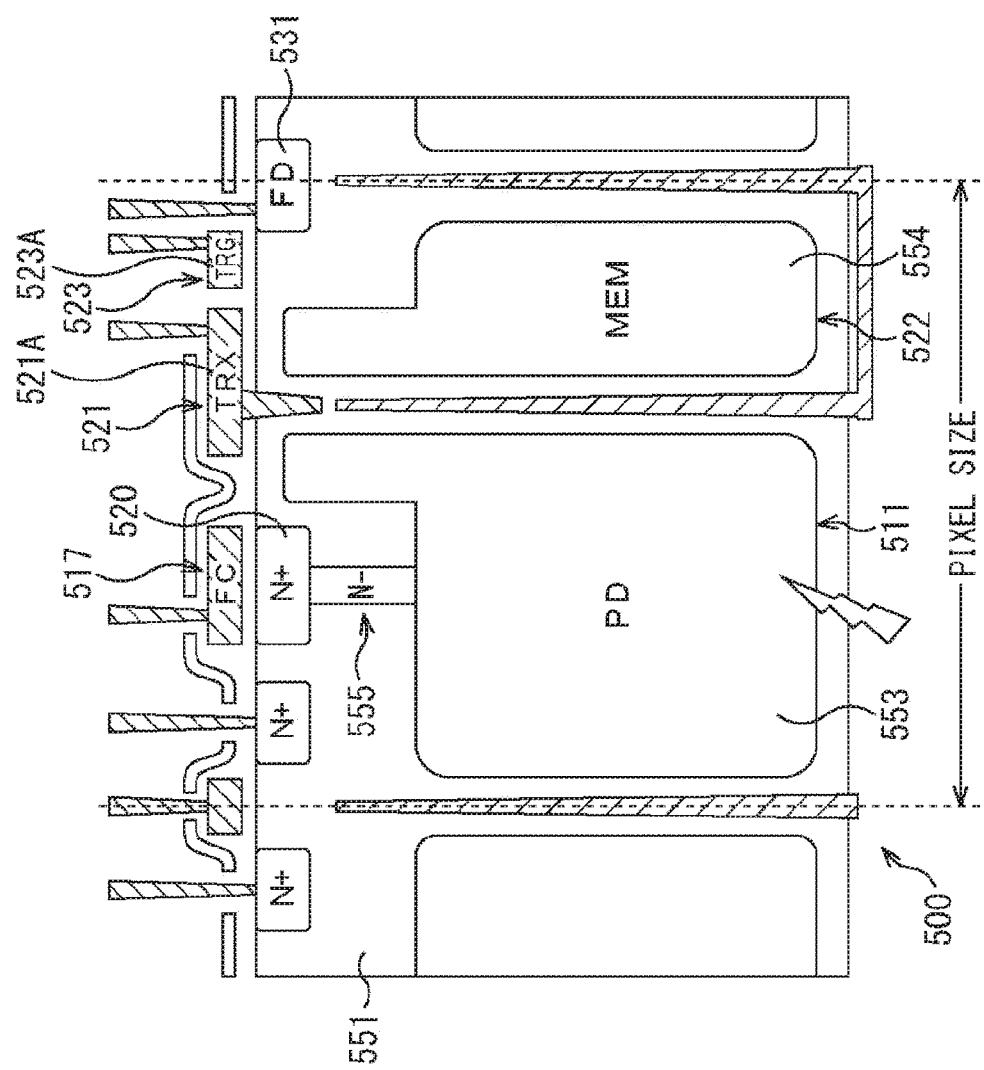
FIG. 20 is a cross-sectional view of an example of the structure of a pixel according to a fifth embodiment.

FIG. 20 is a cross-sectional view of an example of the structure of a pixel 500 according to a fifth embodiment.

Referring to FIG. 20, the pixel 500 includes a photodiode 511 as a photoelectric conversion element in a silicon substrate. The photodiode 511 is formed by, for example, the embedding of an N-type layer 553 into a P-type well 551 in the silicon substrate.

A first transfer gate 521 transfers a charge accumulated in the photodiode 511 to a memory unit 522 according to a drive signal TRX applied to a gate electrode 521A.

The memory unit 522 is, for example, a charge holding unit that includes an N-type buried channel and the like formed below the gate electrode 521A. The memory unit 522 holds the charge transferred from the photodiode 511 through the first transfer gate 521.

A second transfer gate 523 transfers the charge held in the memory unit 522 to a floating diffusion region (FD) 531 according to a drive signal TRG applied to a gate electrode 523A.

The floating diffusion region (FD) 531 is a charge-voltage conversion unit that includes an N-type region (N+), and converts, into voltage, the charge transferred from the memory unit 522 through the second transfer gate 523.

Note that although not shown, the pixel 500 includes a reset transistor, an amplifier transistor, a selection transistor, a junction transistor, an FC connection transistor, and a conversion efficiency switching transistor, as in the pixel 100 and the like described above. However, description thereof will be omitted.

An in-pixel capacitance (FC) 517 is provided on the element surface side with respect to the photodiode 511 provided in the silicon substrate. Furthermore, a counter electrode 520 of the in-pixel capacitance (FC) 517 is provided as an N-type region (N+) in the silicon substrate. The counter electrode 520 of the in-pixel capacitance (FC) 517 is connected to a power source, and is supplied with any given source voltage.

Furthermore, the pixel 500 may also be configured such that an overflow path is provided to transfer part of the charge accumulated in the photodiode 511, as with the pixel 100, the pixel 300, and the like described above.

In other words, an overflow path 555 is provided as a vertical N-type region (N−) between the photodiode 511 and the counter electrode 520 in FIG. 20. Note that the overflow path may also be provided as a vertical N-type region between the photodiode 511 and the in-pixel capacitance (FC) 517 such that the overflow path is adjacent to the counter electrode 520 provided in the silicon substrate.

As described above, when the in-pixel capacitance (FC) 517 is provided in the pixel 500 according to the fifth embodiment, the in-pixel capacitance (FC) 517 is provided on the element surface side. At the same time, the counter electrode 520 of the in-pixel capacitance (FC) 517 is provided in the silicon substrate.

Note that the pixel 500 according to the fifth embodiment can be configured as follows. The overflow path 555 is directly provided in the vertical direction between the photodiode 511 and the counter electrode 520. In addition, a high voltage corresponding to the power source or an equivalent thereof is applied to the counter electrode 520. As a result, a charge having overflowed from the photodiode 511 is absorbed (discharged) by the counter electrode 520.

Furthermore, the pixel 500 according to the fifth embodiment can also be configured as follows. The overflow path is vertically provided between the photodiode 511 and the in-pixel capacitance (FC) 517 such that the overflow path is adjacent to the counter electrode 520 provided in the silicon substrate. In addition, a high voltage corresponding to the power source or an equivalent thereof is applied to the counter electrode 520. As a result, the charge having overflowed from the photodiode 511 and the in-pixel capacitance (FC) 517 is absorbed (discharged) by the counter electrode 520.

Therefore, it is possible to effectively prevent blooming of charge to other pixels (photodiodes). Furthermore, particularly in a case where the CMOS image sensor 10 (FIG. 1) is mounted on an onboard camera, it is possible to expand the dynamic range by effectively preventing blooming. As a result, it is possible to cope with LED flicker and an artifact of a moving subject.

The fifth embodiment has been described above.

(6) Sixth Embodiment

Incidentally, a dynamic range of approximately 120 dB is required to simultaneously image a dark place and a place exposed to direct sunlight, and to recognize objects existing there. However, it is extremely difficult to achieve such a high dynamic range with the current solid-state imaging element.

The dynamic range depends on the amount of charge that can be accumulated in a pixel. In order to increase the amount of charge, it is necessary to increase a pixel area or to increase the amount of accumulated charge per unit area.

In order to achieve the former, that is, an area increase, it is necessary to increase the aperture of an optical system or to reduce the number of pixels. This may cause problems such as an increase in cost and a decrease in image quality. Meanwhile, in order to achieve the latter, that is, an increase in the amount of accumulated charge per unit area, it is possible to adopt a structure that includes a junction capacitance of a photodiode (PD) and a MOS capacitance. However, such a structure also has limitations.

Here, a conventional pixel 900 will be described with reference to FIGS. 21 to 23.

(Conventional Pixel Structure)

Figure 21:
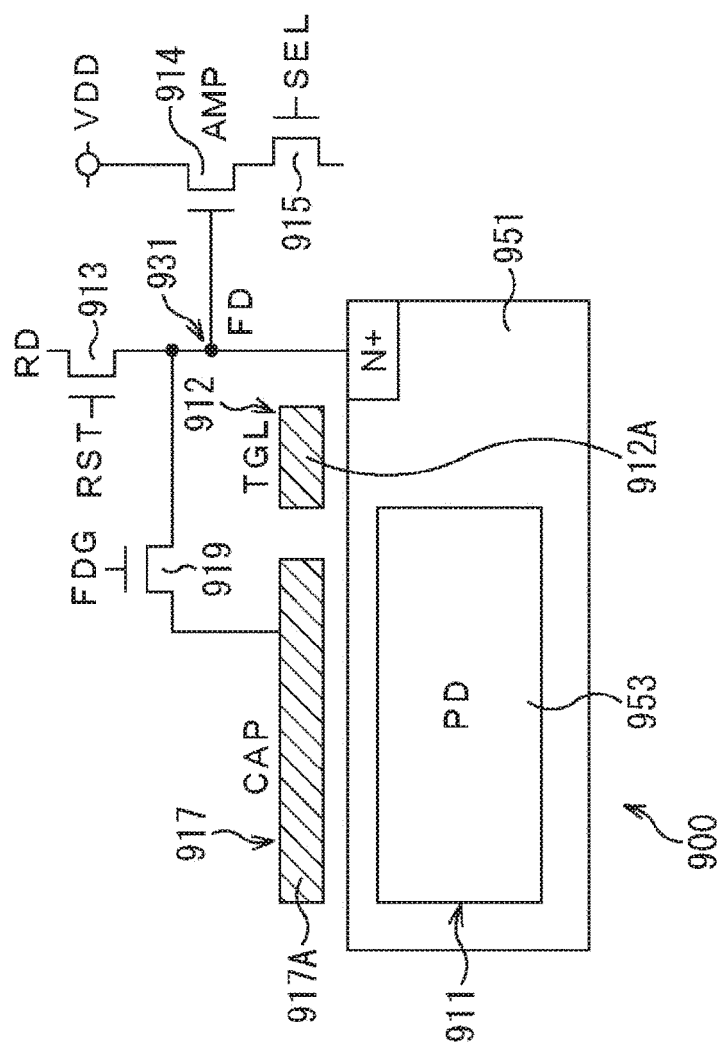
FIG. 21 is a cross-sectional view of the structure of a conventional pixel.

FIG. 21 is a cross-sectional view of the structure of the conventional pixel 900. Note that the lower surface of the cross section shown in FIG. 21 is a light incident surface, and light is incident from the lower side in the drawing.

The pixel 900 includes a MOS capacitance 917 (capacitance electrode 917A) as a capacitance for switching conversion efficiency, provided on a buried photodiode 911.

The pixel 900 includes the photodiode 911, a transfer transistor 912, a reset transistor 913, an amplifier transistor 914, a selection transistor 915, the MOS capacitance 917, a conversion efficiency switching transistor 919, and a floating diffusion region (FD) 931.

The MOS capacitance 917 is an electrode (capacitance electrode 917A) provided on the buried photodiode 911 and connected to the conversion efficiency switching transistor 919. The conversion efficiency switching transistor 919 is a switch for switching conversion efficiency. The conversion efficiency switching transistor 919 performs on/off operation according to a drive signal FDG applied to its gate, and switches the capacitance of the floating diffusion region (FD) 931. As a result, it is possible to switch between low conversion efficiency and high conversion efficiency according to, for example, the illuminance of a subject.

(Driving of Conventional Pixel)

Figure 22:
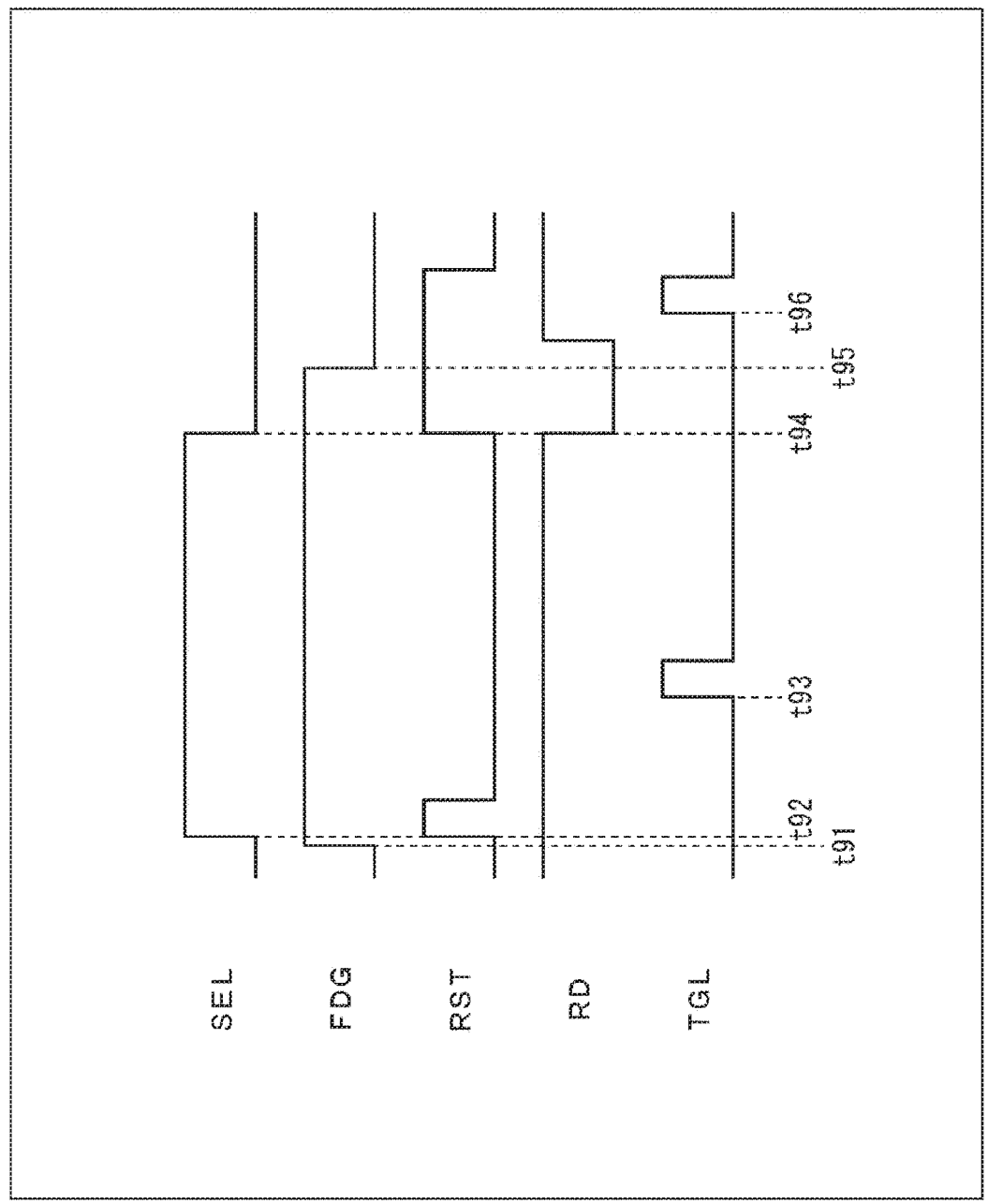
FIG. 22 is a timing chart describing the driving of the conventional pixel.

FIG. 22 is a timing chart describing the driving of the conventional pixel 900.

FIG. 22 shows a timing chart of a drive signal SEL for the selection transistor 915, the drive signal FDG for the conversion efficiency switching transistor 919, a drive signal RST for the reset transistor 913, a reset drain (RD) for the reset transistor 913, and a drive signal TGL for the transfer transistor 912.

The timing chart of FIG. 22 shows an example of driving the pixel 900 in the case of low conversion efficiency. In other words, at time t91, the drive signal FDG is set to the H level, and the MOS capacitance 917 is connected to the floating diffusion region (FD) 931. As a result, the capacitance of the floating diffusion region (FD) 931 increases, and conversion efficiency decreases.

At time t92, the drive signal SEL and the drive signal RST are set to the H level. As a result, the relevant pixel 900 comes into a selected state. In addition, the potential of the floating diffusion region (FD) 931 is reset to the H level of the reset drain (RD). This enables a reset level to be read.

At time t93, the drive signal TGL is set to the H level, and a charge accumulated in the photodiode 911 is transferred to the floating diffusion region (FD) 931 via the transfer transistor 912. This enables a signal level to be read. Then, correlated double sampling (CDS) is performed by use of the reset level and the signal level, so that a signal is generated.

Thereafter, at time t94, the drive signal SEL is set to the L level, and the relevant pixel 900 comes into an unselected state. Furthermore, at time t94, the drive signal RST is set to the H level again, and the reset transistor 913 is thus brought into conduction. In this state, the reset drain (RD) is set to the L level. As a result, the potential of the capacitance electrode 917A can be set to the L level.

Moreover, in this state, the drive signal FDG is set to the L level at time t95, and the conversion efficiency switching transistor 919 is thus brought out of conduction. As a result, the potential of the capacitance electrode 917A in an exposure period can be maintained at the L level. Then, after the reset drain (RD) is returned to the H level, the drive signal TGL is set to the H level at time t96, and the transfer transistor 912 is thus brought into conduction. As a result, it is possible to prevent injection of charge (backflow of charge) from the floating diffusion region (FD) 931 into the photodiode 911.

Figure 23:
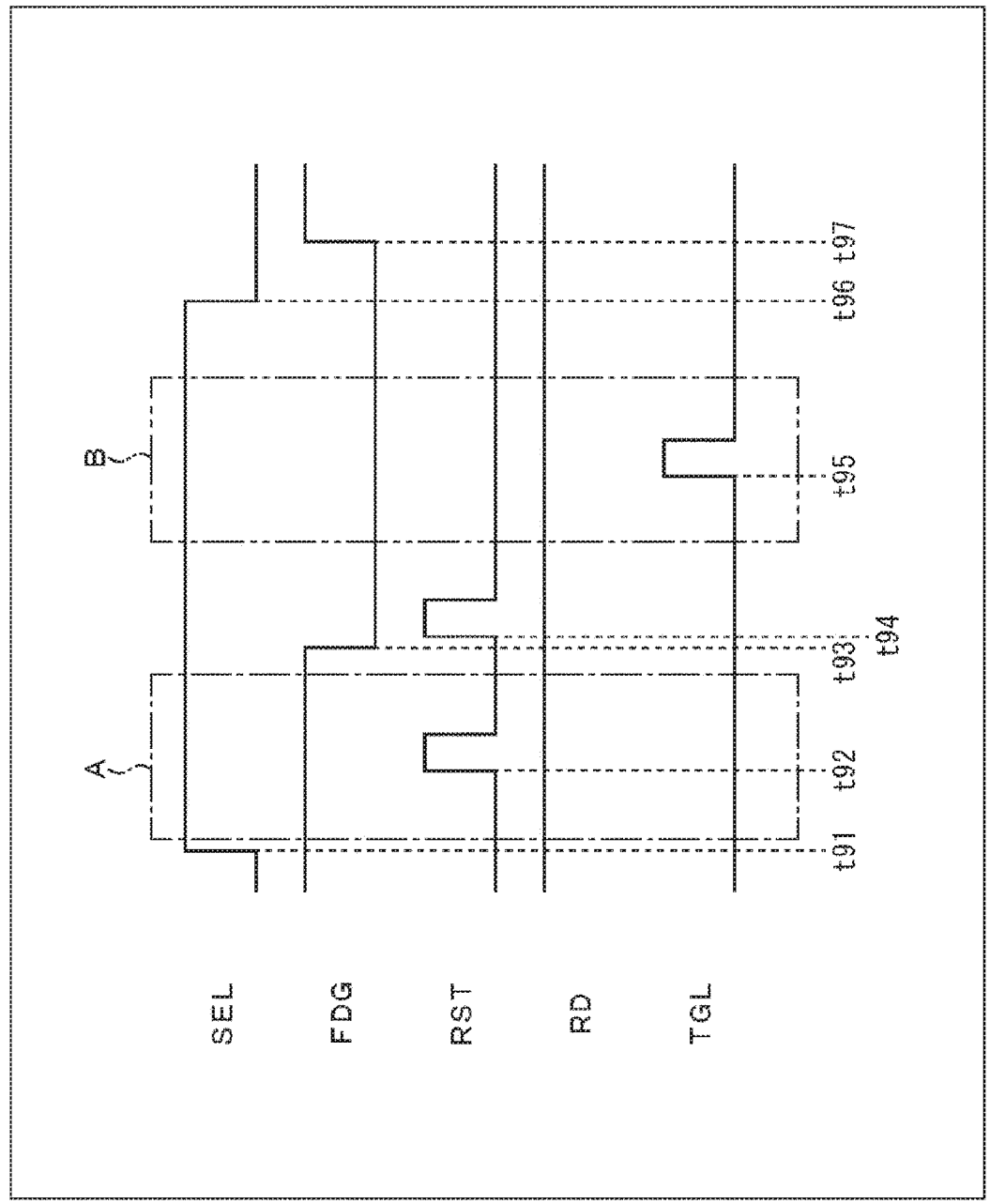
FIG. 23 is a timing chart describing another way of driving the conventional pixel.

FIG. 23 is a timing chart describing another way of driving the conventional pixel 900.

Note that FIG. 23 shows a timing chart of the drive signal SEL, the drive signal FDG, the drive signal RST, the reset drain (RD), and the drive signal TGL, as in FIG. 22. Furthermore, in FIG. 23, a section corresponding to high luminance time is represented as high luminance section A surrounded by an alternate long and short dash line in the drawing, and a section corresponding to low luminance time is represented as low luminance section B surrounded by a dashed-two dotted line in the drawing.

In a period from time t91 to time t96, the drive signal SEL is at the H level, and the relevant pixel 900 is in a selected state. Note that at time t91, the drive signal FDG is kept constant at the H level, and the MOS capacitance 917 is connected to the floating diffusion region (FD) 931. As a result, conversion efficiency is at a reduced level. Furthermore, at this time, a charge having overflowed from the photodiode 911 into the floating diffusion region (FD) 931 is read first in the exposure period, so that a signal level at low conversion efficiency can be read.

At time t92, the drive signal RST is set to the H level, and the potential of the floating diffusion region (FD) 931 is reset to the H level of the reset drain (RD). This enables a noise level (reset level) at low conversion efficiency to be read.

As described above, in high luminance section A, a large amount of charge generated in the photodiode 911 during the exposure period moves beyond the potential below a gate electrode 912A, and is accumulated in the floating diffusion region (FD) 931 and a capacitance including the MOS capacitance 917. Then, an FD potential generated by the charge accumulation is input to the amplifier transistor 914, and a signal corresponding thereto is output to a vertical signal line 22 (FIG. 1) via the selection transistor 915.

Thereafter, in a period from time t93 to time t97, the drive signal FDG is at the L level, and the floating diffusion region (FD) 931 is not connected to the MOS capacitance 917. As a result, conversion efficiency is at an increased level. Furthermore, at time t94, the drive signal RST is set to the H level, and the potential of the floating diffusion region. (FD) 931 is reset to the H level of the reset drain (RD). This enables a noise level at high conversion efficiency to be read.

At time t95, the drive signal TGL is set to the H level, and the charge accumulated in the photodiode 911 is transferred to the floating diffusion region (FD) 931 via the transfer transistor 912. This enables a signal level at high conversion efficiency to be read.

As described above, in low luminance section B, the charge accumulated in the photodiode 911 during the exposure period is transferred through the transfer transistor 912 to the floating diffusion region (FD) 931, and is accumulated therein. Then, an FD potential generated by the charge accumulation is input to the amplifier transistor 914, and a signal corresponding thereto is output to the vertical signal line 22 (FIG. 1) via the selection transistor 915.

As described above, in the conventional pixel 900, the charge having overflowed into the floating diffusion region (FD) 931 is read first in the exposure period as a result of performing the driving for dynamic range expansion operation shown in FIG. 23. Thus, a high luminance signal is obtained. Meanwhile, the charge accumulated in the photodiode 911 is subsequently read to obtain a low luminance signal. Thus, expansion of a dynamic range is achieved.

Meanwhile, a structure in which the MOS capacitance 917 is provided for the photodiode 911 has been adopted in the conventional pixel 900. However, the structure has limitations in increasing the amount of accumulated charge per unit area. Therefore, the technology (present technology) according to the present disclosure enables the amount of accumulated charge per unit area to be further increased by adopting a layered structure of a photodiode and a MOS capacitance.

A pixel 600 according to a sixth embodiment will be described below with reference to FIGS. 24 and 25.

(Example of Pixel Structure)

Figure 24:
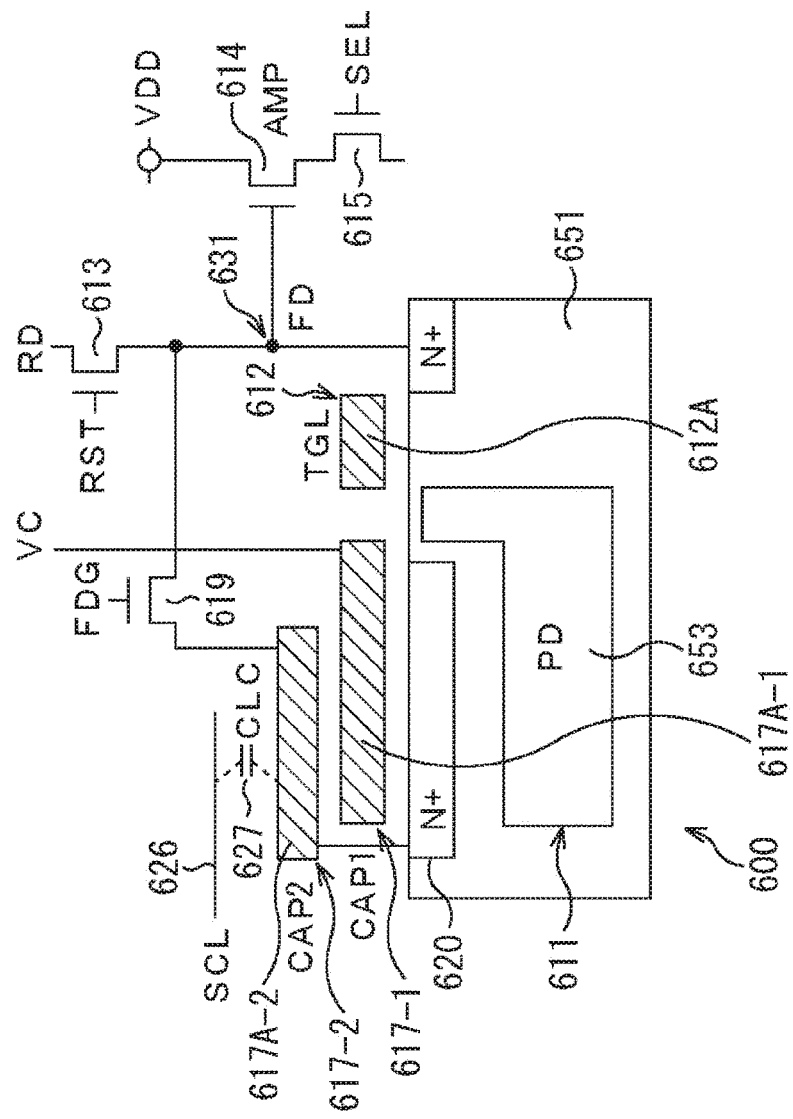
FIG. 24 is a cross-sectional view of an example of the structure of a pixel according to a sixth embodiment.

FIG. 24 is a cross-sectional view of an example of the structure of the pixel 600 according to the sixth embodiment. Note that the lower surface of the cross section shown in FIG. 24 is a light incident surface, and light is incident from the lower side in the drawing.

Referring to FIG. 24, the pixel 600 includes a photodiode 611 as a photoelectric conversion element in a silicon substrate. The photodiode 611 formed by, for example, the embedding of an N-type layer 653 into a P-type well 651 in the silicon substrate. The photodiode 611 generates and accumulates a charge according to the quantity of received light.

A drive signal TGL is applied to a gate electrode 612A, and photoelectric conversion is performed by the photodiode 611, so that the charge accumulated therein is transferred to a floating diffusion region (FD) 631. The floating diffusion region (ED) 631 is a charge-voltage conversion unit, which converts the charge transferred thereto into voltage.

A drive signal RST is applied to the gate of a reset transistor 613. When the drive signal RST turns to the H level, the reset transistor 613 is brought into conduction, so that the potential of the floating diffusion region (FD) 631 is reset to a level corresponding to a reset drain (RD).

An amplifier transistor 614 has a gate connected to the floating diffusion region (FD) 631 and a drain connected to a power source VDD. Thus, the amplifier transistor 614 serves as an input unit of a readout circuit for reading a voltage signal held in the floating diffusion region (FD) 631. In other words, the source of the amplifier transistor 614 is connected to a vertical signal line 22 (FIG. 1) via a selection transistor 615. As a result, the amplifier transistor 614 and a constant current source connected to one end of the vertical signal line 22 form a source follower circuit.

The selection transistor 615 is connected to the amplifier transistor 614 and the vertical signal line 22 while being located therebetween. A drive signal SEL is applied to the gate of the selection transistor 615. When the drive signal SEL turns to the H level, the selection transistor 615 is brought into conduction, and the pixel 600 comes into a selected state. As a result, a signal amplified by the amplifier transistor 614 output to the vertical signal line 22 (FIG. 1) via the selection transistor 615.

Here, the pixel 600 includes a first capacitance electrode 617A-1 provided on the element surface side with respect to the photodiode 611 provided in the silicon substrate. The first capacitance electrode 617A-1 is connected to a potential fixing portion (VC) for fixing a potential at one end of the capacitance. Note that, for example, polycrystalline silicon (poly-Si), platinum silicide (ptSi), nickel silicide (NiSi), or the like can be used as the material for the first capacitance electrode 617A-1.

Furthermore, in the pixel 600, an insulating film and a second capacitance electrode 617A-2 are stacked in layers on the first capacitance electrode 617A-1. Here, the second capacitance electrode 617A-2 is connected to a diffusion layer 620 included in a first MOS capacitance 617-1, so that the first MOS capacitance 617-1 (CAP1) and a second MOS capacitance 617-2 (CAP2) are connected in parallel. Note that the diffusion layer 620 is provided as an N-type region (N+) in the silicon substrate, and corresponds to counter electrodes in the above-described embodiments (the counter electrode of the first capacitance electrode 617A-1).

The second capacitance electrode 617A-2 is connected to the floating diffusion region (FD) 631 via a conversion efficiency switching transistor 619. The conversion efficiency switching transistor 619 as a switch for switching conversion efficiency. The conversion efficiency switching transistor 619 performs on/off operation according to a drive signal FDG applied to its gate, and switches the capacitance of the floating diffusion region (FD) 631. As a result, it is possible to switch between low conversion efficiency and high conversion efficiency according to, for example, the illuminance of a subject.

In the pixel 600, an SCL line 626 including a signal line is disposed at an upper level relative to the second capacitance electrode 617A-2, and is connected to a pulse drive circuit (for example, a pulse drive circuit configured as part of a vertical drive circuit 12 (FIG. 1)). The second capacitance electrode 617A-2 and the SCL line 626 are capacitively coupled by a CLC capacitance 627.

Note that examples of substances that can be used as the material for the second capacitance electrode 617A-2 include polycrystalline silicon (poly-Si), tungsten (W), titanium (Ti), tantalum (Ta), aluminum (Al), copper (Cu), compounds including these substances as primary constituents, and a laminated film including a combination thereof.

Thus, as a result of forming the second capacitance electrode 617A-2 with metal or a compound including metal, visible light and near-infrared light incident from the back surface side (light incident surface side) are reflected with high reflectance. Accordingly, it is possible to extend an optical path length in silicon and thus improve the quantum efficiency of the photodiode 611. Note that the second capacitance electrode 617A-2 ran also be formed in the same step as a light shielding film and local wiring (intra-pixel wiring).

As described above, the pixel 600 includes the capacitances (CAP1 and CAP2) provided on a side (element surface side) opposite to the light incident surface of the photodiode 611 provided in a semiconductor substrate. The capacitances (CAP1 and CAP2) respectively include the first capacitance electrode 617A-1 as a first conductive layer and the second capacitance electrode 617A-2 as a second conductive layer. As a result, the charge generated by the photodiode 611 can be accumulated in the floating diffusion region (FD) 631 and a capacitance including the first MOS capacitance 617-1 and the second MOS capacitance 617-2, so that the amount of accumulated charge per unit area can be increased.

(Example of Driving Pixel)

Next, an example of driving the pixel 600 according to the sixth embodiment will be described with reference to a timing chart of FIG. 25.

Figure 25:
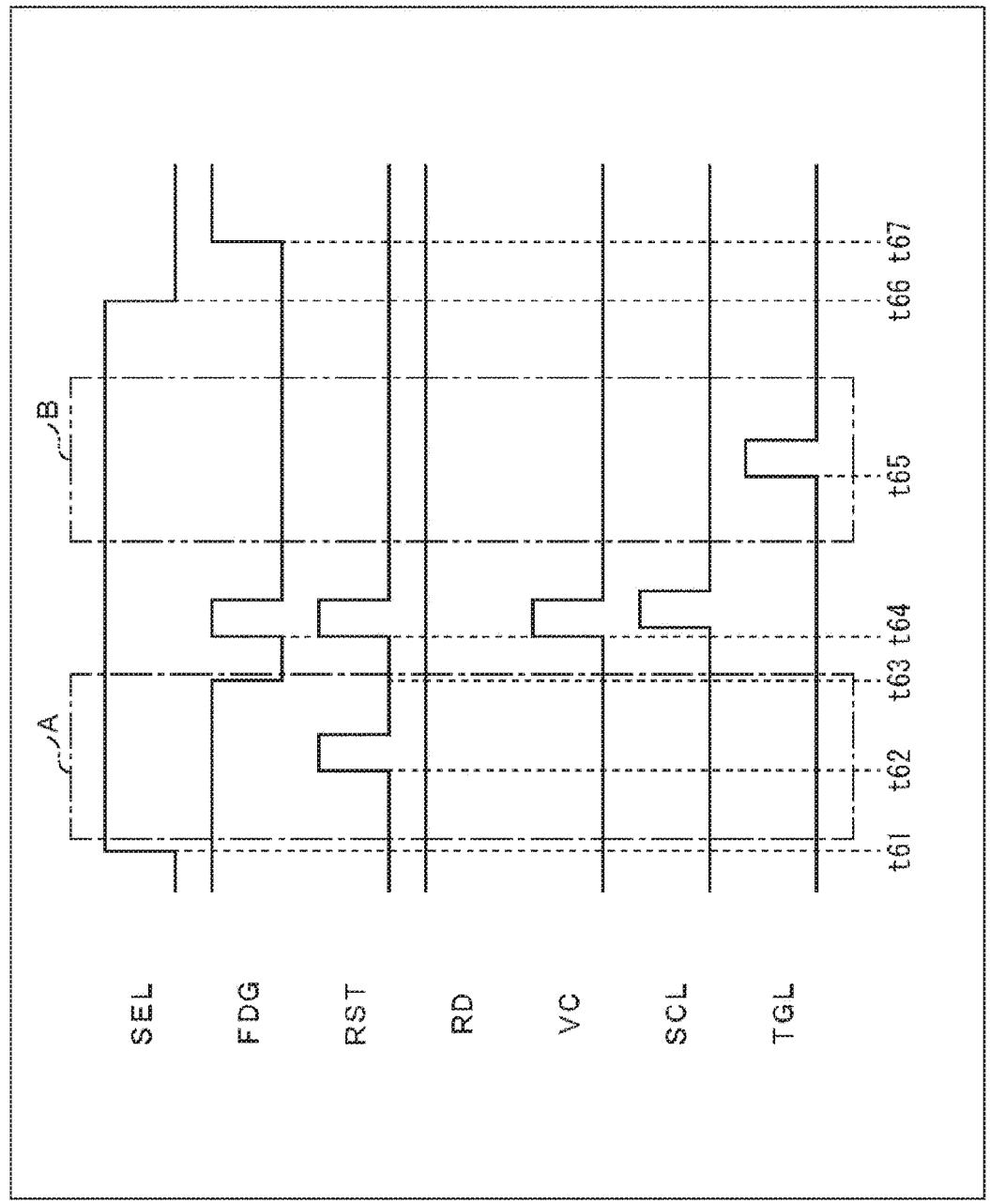
FIG. 25 is a timing chart describing an example of driving the pixel according to the sixth embodiment.

FIG. 25 shows a timing chart of the drive signal SEL for the selection transistor 615, the drive signal FDG for the conversion efficiency switching transistor 619, the drive signal RST for the reset transistor 613, the reset drain (RD) of the reset transistor 613, a potential VC at one end of the first capacitance electrode 617A-1, a pulse signal SCL to be applied to the SCL line 626, and the drive signal TGL for a transfer transistor 612.

Furthermore, also in FIG. 25, a section corresponding to high luminance time is represented as high luminance section A surrounded by an alternate long and short dash line in the drawing, and a section corresponding to low luminance time is represented as low luminance section B surrounded by a dashed-two dotted line in the drawing, as in FIG. 23 described above.

In a period from time t61 to time t66, the drive signal SEL is at the H level, and the relevant pixel 600 is in a selected state. Note that at time t61, the drive signal FDG is kept constant at the H level, and the second MOS capacitance 617-2 is connected to the floating diffusion region (FD) 631. As a result, conversion efficiency is at a reduced level. Furthermore, at this time, a charge having overflowed from the photodiode 611 into the floating diffusion region (FD) 631 is read first in an exposure period, so that a signal level at low conversion efficiency can be read.

At time t62, the drive signal RST is set to the H level, and the potential of the floating diffusion region (FD) 631 is reset to the H level. This enables a noise level (reset level) at low conversion efficiency to be read.

As described above, in high luminance section A, a large amount of charge generated in the photodiode 611 in the exposure period moves beyond the potential below the gate electrode 612A, and is accumulated in the floating diffusion region (FD) 631 and the capacitance including the first MOS capacitance 617-1 and the second MOS capacitance 617-2. Then, an FD potential generated by the charge accumulation is input to the amplifier transistor 614, and a signal corresponding thereto is output to the vertical signal line 22 (FIG. 1) via the selection transistor 615.

Thereafter, at time t63, the drive signal FDG is set to the L level, and the floating diffusion region (FD) 631 is thus disconnected from the MOS capacitances 617. As a result, conversion efficiency is increased.

Furthermore, at time t64, the drive signal RST and the drive signal FDG are set to the H level, so that the charges accumulated in the floating diffusion region (FD) 631, the first MOS capacitance 617-1, and the second MOS capacitance 617-2 are reset.

At this time, as the drive signal FDG turns to the H level, the conversion efficiency switching transistor 619 is brought into conduction. As a result, a pulse signal is provided to the SCL line 626, so that the pulse signal SCL is set to the H level. Furthermore, as time t64, the potential VC is also set to the H level. This enables the FD potential to be raised and stabilized at the time of reading, so that an increase in the FD potential can be secured. In this manner, a noise level at high conversion efficiency can be read.

Then, at time t65, the drive signal TGL is set to the H level, and the charge accumulated in the photodiode 611 is transferred to the floating diffusion region (FD) 631 via the transfer transistor 612. This enables a signal level at high conversion efficiency to be read.

As described above, in low luminance section B, the charge accumulated in the photodiode 611 during the exposure period is transferred through the transfer transistor 612 to the floating diffusion region (FD) 631, and is accumulated therein. Then, an FD potential generated by the charge accumulation is input to the amplifier transistor 614, and a signal corresponding thereto is output to the vertical signal line 22 (FIG. 1) via the selection transistor 615.

As described above, in the pixel 600 according to the sixth embodiment, the charge having overflowed into the floating diffusion region (FD) 631 is read first in the exposure period as a result of performing the driving for dynamic range expansion operation shown in FIG. 25. Thus, a high luminance signal is obtained. Meanwhile, the charge accumulated in the photodiode 611 is subsequently read to obtain a low luminance signal. Thus, expansion of a dynamic range is achieved.

In this case, the pixel 600 includes the capacitances (CAP1 and CAP2), that is, the first MOS capacitance 617-1 and the second MOS capacitance 617-2 stacked on the element surface side with respect to the photodiode 611 provided in the silicon substrate. As a result, compared to the conventional pixel 900, the pixel 600 can increase the amount of accumulated charge per unit area.

Furthermore, when the pixel 600 is driven, the boosting potential of the floating diffusion region (FD) 631 is reduced by the on-resistance of the reset transistor 613 and the resistance of a line connecting the reset drain (RD) to the power source. Here, however, it is possible to prevent a decrease in the boosting potential of the floating diffusion region (FD) 631 (to promote an increase in the FD potential) by causing the SCL line 626, which is capacitively coupled to the second MOS capacitance 617-2, to be pulse-driven.

In other words, the boosting of the floating diffusion region (FD) 631 can be accelerated by a change in the potential of the SCL line 626 including a signal line. As a result, it is possible to prevent, for example, image roughness due to a decrease in the ED potential at the time of driving the pixel 600 and a degradation in image quality due to shading. It is thus possible to achieve improvement in image quality as well as expansion of the dynamic range.

Moreover, with the above-described structure, the pixel 600 can simultaneously achieve each or at least two or more of the following: improvement of the dynamic range, prevention of the blinking of LEDs (traffic signals, traffic signs, display devices of automobiles, and the like) different from visual recognition, and an increase of the number of pixels due to a pixel pitch reduction and miniaturization of cameras.

Note that it is also possible to obtain an image with a high dynamic range by combining a plurality of images with different shutter times by use of the current solid-state imaging element. However, there is a possibility that a distortion and false color of the image may become problems in a case where, for example, the subject is a moving object.

Moreover, it is visually recognized that light emitting diodes (LEDs), which are light sources such as traffic signals, traffic signs, and display devices of automobiles, continue to be on. However, the current solid-state imaging element obtains images of such LEDs turned off or repeatedly blinking. This has been considered a problem. In order to increase the light emission efficiency of an LED, pulse light emission of the LED is performed with a period that is too short to be visually followed. This causes the above-described phenomenon.

In order to obtain an LED image which is the same as visual recognition by use of the current solid-state imaging element, it is necessary to extend a shutter time such that the shutter time is longer than the pulse period of the LED. However, if the subject has a medium or higher illuminance in such a case, the saturation exposure amount of the solid-state imaging element is exceeded, so that a satisfactory image cannot be obtained. Thus, there is a demand for a solid-state imaging element with a higher saturation exposure amount.

In contrast, it is possible to solve such various problems with the current solid-state imaging element by means of a CMOS image sensor 10 (FIG. 1) including a pixel array portion 11 in which the pixels 600 are arranged.

The sixth embodiment has been described above.

(7) Seventh Embodiment

Next, a pixel 700 according to a seventh embodiment will be described with reference to FIGS. 26 and 27.

(Example of Pixel Structure)

Figure 26:
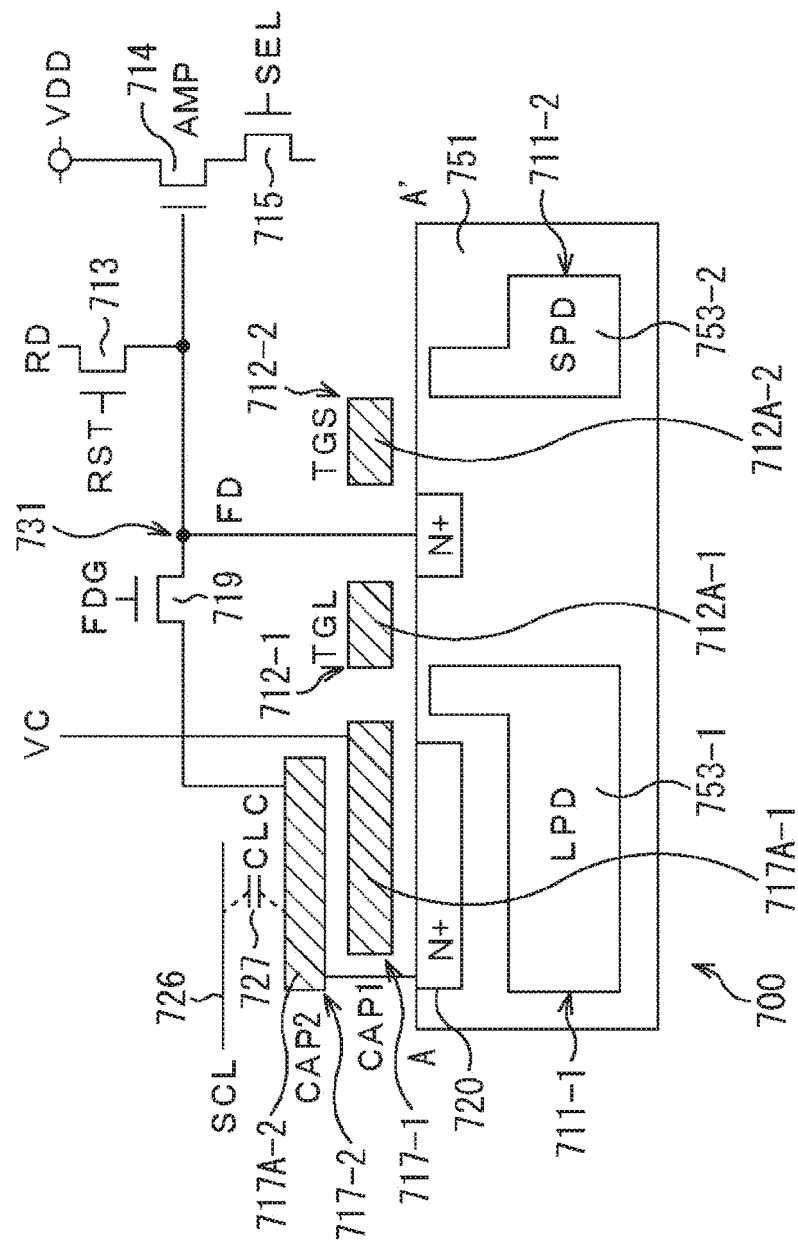
FIG. 26 is a cross-sectional view of an example of the structure of a pixel according to a seventh embodiment.
Figure 27:
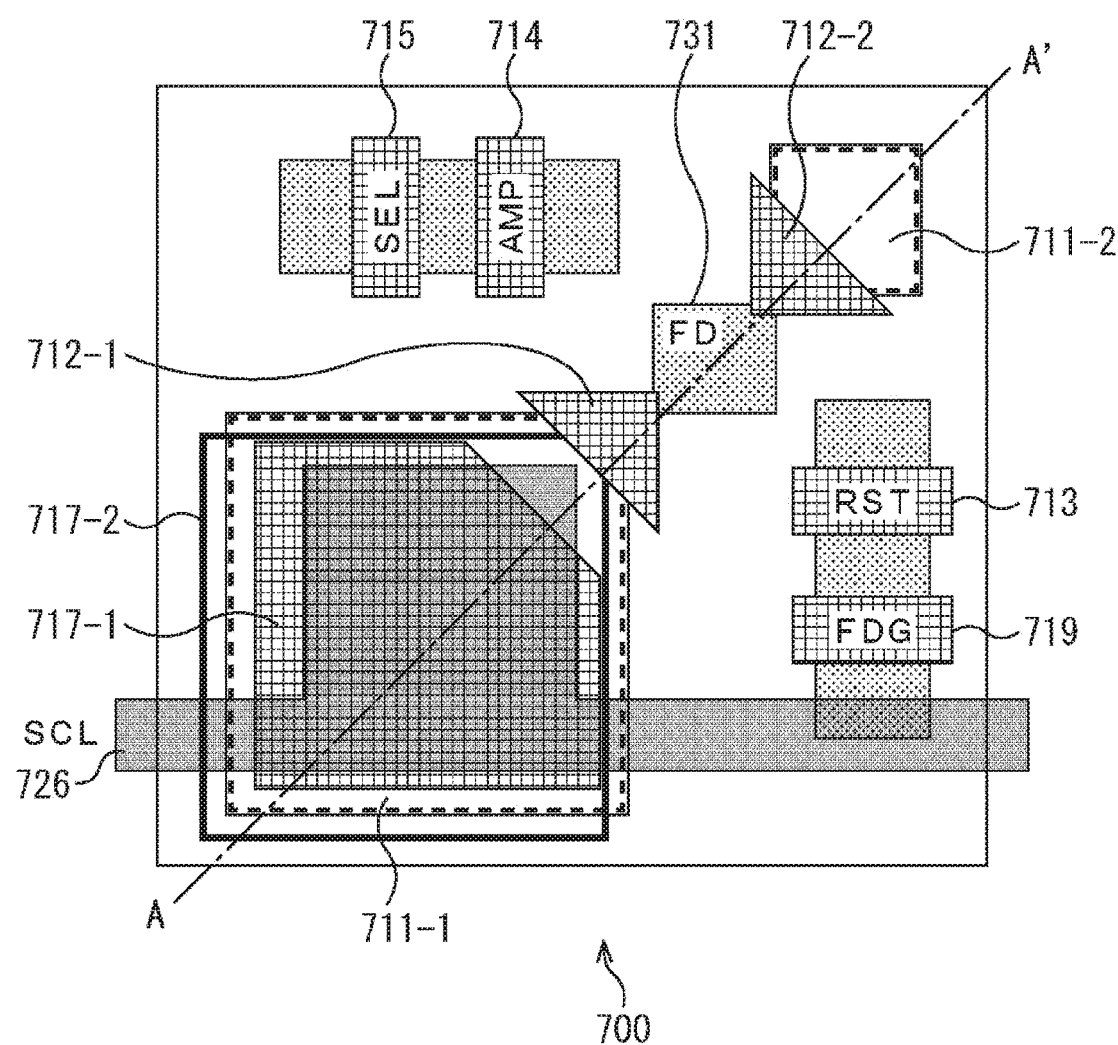
FIG. 27 is a plan view of an example of the structure of the pixel according to the seventh embodiment.

FIG. 26 is a cross-sectional view of an example of the structure of the pixel 700 according to the seventh embodiment. Furthermore, FIG. 27 is a plan view of the example of the structure of the pixel 700 according to the seventh embodiment. Note that FIG. 26 shows a cross section of the pixel 700 taken along line A-A' shown in FIG. 27.

Referring to FIG. 26, the pixel 700 includes a first photodiode 711-1 having a high sensitivity and a second photodiode 711-2 having a low sensitivity as photoelectric conversion elements in a silicon substrate. The first photodiode 711-1 and the second photodiode 711-2 are formed by, for example, the embedding of N-type layers 753-1 and 753-2 into a P-type well 751 in the silicon substrate.

A drive signal TGL is applied to a gate electrode 712A-1, and photoelectric conversion is performed by the first photodiode 711-1, so that a charge accumulated therein is transferred to a floating diffusion region (FD) 731. Furthermore, a drive signal TGS is applied to a gate electrode 712A-2, and photoelectric conversion is performed by the second photodiode 711-2, so that a charge accumulated therein is transferred to the floating diffusion region (FD) 731.

The floating diffusion region (FD) 731 is a charge-voltage conversion unit, which converts the charge transferred thereto into voltage. When a drive signal RST applied to the gate of a reset transistor 713 turns to the H level, the potential of the floating diffusion region (FD) 731 is reset, to a level corresponding to a reset drain (RD).

An amplifier transistor 714 has a gate connected to the floating diffusion region (FD) 731 and a drain connected to a power source VDD. Thus, the amplifier transistor 714 serves as an input unit of a readout circuit (source follower circuit) for reading a voltage signal held in the floating diffusion region (FD) 731.

When a drive signal SEL applied to the gate of a selection transistor 715 turns to the H level, the pixel 700 comes into a selected state. As a result, a signal amplified by the amplifier transistor 714 is output to a vertical signal line 22 (FIG. 1) via the selection transistor 715.

Here, the pixel 700 includes a first capacitance electrode 717A-1 provided on the element surface side with respect to the first photodiode 711-1 provided in the silicon substrate. The first capacitance electrode 717A-1 is connected to a potential fixing portion (VC) for fixing a potential at one end of a capacitance. Note that, for example, polycrystalline silicon (poly-Si) and the like can be used as the material for the first capacitance electrode 617A-1.

Furthermore, in the pixel 700, an insulating film and a second capacitance electrode 717A-2 are stacked in layers on the first capacitance electrode 717A-1. Here, the second capacitance electrode 717A-2 is connected to a diffusion layer 720 included in a first MOS capacitance 717-1, so that the first MOS capacitance 717-1 and a second MOS capacitance 717-2 are connected in parallel.

The second capacitance electrode 717A-2 is connected to the floating diffusion region (FD) 731 via a conversion efficiency switching transistor 719. The conversion efficiency switching transistor 719 performs on/off operation according to a drive signal FDG applied to its gate, and switches the capacitance of the floating diffusion region (FD) 731. As a result, it is possible to switch between low conversion efficiency and high conversion efficiency.

In the pixel 700, an SCL line 726 including a signal line is disposed at an upper level relative to the second capacitance electrode 717A-2, and is connected to a pulse drive circuit. The SCL line 726 is capacitively coupled to the second capacitance electrode 717A-2 by a CLC capacitance 727.

Note that examples of substances that can be used as the material for the second capacitance electrode 717A-2 include polycrystalline silicon (poly-Si), tungsten (W), titanium (Ti), tantalum (Ta), aluminum (Al), copper (Cu), compounds including these substances as primary constituents, and a laminated film including a combination thereof.

As described above, the pixel 700 includes capacitances (CAP1 and CAP2) provided on a side (element surface side) opposite to the light incident surface of the first photodiode 711-1, which is one of the two photodiodes, that is, the first photodiode 711-1 and the second photodiode 711-2 provided in a semiconductor substrate. The capacitances (CAP1 and CAP2) respectively include the first capacitance electrode 717A-1 as a first conductive layer and the second capacitance electrode 717A-2 as a second conductive layer.

Furthermore, with regard to the driving of the pixel 700, it is possible to increase the saturation charge amount of the second photodiode 711-2 by means of the first capacitance electrode 717A-1 and the second capacitance electrode 717A-2 that are stacked, by applying the above-described example of driving shown in FIG. 25 to, for example, the driving of the second photodiode 711-2. Furthermore, in this case, it is possible to promote an increase of an FD potential by providing a pulse signal to the SCL line 726 capacitively coupled to the second capacitance electrode 717A-2.

The seventh embodiment has been described above.

<4. Variations>

(Examples of Combinations of Embodiments)

Each of the seven embodiments described above may, of course, be implemented as an independent embodiment. In addition, it is also possible to adopt a form in which all or some of the plurality of embodiments are combined in a feasible range.

For example, the second embodiment may be combined with the third to fifth embodiments described above so as to apply a variable voltage to the counter electrode 320 (420 or 520) such that the voltage FCVDD to be applied to the counter electrode 320 (420 or 520) can switch between, for example, the voltage for the shutter period and the readout period and the voltage for the accumulation period. Meanwhile, it is also possible to combine the first embodiment with the third to fifth embodiments described above such that the voltage to be applied to the counter electrode 320 (420 or 520) is fixed at a constant voltage.

(Other Examples of Solid-State Imaging Device)

Furthermore, although the case of applying the present technology to a CMOS image sensor including pixels two-dimensionally arranged has been cited as an example in descriptions of the above-described embodiments, the present technology is not limited to application to CMOS image sensors. In other words, the present technology is applicable to general solid-state imaging devices of the X-Y addressing scheme in which pixels are two-dimensionally arranged.

Moreover, the present technology is not limited to application to a solid-state imaging device that detects the distribution of the quantity of incident visible light and captures an image thereof. The present technology is applicable to general solid-state imaging devices that capture images of the distribution of the quantity of incident infrared rays, X-rays, particles, or the like.

<5. Configuration of Electronic Device

Figure 28:
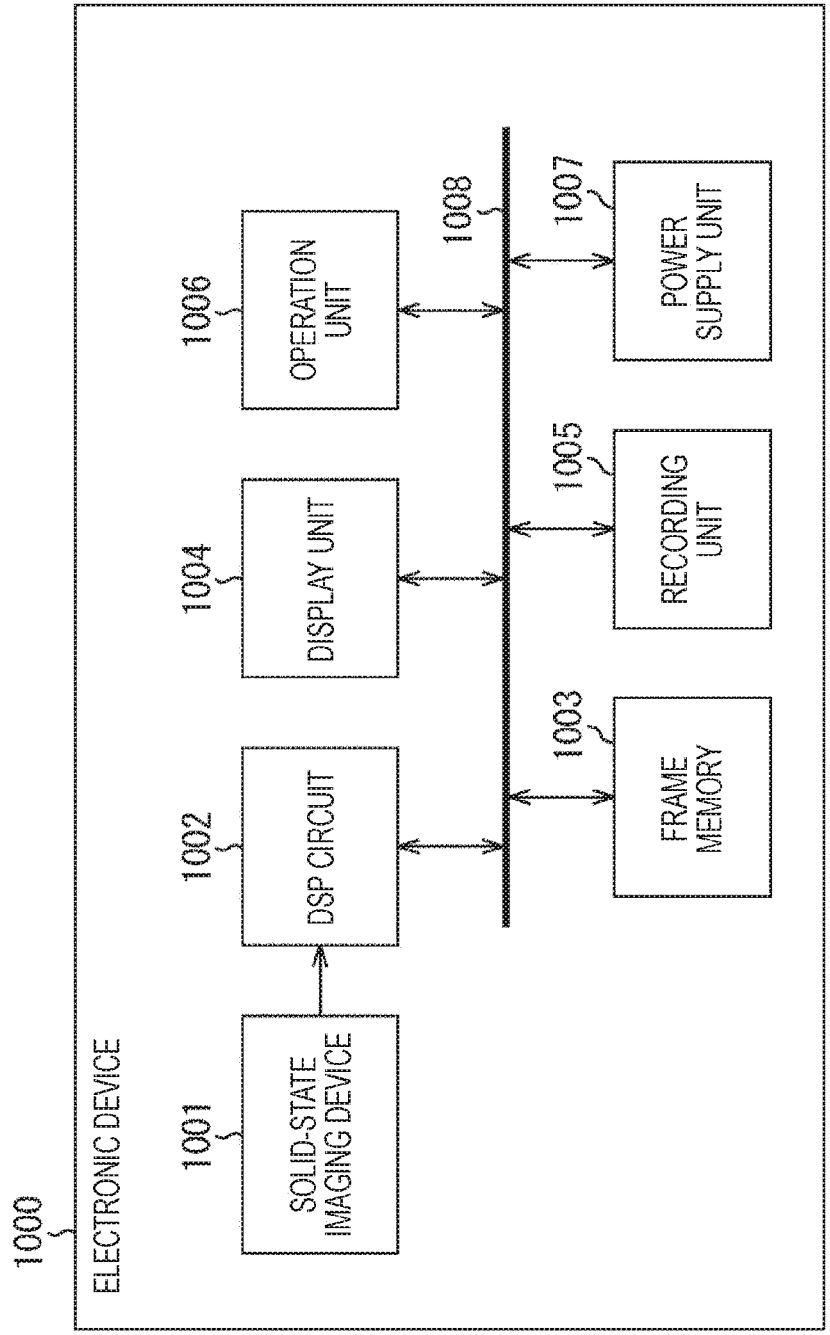
FIG. 28 is a block diagram showing a configuration example of an electronic device including a solid-state imaging device to which the technology according to the present disclosure has been applied.

FIG. 28 is a block diagram showing a configuration example of an electronic device including a solid-state imaging device to which the technology according to the present disclosure has been applied.

An electronic device 1000 is, for example, an electronic device such as an imaging device or a portable terminal device. Examples of the imaging device include a digital still camera and a video camera. Examples of the portable terminal device include a smartphone and a tablet terminal.

The electronic device 1000 includes a solid-state imaging device 1001, a DSP circuit 1002, a frame memory 1003, a display unit 1004, a recording unit 1005, an operation unit 1006, and a power supply unit 1007. Furthermore, in the electronic device 1000, the DSP circuit 1002, the frame memory 1003, the display unit 1004, the recording unit 1005, the operation unit 1006, and the power supply unit 1007 are interconnected via a bus line 1008.

The solid-state imaging device 1001 corresponds to the above-described CMOS image sensor 10 (FIG. 1) Any of the pixels 100 to 500 set forth in the first to fifth embodiments described above can be two-dimensionally arranged in the pixel array portion.

The DSP circuit 1002 is a camera signal processing circuit that processes a signal supplied from the solid-state imaging device 1001. The DSP circuit 1002 outputs image data obtained as a result of processing the signal from the solid-state imaging device 1001. The frame memory 1003 temporarily holds the image data processed by the DSP circuit 1002, in frame units.

The display unit 1004 includes, for example, a panel type display device such as a liquid crystal panel or an organic electro luminescence (EL) panel, and displays a moving image or a still image captured by the solid-state imaging device 1001. The recording unit 1005 records image data of the moving image or the still image captured by the solid-state imaging device 1001 in a recording medium such as a semiconductor memory or a hard disk.

The operation unit 1006 outputs operation commands for various functions of the electronic device 1000 according to user operations. The power supply unit 1007 appropriately supplies the DSP circuit 1002, the frame memory 1003, the display unit 1004, the recording unit 1005, and the operation unit 1006 with various power sources as operation power sources of these constituent elements.

The electronic device 1000 is configured as described above. The present technology is applied to the solid-state imaging device 1001 as described above. Specifically, the CMOS image sensor 10 (FIG. 1) can be applied to the solid-state imaging device 1001. It is possible to effectively prevent blooming by applying the present technology to the solid-state imaging device 1001 such that for each of pixels two-dimensionally arranged in a pixel array portion, an in-pixel capacitance is provided on a side opposite to the light incident surface of a photoelectric conversion element provided in a silicon substrate, and in addition, a counter electrode of the in-pixel capacitance is provided in the silicon substrate.

<6. Examples of Use of Solid-State imaging Device>

Figure 29:
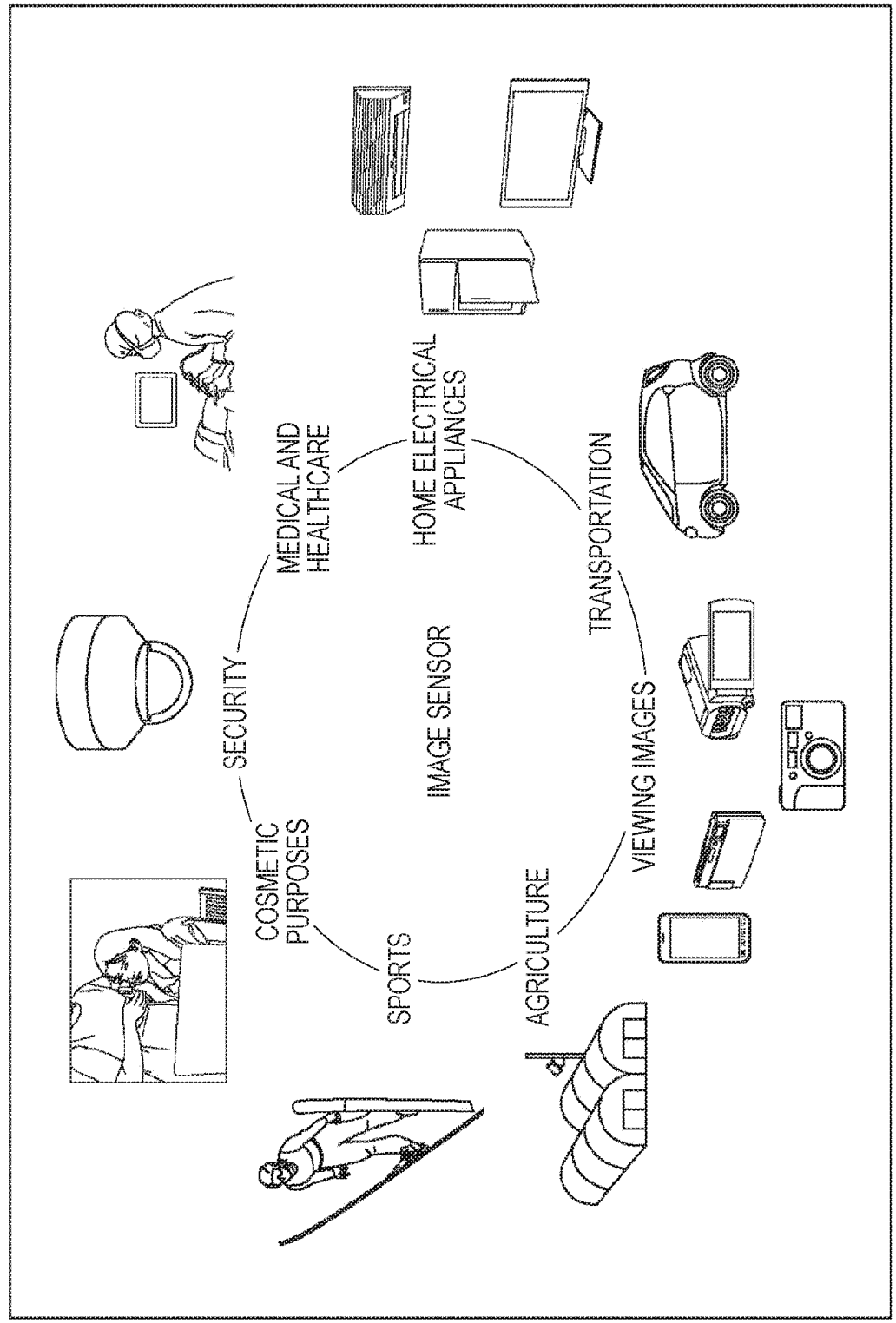
FIG. 29 is a diagram showing examples of the use of the solid-state imaging device to which the technology according to the present disclosure has been applied.

FIG. 29 is a diagram showing examples of the use of a solid-state imaging device to which the technology according to the present disclosure has been applied.

For example, the CMOS image sensor 10 (FIG. 1) can be used in various cases of sensing light such as visible light, infrared light, ultraviolet light, and X-rays, as described below. In other words, as shown in FIG. 29, the CMOS image sensor 10 can be used for apparatuses to be used not only in the field of viewing images where images to be provided for viewing are captured, but also in, for example, the field of transportation, the field of home electrical appliances, the field of medical and healthcare, the field of security, the cosmetic the field of sports, the field of agriculture, or the like.

Specifically, in the field of viewing images, for example, the CMOS image sensor 10 can be used for apparatuses (for example, the electronic device 1000 shown in FIG. 28) for capturing images to be provided for viewing, such as a digital camera, a smartphone, and a mobile phone with a camera function.

In the field of transportation, the CMOS image sensor 10 can be used for, for example, apparatuses to be used for transportation, such as an in-vehicle sensor for capturing images of the front, rear, surroundings, inside, and others of an automobile for the purpose of, for example, safe driving including an automatic stop and the like and recognition of a driver's condition, a surveillance camera for monitoring running vehicles and roads, and a distance measuring sensor for measuring a distance between vehicles or the like.

In the field of home electrical appliances, the CMOS image sensor 10 can be used for, for example, apparatuses to be used for home electrical appliances such as a television receiver, a refrigerator, and an air conditioner, so as to capture images of a user's gestures and operate the appliances according to the gestures. Furthermore, in the field of medical and healthcare, the CMOS image sensor 10 can be used for, for example, apparatuses to be used for medical and healthcare, such as an endoscope and an apparatus for performing angiography by receiving infrared light.

In the field of security, the CMOS image sensor 10 can be used for, for example, apparatuses to be used for security, such as a surveillance camera for crime-prevention purposes and a camera for person authentication purposes. Furthermore, in the cosmetic field, the CMOS image sensor 10 can be used for, for example, apparatuses to be used for cosmetic purposes, such as a skin measuring instrument for capturing an image of skin and a microscope for capturing an image of a scalp.

In the field of sports, the CMOS image sensor 10 can be used for, for example, apparatuses to be used for sports, such as an action camera and a wearable camera for sports use and the like. Furthermore, in the field of agriculture, the CMOS image sensor 10 can be used for, for example, apparatuses to be used for agriculture, such as a camera for monitoring the condition of fields and crops.

<7. Configuration Examples of Stack-Type Solid-State Imaging Device to which Technology According to Present Disclosure Can Be Applied>

Figure 30:
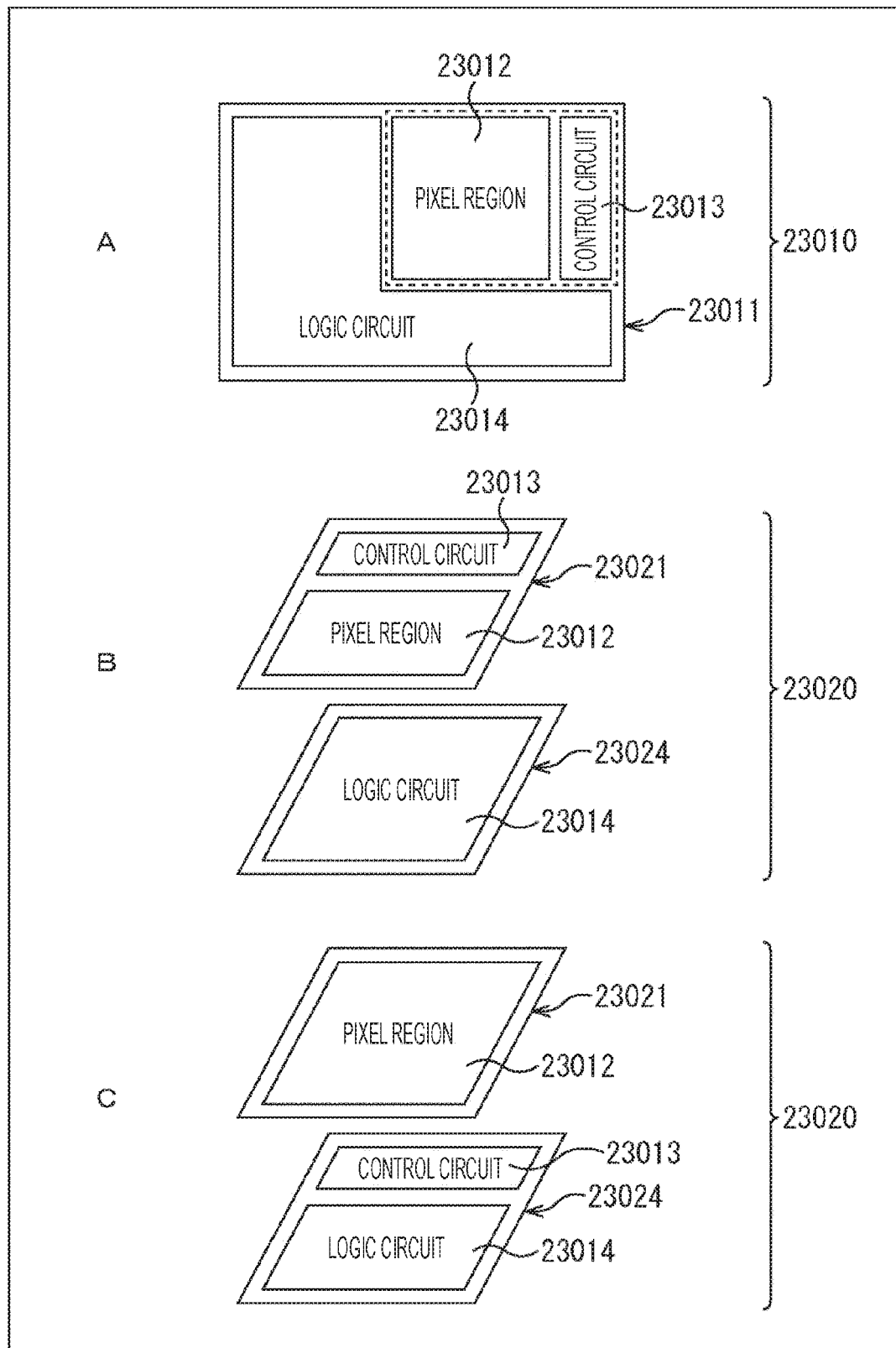
FIG. 30 is a diagram showing an outline of configuration examples of a stack-type solid-state imaging device to which the technology according to the present disclosure can be applied.

FIG. 30 is a diagram showing an outline of configuration examples of a stack-type solid-state imaging device to which the technology according to the present disclosure can be applied.

Here, A of FIG. 30 shows a schematic configuration example of a non-stacked solid-state imaging device. A solid-state imaging device 23010 includes a single die (semiconductor substrate) 23011 as shown in A of FIG. 30. A pixel region 23012, a control circuit 23013, and a logic circuit 23014 are mounted on the die 23011. In the pixel region 23012, pixels are arranged in an array. The control circuit 23013 performs various types of control on the driving of the pixels, and others. The logic circuit 23014 processes signals.

In addition, B and C of FIG. 30 show schematic configuration examples of a stack-type solid-state imaging device. As shown in B and C of FIG. 30, a solid-state imaging device 23020 includes two dies of a sensor die 23021 and a logic die 23024 that are stacked and electrically connected to form a single semiconductor chip.

In B of FIG. 30, the pixel region 23012 and the control circuit 23013 are mounted on the sensor die 23021. In addition, the logic circuit 23014 is mounted on the logic die 23024. The logic circuit 23014 includes a signal processing circuit that processes signals.

In C of FIG. 30, the pixel region 23012 is mounted on the sensor die 23021. In addition, the control circuit 23013 and the logic circuit 23014 are mounted on the logic die 23024.

Figure 31:
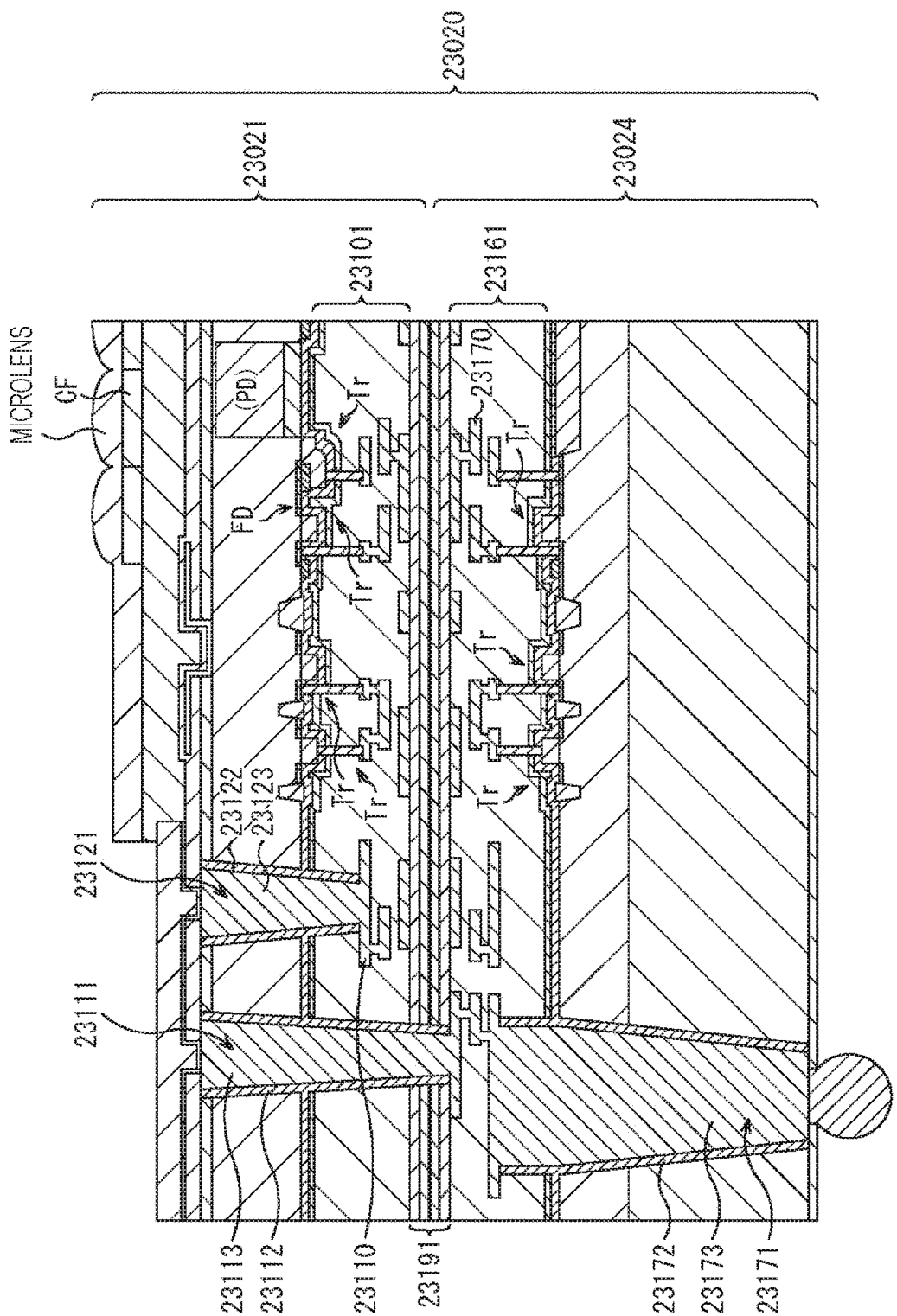
FIG. 31 is a cross-sectional view of a first configuration example of the stack-type solid-state imaging device.

FIG. 31 is a cross-sectional view of a first configuration example of the stack-type solid-state imaging device 23020.

A photodiode (PD), a floating diffusion (FD), a Tr (MOS FET), and a Tr to serve as the control circuit 23013, to be included in the pixel disposed in the pixel region 23012 is formed in the sensor die 23021. Moreover, a wiring layer 23101 is formed in the sensor die 23021. The wiring layer 23101 includes multiple layers of wring parts 23110. In the present example, the wiring layer 23101 includes three layers of the wiring parts 23110. Note that (the Tr to serve as) the control circuit 23013 can be formed not in the sensor die 23021 but in the logic die 23024.

A Tr to be included in the logic circuit 23014 is formed in the logic die 23024. Moreover, a wiring layer 23161 is formed in the logic die 23024. The wiring layer 23161 includes multiple layers of wiring parts 23170. In the present example, the wiring layer 23161 includes three layers of the wiring parts 23170. Furthermore, a connection hole 23171 is formed in the logic die 23024, and an insulating film 23172 is formed on the inner wall surface of the connection hole 23171. In addition, a connection conductor 23173 is embedded in the connection hole 23171, to be connected to the wiring part 23170 and the like.

The sensor die 23021 and the logic die 23024 are bonded together such that the respective wiring layers 23101 and 23161 face each other. Thus, the stack-type solid-state imaging device 23020 is formed, which includes the sensor die 23021 and the logic die 23024 that are stacked. A film 23191 such as a protective film is formed on a surface to which the sensor die 23021 and the logic die 23024 are bonded.

A connection hole 23111 is formed in the sensor die 23021 such that the connection hole 23111 penetrates the sensor die 23021 from the back surface side (light incident side of the PD) (upper side) of the sensor die 23021 to reach the uppermost wiring part 23170 of the logic die 23024. Moreover, a connection hole 23121 is formed in the sensor die 23021. The connection hole 23121 is formed in the vicinity of the connection hole 23111 such that the connection hole 23121 reaches the wiring part 23110 at the first layer from the back surface side of the sensor die 23021. An insulating film 23112 is formed on the inner wall surface of the connection hole 23111, and an insulating film 23122 is formed on the inner wall surface of the connection hole 23121. Then, connection conductors 23113 and 23123 are embedded in the connection holes 23111 and 23121, respectively. The connection conductor 23113 and the connection conductor 23123 are electrically connected on the back surface side of the sensor die 23021. As a result, the sensor die 23021 and the logic die 23024 are electrically connected via the wiring layer 23101, the connection hole 23121, the connection hole 23111, and the wiring layer 23161.

Figure 32:
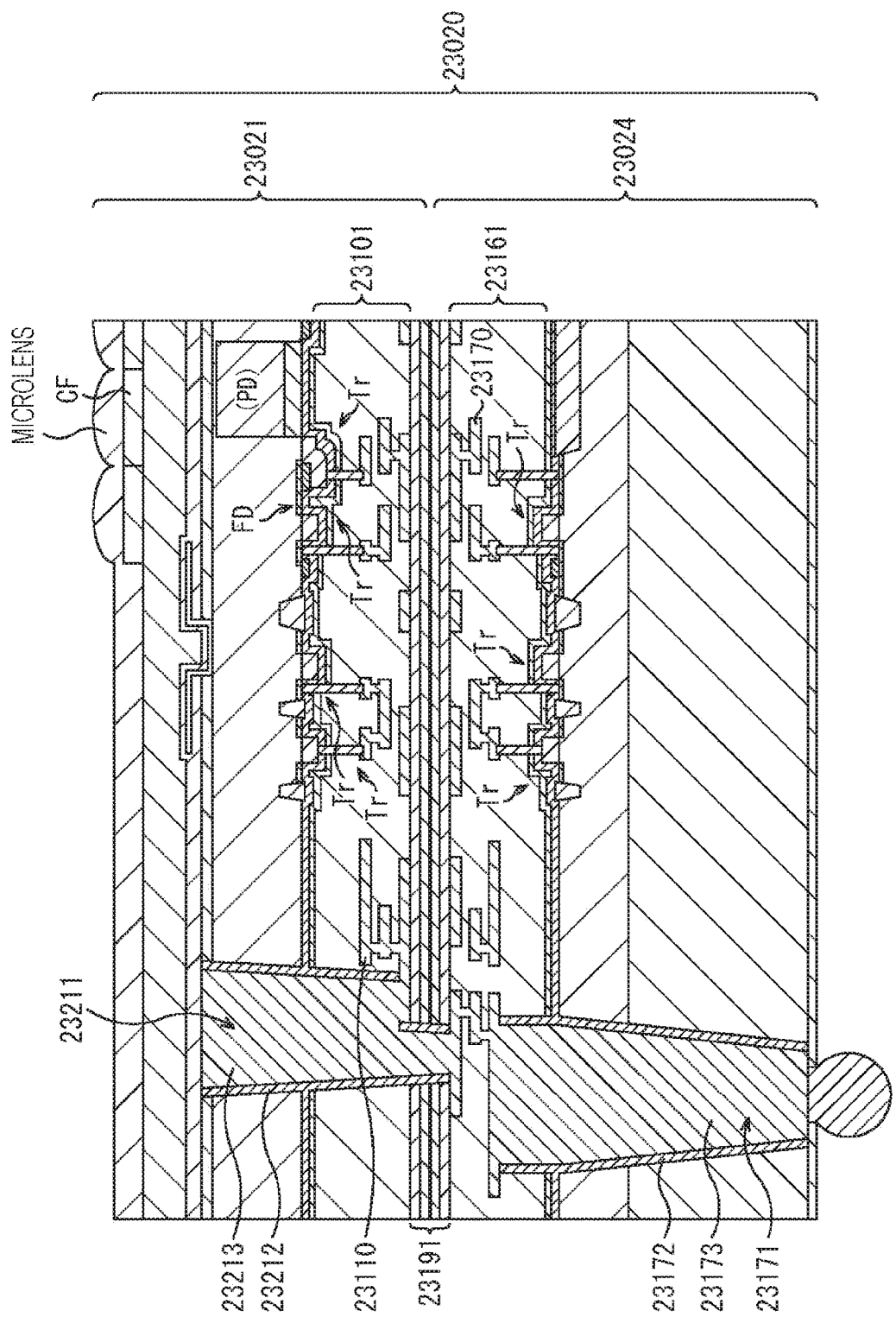
FIG. 32 is a cross-sectional view of a second configuration example of the stack-type solid-state imaging device.

FIG. 32 is a cross-sectional view of a second configuration example of the stack-type solid-state imaging device 23020.

In the second configuration example of the solid-state imaging device 23020, ((the wiring part 23110 of) the wiring layer 23101 of) the sensor die 23021 and ((the wiring part 23170 of) the wiring layer 23161 of) the logic die 23024 are electrically connected via a single connection hole 23211 formed in the sensor die 23021.

In other words, FIG. 32 shows the connection hole 23211 formed in such a way as to penetrate the sensor die 23021 from the back surface side of the sensor die 23021 to reach the uppermost wiring part 23170 of the logic die 23024 and also reach the uppermost wiring part 23110 of the sensor die 23021. An insulating film 23212 is formed on the inner wall surface of the connection hole 23211, and a connection conductor 23213 is embedded in the connection hole 23211. In FIG. 31 described above, the sensor die 23021 and the logic die 23024 are electrically connected via the two connection holes 23111 and 23121. Meanwhile, in FIG. 32, the sensor die 23021 and the logic die 23024 are electrically connected via the single connection hole 23211.

Figure 33:
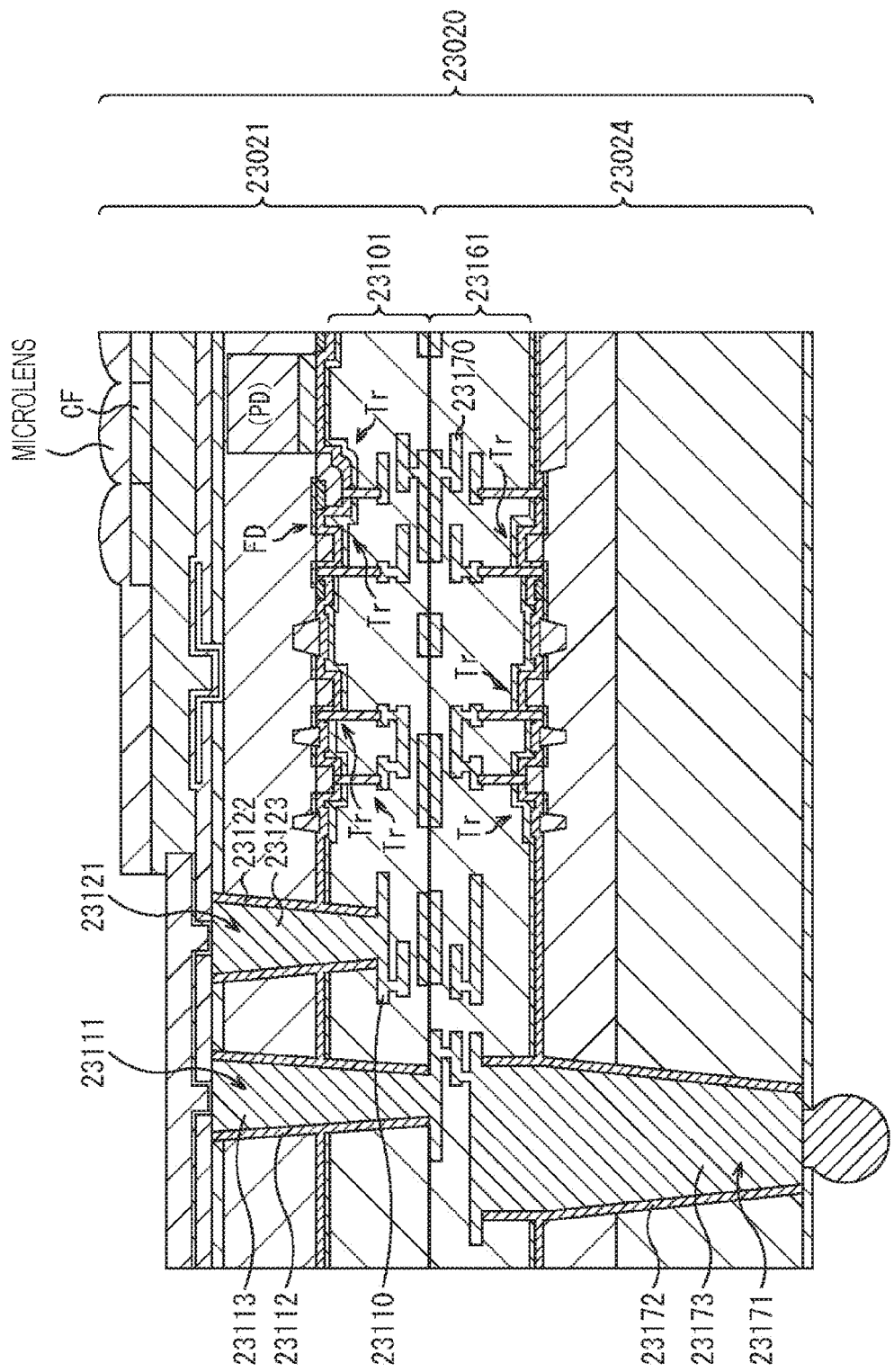
FIG. 33 is a cross-sectional view of a third configuration example of the stack-type solid-state imaging device.

FIG. 33 is a cross-sectional view of a third configuration example of the stack-type solid-state imaging device 23020.

In the solid-state imaging device 23020 shown in FIG. 33, the film 23191 such as a protective film is not formed on the surface to which the sensor die 23021 and the logic die 23024 are bonded. In this respect, the solid-state imaging device 23020 shown in FIG. 33 is different from the solid-state imaging device 23020 shown in FIG. 31, in which the film 23191 such as a protective film is formed on the surface to which the sensor die 23021 and the logic die 23024 are bonded.

The solid-state imaging device 23020 shown in FIG. 33 is formed as follows: the sensor die 23021 and the logic die 23024 are stacked in such a way as to bring the wiring parts 23110 and 23170 into direct contact, and are heated with a necessary weight being added so that the wiring parts 23110 and 23170 are directly bonded.

Figure 34:
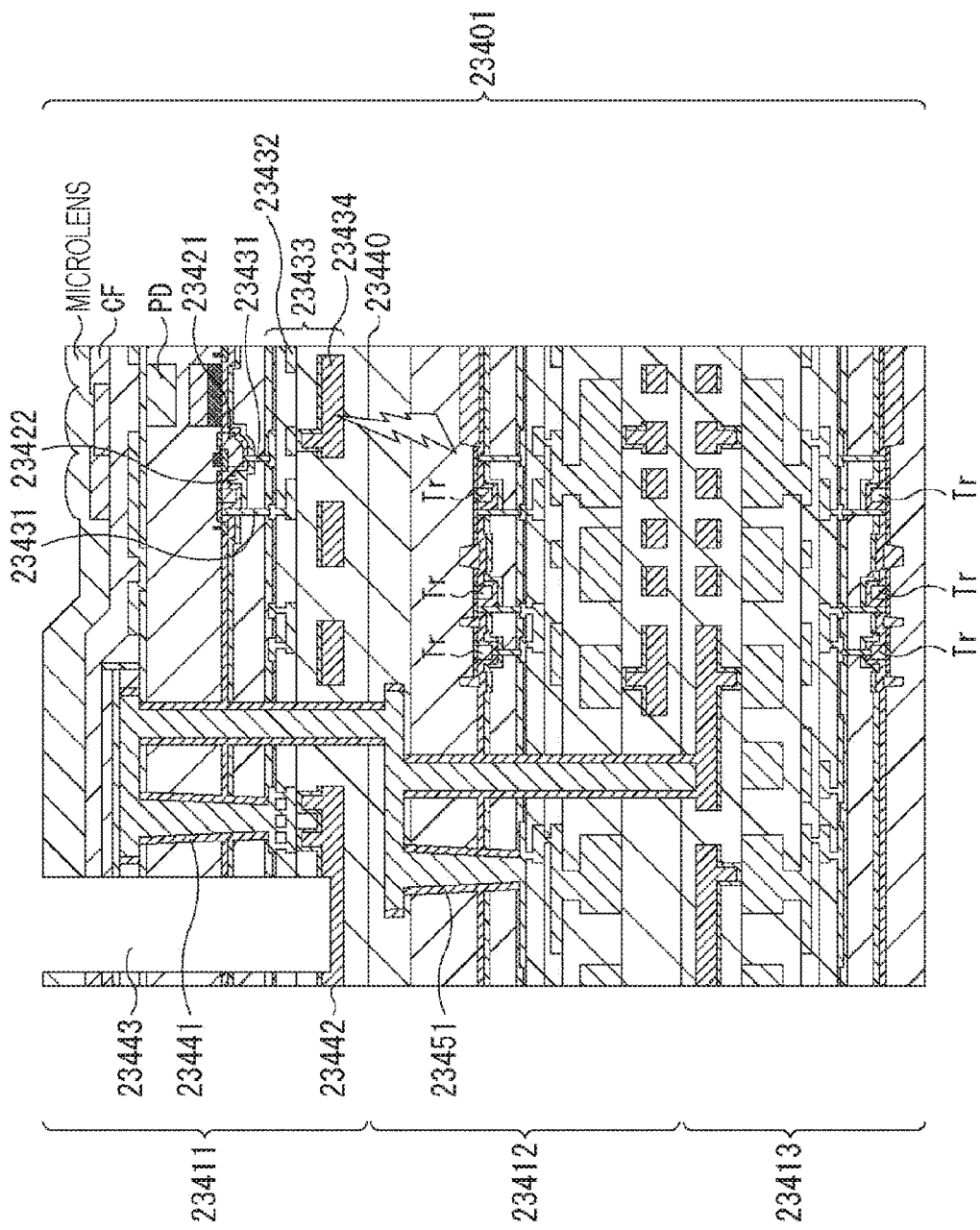
FIG. 34 is a cross-sectional view of another configuration example of the stack-type solid-state imaging device to which the technology according to the present disclosure can be applied.

FIG. 34 is a cross-sectional view of another configuration example of the stack-type solid-state imaging device to which the technology according to the present disclosure can be applied.

In FIG. 34, a solid-state imaging device 23401 has a layered structure with three layers, in which three dies of a sensor die 23411, a logic die 23412, and a memory die 23413 are stacked.

The memory die 23413 includes, for example, a memory circuit that temporarily stores data necessary for signal processing to be performed in the logic die 23412.

In FIG. 34, the logic die 23412 and the memory die 23413 are stacked in this order below the sensor die 23411. However, the logic die 23412 and the memory die 23413 may be stacked below the sensor die 23411 in reverse order, that is, in the order of the memory die 23413 and the logic die 23412.

Note that in FIG. 34, a PD to serve as a photoelectric conversion unit of a pixel and source/drain regions of pixel Trs are formed in the sensor die 23411.

Gate electrodes are formed around the PD via a gate insulating film. A pixel Tr 23421 and a pixel Tr 23422 are each formed with the gate electrode and a pair of the source/drain regions.

The pixel Tr 23421 adjacent to the PD is a transfer Tr, and one of the pair of source/drain regions forming the pixel Tr 23421 serves as an FD.

Furthermore, an interlayer insulating film is formed in the sensor die 23411, and a connection hole is formed in the interlayer insulating film. There is formed, in the connection hole, a connection conductor 23431 connected to the pixel Tr 23421 and the pixel Tr 23422.

Moreover, a wiring layer 23433 is formed in the sensor die 23411. The wiring layer 23433 includes multiple layers of wiring parts 23432 connected to the respective connection conductors 23431.

Furthermore, an aluminum pad 23434 to serve an electrode for external connection is formed in the lowermost layer of the wiring layer 23433 of the sensor die 23411. In other words, in the sensor die 23411, the aluminum pad 23434 is formed at a position closer to a bonding surface 23440 between the sensor die 23411 and the logic die 23412 than the wiring part 23432. The aluminum pad 23434 is used as one end of a line related to external signal input/output.

Moreover, a contact 23441 is formed in the sensor die 23411. The contact 23441 is used for electrical connection with the logic die 23412. The contact 23441 is connected to a contact 23451 of the logic die 2412, and is also connected to an aluminum pad 23442 of the sensor die 23411.

Then, a pad hole 23443 is formed in the sensor die 23411 such that the pad hole 23443 reaches the aluminum pad 23442 from the back surface side (upper side) of the sensor die 23411.

The technology according to the present disclosure can be applied to solid-state imaging devices as described above.

<8. Example of Application to Mobile Object>

The technology (present technology) according to the present disclosure can be applied to various products. For example, the technology according to the present disclosure may be implemented as an apparatus to be mounted on any type of mobile object such as an automobile, an electric vehicle, a hybrid electric vehicle, a motorcycle, a bicycle, a personal mobility vehicle, an airplane, a drone, a ship, Cr a robot.

Figure 35:
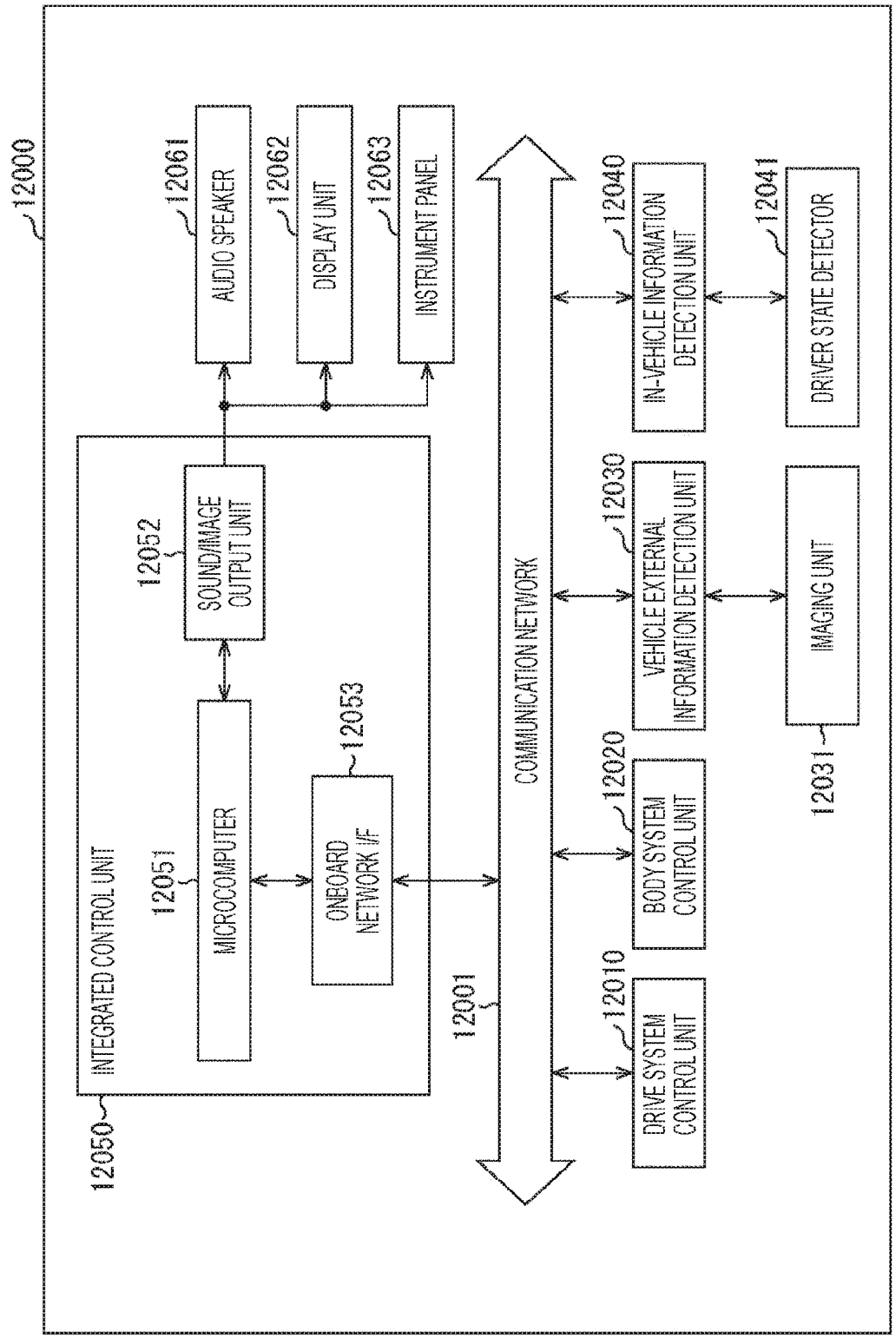
FIG. 35 is a block diagram showing an example of the schematic configuration of a vehicle control system.

FIG. 35 is a block diagram showing an example of the schematic configuration of a vehicle control system that is an example of a mobile object control system to which the technology according to the present disclosure can be applied.

A vehicle control system 12000 includes a plurality of electronic control units connected via a communication network 12001. In the example shown in FIG. 35, the vehicle control system 12000 includes a drive system control unit 12010, a body system control unit 12020, a vehicle external information detection unit 12030, an in-vehicle information detection unit 12040, and an integrated control unit 12050. Furthermore, as a functional configuration of the integrated control unit 12050, FIG. 35 shows a microcomputer 12051, a sound/image output unit 12052, and an onboard network interface (I/F) 12053.

The drive system control unit 12010 controls operation of a device related to the drive system of a vehicle according to various programs. For example, the drive system control unit 12010 functions as a control device for devices such as a driving force generating device, such as an internal combustion engine or a driving motor, for generating driving force for a vehicle; a driving force transmission mechanism for transmitting driving force to wheels; a steering mechanism for adjusting the steering angle of the vehicle; and a braking device for generating braking force for the vehicle.

The body system control unit 12020 controls operation of various devices mounted on a vehicle body according to various programs. For example, the body system control unit 12020 functions as a control device for a keyless entry system, a smart key system, a power window device, or various lamps such as a head lamp, a backup lamp, a brake lamp, a direction indicator, and a fog lamp. In this case, radio waves emitted from a portable device that substitutes for a key, or signals of various switches can be input to the body system control unit 12020. The body system control unit 12020 receives the input of the radio waves or signals to control a door lock device, the power window device, the lamps, and the like of the vehicle.

The vehicle external information detection unit 12030 detects information about the outside of a vehicle equipped with the vehicle control system 12000. For example, an imaging unit 12031 is connected to the vehicle external information detection unit 12030. The vehicle external information detection unit 12030 causes the imaging unit 12031 to capture an image of a view outside the vehicle, and receives the captured image. On the basis of the received image, the vehicle external information detection unit 12030 may perform a process of detecting an object, such as a person, a vehicle, an obstacle, a sign, or a character on a road surface, or a process of detecting the distance thereto.

The imaging unit 12031 is an optical sensor that receives light and outputs an electric signal according to the quantity of the received light. The imaging unit 12031 can output the electric signal as an image, or can output the electric signal as distance measurement information. Furthermore, light to be received by the imaging unit 12031 may be visible light, or may be non-visible light such as infrared rays.

The in-vehicle information detection unit 12040 detects information about the inside of the vehicle. The in-vehicle information detection unit 12040 is connected to, for example, a driver state detector 12041 that detects the state of a driver. The driver state detector 12041 may include, for example, a camera for capturing an image of a driver. Then, on the basis of detection information input from the driver state detector 12041, the in-vehicle information detection unit 12040 may calculate the degree of fatigue or degree of concentration of the driver, or may determine whether or not the driver is dozing.

The microcomputer 12051 can calculate a control target value of the driving force generating device, the steering mechanism, or the braking device on the basis of information about the inside/outside of the vehicle, obtained by the vehicle external information detection unit 12030 or the in-vehicle information detection unit 12040. Then, the microcomputer 12051 can output a control command to the drive system control unit 12010. For example, the microcomputer 12051 can perform cooperative control for the purpose of implementing an Advanced Driver Assistance System (ADAS) function including collision avoidance or shock mitigation of a vehicle, follow-up traveling based on a distance between vehicles, traveling at a constant vehicle speed, a vehicle collision warning, a warning against the vehicle deviating from a lane, or the like.

Furthermore, the microcomputer 12051 can perform cooperative control for the purpose of automatic driving and the like for autonomously traveling without depending on the driver's operation, by controlling the driving force generating device, the steering mechanism, the braking device, or the like on the basis of information about the surroundings of the vehicle obtained by the vehicle external information detection unit 12030 or the in-vehicle information detection unit 12040.

Furthermore, the microcomputer 12051 can output a control command to the body system control unit 12030 on the basis of the information about the outside of the vehicle obtained by the vehicle external information detection unit 12030. For example, the microcomputer 12051 can perform cooperative control for an antiglare purpose, such as switching of a head lamp from the high beam to the low beam, by controlling the head lamp according to the position of a preceding vehicle or an oncoming vehicle detected by the vehicle external information detection unit 12030.

The sound/image output unit 12052 transmits an output signal of at least one of sound or an image to an output device capable of notifying information to an occupant of the vehicle or the outside of the vehicle in a visual or auditory manner. In the example of FIG. 35, an audio speaker 12061, a display unit 12062, and an instrument panel 12063 are shown as examples of the output device. The display unit 12062 may include at least one of, for example, an onboard display or a head-up display.

Figure 36:
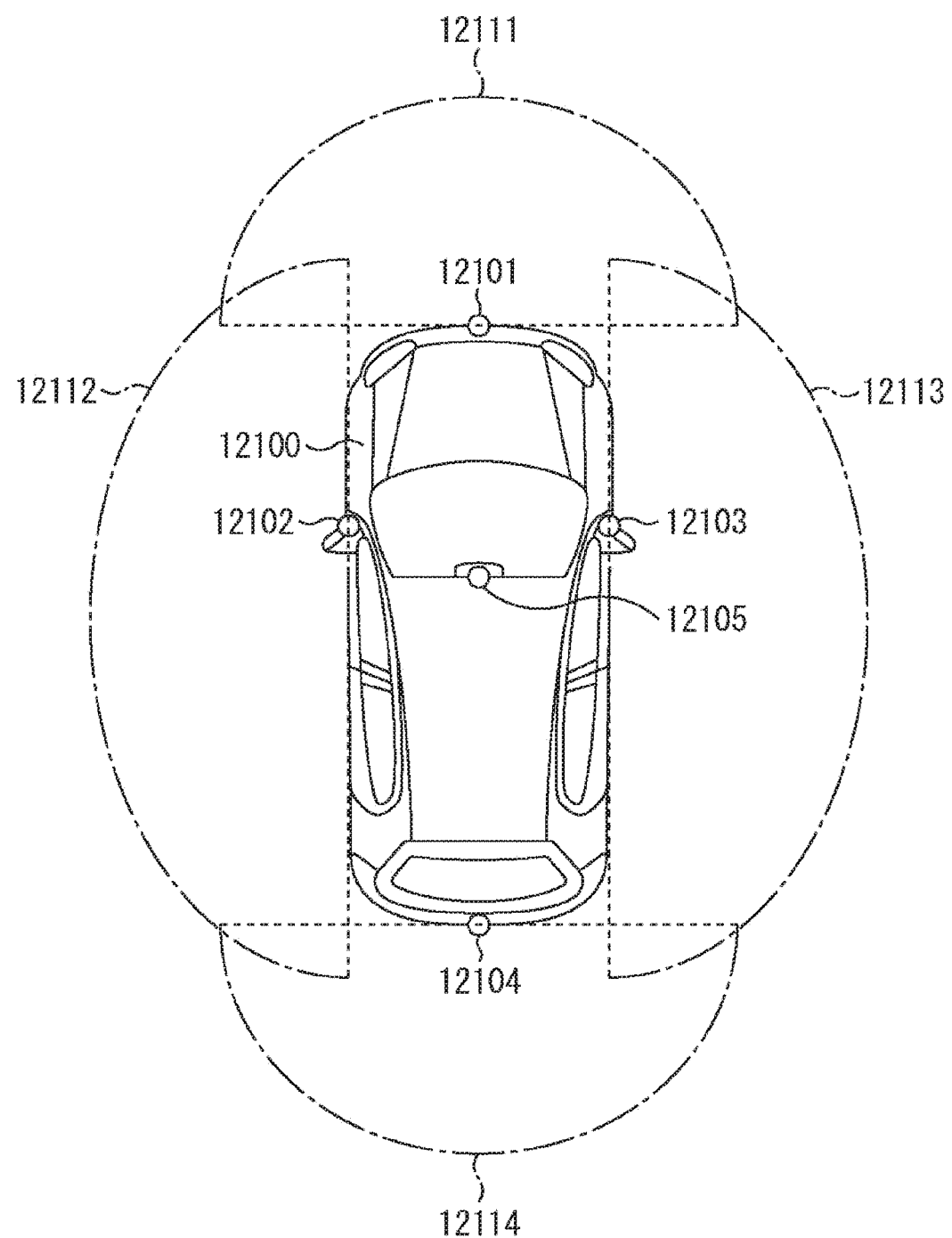
FIG. 36 is an explanatory diagram showing examples of installation positions of a vehicle external information detector and imaging units.

FIG. 36 is a diagram showing examples of installation positions of the imaging unit 12031.

FIG. 36 shows imaging units 12101, 12102, 12103, 12104, and 12105 provided as the imaging units 12031.

The imaging units 12101, 12102, 12103, 12104, and 12105 are provided at positions of, for example, a front nose, a side mirror, a rear bumper, a rear door, an upper inner portion of a windshield, and the like of a vehicle 12100. The imaging unit 12101 provided at the front nose and the imaging unit 12105 provided at the upper inner portion of the windshield mainly obtain images of front views from the vehicle 12100. The imaging units 12102 and 12103 provided at the side mirrors mainly obtain images of side views from the vehicle 12100. The imaging unit 12104 provided at the rear bumper or the rear door mainly obtains an image of a rear view from the vehicle 12100. The imaging unit 12105 provided at the upper inner portion of the windshield is mainly used for detecting a preceding vehicle, a pedestrian, an obstacle, a traffic signal, a traffic sign, a traffic lane, or the like.

Note that FIG. 36 shows examples of the shooting ranges of the imaging units 12101 to 12104. An imaging range 12111 indicates the imaging range of the imaging unit 12101 provided at the front nose. Imaging ranges 12112 and 12113 indicate the imaging ranges of the imaging units 12102 and 12103 provided at the respective side mirrors. An imaging range 12114 indicates the imaging range of the imaging unit 12104 provided at the rear bumper or the rear door. For example, an overhead view image of the vehicle 12100 viewed from above is obtained as a result of superimposing image data of images captured by the imaging units 12101 to 12104.

At least one of the imaging units 12101 to 12104 may have a function of obtaining distance information. For example, at least one of the imaging units 12101 to 12104 may be a stereo camera including a plurality of imaging elements, or an imaging element including pixels for phase difference detection.

For example, the microcomputer 12051 finds the distance to each three-dimensional object in the imaging ranges 12111 to 12114 and the temporal change of the distance (relative velocity to the vehicle 12100) on the basis of the distance information obtained from the imaging units 12101 to 12104. As a result, the microcomputer 12051 can particularly pick out, as a preceding vehicle, the closest three-dimensional object traveling on the route of the vehicle 12100 at a predetermined speed (for example, 0 km/h or more) in substantially the same direction as the vehicle 12100. Moreover, the microcomputer 12051 can set an inter-vehicle distance to be kept between the own vehicle and the preceding vehicle in advance, and can perform automatic brake control (also including follow-up stop control), automatic acceleration control (also including follow-up start control), and the like. As described above, it is possible to perform cooperative control for the purpose of automatic driving and the like for autonomously traveling without depending on the driver's operation.

For example, the microcomputer 12051 can sort three-dimensional object data related to three-dimensional objects into two-wheeled vehicles, ordinary vehicles, large-size vehicles, pedestrians, utility poles, and other three-dimensional objects on the basis of the distance information obtained from the imaging units 12101 to 12104, and can extract relevant three-dimensional object data for use in automatic avoidance of obstacles. For example, with regard to obstacles around the vehicle 12100, the microcomputer 12051 distinguishes between obstacles visible to the driver of the vehicle 12100 and obstacles difficult for the driver of the vehicle 12100 to visually recognize. Then, the microcomputer 12051 determines a collision risk indicating the degree of risk of a collision with each obstacle. When the collision risk is equal to or higher than a setting value and a possibility of a collision is thus indicated, the microcomputer 12051 can perform driving support for avoiding the collision by outputting a warning to the driver through the audio speaker 12061 and the display unit 12062 or by performing forced deceleration and avoidance steering through the drive system control unit 12010.

At least one of the imaging units 12101 to 12104 may be an infrared camera that detects infrared rays. For example, the microcomputer 12051 can recognize a pedestrian by determining whether or not a pedestrian is present in images captured by the imaging units 12101 to 12104. A process of such pedestrian recognition includes, for example, a step of extracting feature points in the images captured by the imaging units 12101 to 12104 as infrared cameras, and a step of performing pattern matching processing on a series of the feature points indicating the outline of an object to determine whether or not the object is a pedestrian. When the microcomputer 12051 recognizes a pedestrian as a result of determining that the pedestrian is present in the images captured by the imaging units 12101 to 12104, the sound/image output unit 12052 controls the display unit 12062 such that an image of the recognized pedestrian is displayed with a square outline superimposed thereon for emphasizing the pedestrian. Furthermore, the sound/image output unit 12052 may control the display unit 12062 such that an icon or the like indicating a pedestrian is displayed at a desired position.

An example of the vehicle control system to which the technology according to the present disclosure can be applied has been described above. The technology according to the present disclosure can be applied to the imaging unit 12031 among the constituent elements described above. Specifically, the CMOS image sensor 10 shown in FIG. 1 can be applied to the imaging unit 12031. It is possible to effectively prevent blooming by applying the technology according to the present disclosure to the imaging unit 12031. Thus, it is possible to cope with LED flicker by, for example, expanding the dynamic range.

<9. Example of Application to In-Vivo Information Acquisition System>

The technology (present technology) according to the present disclosure can be applied to various products. For example, the technology according to the present disclosure may be applied to an endoscopic surgery system.

FIG. 37 is a block diagram showing an example of the schematic configuration of a patient in-vivo information acquisition system using a capsule endoscope, to which the technology (present technology) according to the present disclosure can be applied.

An in-vivo information acquisition system 10001 includes a capsule endoscope 10100 and an external control device 10200.

The capsule endoscope 10100 is swallowed by a patient at the time of examination. The capsule endoscope 10100 has an imaging function and a wireless communication function. Thus, while moving inside organs such as the stomach and the intestines by peristaltic movement and the like until naturally discharged from the patient, the capsule endoscope 10100 sequentially captures images of the inside of the organs (hereinafter, also referred to as in-vivo images) at predetermined intervals, and sequentially transmits information regarding the in-vivo images through wireless communication to the external control device 10200 located outside the body.

The external control device 10200 centrally controls operation of the in-vivo information acquisition system 10001. Furthermore, the external control device 10200 receives the information regarding the in-vivo images transmitted from the capsule endoscope 10100, and generates image data for displaying the in-vivo images on a display device (not shown) on the basis of the received information regarding the in-vivo images.

In this way, the in-vivo information acquisition system 10001 can obtain in-vivo images by imaging the state of the inside of the patient's body as needed after the capsule endoscope 10100 is swallowed until the capsule endoscope 10100 is discharged.

The configurations and functions of the capsule endoscope 10100 and the external control device 10200 will be described in more detail.

The capsule endoscope 10100 includes a capsule type housing 10101 that stores a light source unit 10111, an imaging unit 10112, an image processing unit 10113, a wireless communication unit 10114, a power feeding unit 10115, a power supply unit 10116, and a control unit 10117.

The light source unit 10111 includes, for example, a light source such as a light emitting diode (LED), and emits light toward the imaging field of the imaging unit 10112.

The imaging unit 10112 includes an imaging element and an optical system that includes a plurality of lenses provided at a stage preceding the imaging element. Reflection of light applied to a body tissue to be observed (hereinafter referred to as observation light) is collected by the optical system, and enters the imaging element. In the imaging unit 10112, the imaging element performs photoelectric conversion of the observation light incident thereon to generate an image signal corresponding to the observation light. The image signal generated by the imaging unit 10112 is provided to the image processing unit 10113.

The image processing unit 10113 includes a processor such as a central processing unit (CPU) or a graphics processing unit (CPU), and performs various types of signal processing on the image signal generated by the imaging unit 10112. The image processing unit 10113 provides the wireless communication unit 10114 with the image signal subjected to the signal processing, as RAW data.

The wireless communication unit 10114 performs predetermined processing such as modulation processing on the image signal subjected to the signal processing by the image processing unit 10113, and transmits the image signal to the external control device 10200 via an antenna 10114A. Furthermore, the wireless communication unit 10114 receives a control signal related to drive control of the capsule endoscope 10100 from the external control device 10200 via the antenna 10114A. The wireless communication unit 10114 provides the control unit 10117 with the control signal received from the external control device 10200.

The power feeding unit 10115 includes an antenna coil for receiving power, a power regeneration circuit, a booster circuit, and the like. The power regeneration circuit regenerates power from a current generated in the antenna coil. The power feeding unit 10115 generates power by using the principle of so-called contactless charging.

The power supply unit 10116 includes a secondary battery, and stores the power generated by the power feeding unit 10115. Arrows and the like indicating destinations to which power is supplied from the power supply unit 10116 are omitted and not shown in FIG. 37 so as to avoid complicating the drawing. However, the power stored in the power supply unit 10116 may be supplied to the light source unit 10111, the imaging unit 10112, the image processing unit 10113, the wireless communication unit 10114, and the control unit 10117, and be used for the driving thereof.

The control unit 10117 includes a processor such as a CPU, and controls the driving of the light source unit 10111, the imaging unit 10112, the image processing unit 10113, the wireless communication unit 10114, and the power feeding unit 10115 as appropriate according to the control signal transmitted from the external control device 10200.

The external control device 10200 includes a processor such as a CPU or a CPU. Alternatively, the external control device 10200 includes a microcomputer, a control board, or the like on which a processor and a memory element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, light irradiation conditions for an object to be observed can be changed in the light source unit 10111 by, for example, the control signal from the external control device 10200. Furthermore, imaging conditions (for example, a frame rate, an exposure value, and the like in the imaging unit 10112) can be changed by the control signal from the external control device 10200. In addition, details of processing in the image processing unit 10113 and conditions (for example, transmission intervals, the number of images to be transmitted, and the like) under which the wireless communication unit 10114 transmits an image signal may be changed by the control signal from the external control device 10200.

Moreover, the external control device 10200 performs various types of image processing on the image signal transmitted from the capsule endoscope 10100, and generates image data for displaying the captured in-vivo image on the display device. Examples of the image processing include development processing (demosaicing processing), image quality enhancing processing (band emphasis processing, super-resolution processing, noise reduction (NR) processing, camera shake correction processing, and/or the like), enlargement processing (electronic zoom processing), and/or the like. Thus, it is possible to perform various types of signal processing as described above. The external control device 10200 controls the driving of the display device to cause the display device to display the captured in-vivo image on the basis of the generated image data. Alternatively, the external control device 10200 may cause a recording device (not shown) to record the generated image data, or may cause a printing device (not shown) to print and output the generated image data.

An example of the in-vivo information acquisition system to which the technology according to the present disclosure can be applied has been described above. The technology according to the present disclosure can be applied to the imaging unit 10112 among the constituent elements described above. Specifically, the CMOS image sensor 10 shown in FIG. 1 can be applied to the imaging unit 10112. It is possible to effectively prevent blooming by applying the technology according to the present disclosure to the imaging unit 10112. Thus, it is possible to obtain a clearer image of a surgical site by, for example, expanding a dynamic range. As a result, accuracy of examination can be improved.

Note that the embodiments of the present technology are not limited to the above-described embodiments, and various modifications can be made without departing from the gist of the present technology.

Furthermore, the present technology can adopt the following configurations.

(1)

A solid-state imaging device including:

a pixel array portion in which a plurality of pixels is two-dimensionally arranged, in which the pixels each include an in-pixel capacitance and a counter electrode of the in-pixel capacitance, the in-pixel capacitance being provided on a side opposite to a light incident surface of a photoelectric conversion element provided in a semiconductor substrate, the counter electrode being provided in the semiconductor substrate.

(2)

The solid-state imaging device according to (1) above, in which an overflow path is provided between the photoelectric conversion element and the in-pixel capacitance in a depth direction in the semiconductor substrate such that the overflow path is adjacent to the counter electrode provided in the semiconductor substrate.

(3)

The solid-state imaging device according to (1) above, in which an overflow path is directly provided between the photoelectric conversion element and the counter electrode in a depth direction in the semiconductor substrate.

(4)

The solid-state imaging device according to any one of (1) to (3) above, in which a constant voltage is applied to the counter electrode.

(5)

The solid-state imaging device according to any one of (1) to (3) above, in which a variable voltage is applied to the counter electrode.

(6)

The solid-state imaging device according to (5) above, in which the voltage to be applied to the counter electrode differs between a first period and a third period, and between a second period and the third period, the first period being a period in which a shutter is driven, the second period being a period in which a charge generated by the photoelectric conversion element is read, the third period being a period in which the charge is accumulated.

(7)

The solid-state imaging device according to (3) above, in which the pixels each include:

a first photoelectric conversion element; and a second photoelectric conversion element different from the first photoelectric conversion element, and the overflow path is directly provided between one of the photoelectric conversion elements and the counter electrode.

(8)

The solid-state imaging device according to (7) above, in which the first photoelectric conversion element has a higher sensitivity than the second photoelectric conversion element, and the overflow path is directly provided between the first photoelectric conversion element and the counter electrode.

(9)

The solid-state imaging device according to any one of (1) to (8) above, in which the pixels each further include a charge holding unit that holds a charge generated by the photoelectric conversion element until the charge is read.

(10)

The solid-state imaging device according to (2) above, in which the overflow path is provided in the semiconductor substrate such that the overflow path is surrounded by the counter electrode.

(11)

The solid-state imaging device according to any one of (1) to (10) above, in which the in-pixel capacitance accumulates a charge having overflowed from the photoelectric conversion element.

(12)

The solid-state imaging device according to any one of (1) to (11) above, in which the counter electrode absorbs a charge having overflowed from the photoelectric conversion element.

(13)

The solid-state imaging device according to any one of (1) to (12) above, in which the pixels each include:

a first transfer transistor that transfers a charge generated by the photoelectric conversion element, according to a first drive signal;

a charge-voltage conversion unit that converts charge into voltage;

a reset transistor that resets the charge-voltage conversion unit according to a second drive signal;

an amplifier transistor that amplifies a signal converted by the charge-voltage conversion unit;

a selection transistor that applies the signal from the amplifier transistor to a vertical signal line according to a third drive signal;

a second transfer transistor that couples potentials of the charge-voltage conversion unit and the in-pixel capacitance according to a fourth drive signal; and a third transfer transistor that is driven according to a fifth drive signal, the third transfer transistor being connected to the second transfer transistor and the charge-voltage conversion unit while being located therebetween.

(14)

The solid-state imaging device according to (13) above, in which signals for generating a plurality of images on the basis of which a composite image is to be generated are obtained as a result of controlling driving of the transistors by use of the first to fifth drive signals.

(15)

The solid-state imaging device according to any one of (1) to (14) above, in which the solid-state imaging device includes a back-illuminated complementary metal oxide semiconductor (CMOS) image sensor.

(16)

An electronic device having a solid-state imaging device mounted thereon, in which the solid-state imaging device includes a pixel array portion in which a plurality of pixels is two-dimensionally arranged, and the pixels each include an in-pixel capacitance and a counter electrode of the in-pixel capacitance, the in-pixel capacitance being provided on a side opposite to a light incident surface of a photoelectric conversion element provided in a semiconductor substrate, the counter electrode being provided in the semiconductor substrate.

(17)

A solid-state imaging device including:

a pixel array portion is which a plurality of pixels is two-dimensionally arranged, in which the pixels each include a capacitance including a first conductive layer and a second conductive layer that are stacked, the capacitance being provided on a side opposite to a light incident surface of a photoelectric conversion element provided in a semiconductor substrate.

(18)

The solid-state imaging device according to (17) above, in which the second conductive layer is capacitively coupled to a signal line to which a pulse signal is provided, and the second conductive layer accelerates an increase of a potential in a charge-voltage conversion unit that converts a charge generated by the photoelectric conversion element into voltage, according to a change in a potential of the signal line.

(19)

The solid-state imaging device according to (17) or (18) above, in which a charge generated by the photoelectric conversion element is accumulated in a charge-voltage conversion unit and the capacitance including the first conductive layer and the second conductive layer, the charge-voltage conversion unit being configured to convert the charge into voltage.

(20)

The solid-state imaging device according to any one of (17) to (19) above, in which the pixels each include:

a first photoelectric conversion element; and a second photoelectric conversion element different from the first photoelectric conversion element, and the capacitance including the first conductive layer and the second conductive layer is provided for one of the photoelectric conversion elements.

REFERENCE SIGNS LIST

10 CMOS image sensor
11 Pixel array portion
12 Vertical drive circuit
21 Pixel drive line
22 Vertical signal line
100 Pixel
111 Photodiode (PD)
112 Transfer transistor
113 Reset transistor
114 Amplifier transistor
115 Selection transistor
116 Junction transistor
117 In-pixel capacitance (FC)
118 FC connection transistor
119 Conversion efficiency switching transistor
120 Counter electrode
131 Floating diffusion region (FD)
155 Overflow path
200 Pixel
217 In-pixel capacitance (FC)
220 Counter electrode
300 Pixel
316 Junction transistor
317 In-pixel capacitance (FC)
320 Counter electrode
355 Overflow path
400 Pixel
411-1 First photodiode (LPD)
411-2 Second photodiode (SPD)
412-1 First transfer transistor
412-2 Second transfer transistor
417 In-pixel capacitance (FC)
420 Counter electrode
455 Overflow path
500 Pixel
517 In-pixel capacitance (FC)

520 Counter electrode
522 Memory unit
600 Pixel
611 Photodiode
617-1 First MOS capacitance
617-2 Second MOS capacitance
626 SCL line
700 Pixel
711-1 First photodiode
711-2 Second photodiode
717-1 First MOS capacitance
717-2 Second MOS capacitance
726 SCL line
1000 Electronic device
1001 Solid-state imaging device
12031 Imaging unit

What is claimed is:

1. A solid-state imaging device comprising:
a pixel array portion in which a plurality of pixels is two-dimensionally arranged,
wherein the pixels each include an in-pixel capacitance and a counter electrode of the in-pixel capacitance, wherein the in-pixel capacitance is provided on a side opposite to a light incident surface of a photoelectric conversion element provided in a semiconductor substrate, wherein the counter electrode is provided in the semiconductor substrate, and wherein an overflow path is provided between the photoelectric conversion element and the in-pixel capacitance in a depth direction in the semiconductor substrate such that the overflow path is adjacent to the counter electrode provided in the semiconductor substrate.

2. The solid-state imaging device according to claim 1, wherein
a constant voltage is applied to the counter electrode.

3. The solid-state imaging device according to claim 1, wherein
a variable voltage is applied to the counter electrode.

4. The solid-state imaging device according to claim 3, wherein
the voltage to be applied to the counter electrode differs between a first period and a third period, and between a second period and the third period, the first period being a period in which a shutter is driven, the second period being a period in which a charge generated by the photoelectric conversion element is read, the third period being a period in which the charge is accumulated.

5. The solid-state imaging device according to claim 1, wherein
the pixels each further include a charge holding unit that holds a charge generated by the photoelectric conversion element until the charge is read.

6. The solid-state imaging device according to claim 1, wherein
the overflow path is provided in the semiconductor substrate such that the overflow path is surrounded by the counter electrode.

7. The solid-state imaging device according to claim 1, wherein
the pixels each include:
a first transfer transistor that transfers a charge generated by the photoelectric conversion element, according to a first drive signal;
a charge-voltage conversion unit that converts charge into voltage;
a reset transistor that resets the charge-voltage conversion unit according to a second drive signal;
an amplifier transistor that amplifies a signal converted by the charge-voltage conversion unit;
a selection transistor that applies the signal from the amplifier transistor to a vertical signal line according to a third drive signal;
a second transfer transistor that couples potentials of the charge-voltage conversion unit and the in-pixel capacitance according to a fourth drive signal; and
a third transfer transistor that is driven according to a fifth drive signal, the third transfer transistor being connected to the second transfer transistor and the charge-voltage conversion unit while being located therebetween.

8. The solid-state imaging device according to claim 7, wherein
signals for generating a plurality of images on a basis of which a composite image is to be generated are obtained as a result of controlling driving of the transistors by use of the first to fifth drive signals.

9. The solid-state imaging device according to claim 1, wherein
the solid-state imaging device comprises a back-illuminated complementary metal oxide semiconductor (CMOS) image sensor.

10. A solid-state imaging device comprising:
a pixel array portion in which a plurality of pixels is two-dimensionally arranged,
wherein the pixels each include an in-pixel capacitance and a counter electrode of the in-pixel capacitance, wherein the in-pixel capacitance is provided on a side opposite to a light incident surface of a photoelectric conversion element provided in a semiconductor substrate, wherein the counter electrode is provided in the semiconductor substrate, and wherein an overflow path is directly provided between the photoelectric conversion element and the counter electrode in a depth direction in the semiconductor substrate.

11. The solid-state imaging device according to claim 10, wherein
the pixels each include:
a first photoelectric conversion element; and
a second photoelectric conversion element different from the first photoelectric conversion element, and
the overflow path is directly provided between one of the photoelectric conversion elements and the counter electrode.

12. The solid-state imaging device according to claim 11, wherein
the first photoelectric conversion element has a higher sensitivity than the second photoelectric conversion element, and
the overflow path is directly provided between the first photoelectric conversion element and the counter electrode.

13. The solid-state imaging device according to claim 10, wherein
a constant voltage is applied to the counter electrode.

14. The solid-state imaging device according to claim 10, wherein
a variable voltage is applied to the counter electrode.

15. The solid-state imaging device according to claim 14, wherein
the voltage to be applied to the counter electrode differs between a first period and a third period, and between a second period and the third period, the first period being a period in which a shutter is driven, the second period being a period in which a charge generated by the photoelectric conversion element is read, the third period being a period in which the charge is accumulated.

16. The solid-state imaging device according to claim 10, wherein
the pixels each further include a charge holding unit that holds a charge generated by the photoelectric conversion element until the charge is read.

17. The solid-state imaging device according to claim 10, wherein the in-pixel capacitance accumulates a charge that has overflowed from the photoelectric conversion element.

18. A solid-state imaging device comprising:
a pixel array portion in which a plurality of pixels is two-dimensionally arranged,
wherein the pixels each include an in-pixel capacitance and a counter electrode of the in-pixel capacitance, wherein the in-pixel capacitance is provided on a side opposite to a light incident surface of a photoelectric conversion element provided in a semiconductor substrate, wherein the counter electrode is provided in the semiconductor substrate, and wherein the in-pixel capacitance accumulates a charge that has overflowed from the photoelectric conversion element.

19. The solid-state imaging device according to claim 18, wherein
an overflow path is provided between the photoelectric conversion element and the in-pixel capacitance in a depth direction in the semiconductor substrate such that the overflow path is adjacent to the counter electrode provided in the semiconductor substrate.

20. A solid-state imaging device comprising:
a pixel array portion in which a plurality of pixels is two-dimensionally arranged,
wherein the pixels each include an in-pixel capacitance and a counter electrode of the in-pixel capacitance, wherein the in-pixel capacitance is provided on a side opposite to a light incident surface of a photoelectric conversion element provided in a semiconductor substrate, wherein the counter electrode is provided in the semiconductor substrate, and wherein the counter electrode absorbs a charge that has overflowed from the photoelectric conversion element.

* * * * *